US012591799B1

(12) United States Patent
Ayala et al.

(10) Patent No.: US 12,591,799 B1
(45) Date of Patent: Mar. 31, 2026

(54) TECHNIQUES FOR GENERATING QUBIT CONTROL SIGNALS

(71) Applicant: Atlantic Quantum Corp., Cambridge, MA (US)

(72) Inventors: Christopher Ayala, Cambridge, MA (US); Youngkyu Sung, Cambridge, MA (US); Sergey Novikov, Cambridge, MA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 19/183,604

(22) Filed: Apr. 18, 2025

(51) Int. Cl.
    *G06N 10/40*        (2022.01)
    *H03K 3/38*         (2006.01)
    *H03K 19/195*       (2006.01)

(52) U.S. Cl.
    CPC .............. *G06N 10/40* (2022.01); *H03K 3/38* (2013.01); *H03K 19/195* (2013.01)

(58) Field of Classification Search
    None
    See application file for complete search history.

(56) References Cited

U.S. PATENT DOCUMENTS

2024/0413801 A1* 12/2024 Chakraborty .......... G06N 10/40

FOREIGN PATENT DOCUMENTS

JP        6563239        8/2019
JP      2022-163566     10/2022

OTHER PUBLICATIONS

Takeuchi, N., Yamanashi, Y. & Yoshikawa, N. Adiabatic quantum-flux-parametron cell library adopting minimalist design. J. Appl. Phys. 117, 173912 (2015).
Takeuchi, N., Nagasawa, S., China, F., Ando, T., Hidaka, M., Yamanashi, Y. & Yoshikawa, N. Adiabatic quantum-flux-parametron cell library designed using a 10 kA cm-2 niobium fabrication process. Supercond. Sci. Technol. 30, 035002 (2017).
He, Y., Ayala, C. L., Takeuchi, N., Yamae, T., Hironaka, Y., Sahu, A., Gupta, V., Talalaevskii, A., Gupta, D. & Yoshikawa, N. A compact AQFP logic cell design using an 8-metal layer superconductor process. Supercond. Sci. Technol. 33, 035010 (2020).

(Continued)

*Primary Examiner* — Jany Richardson
(74) *Attorney, Agent, or Firm* — DORITY & MANNING P.A.

(57) ABSTRACT

Techniques are described for operating a qubit controller to generate a signal to apply to a qubit using a tunable coupler that controls the amplitude of at least part of the signal. The qubit controller may comprise a plurality of digital-to-analog converters that each convert digital values to an analog waveform. The qubit controller may further comprise a plurality of tunable couplers each coupled to a respective DAC that adjusts the amplitude of the analog waveform from the respective DAC. The tunable couplers thereby produce a plurality of analog waveforms, which may be combined to produce a signal to apply to the qubit. In some embodiments, the tunable couplers may each be configured to receive a respective control signal that dictates the scaling factor which that tunable coupler applies to the analog waveform.

38 Claims, 31 Drawing Sheets

(56)          References Cited

OTHER PUBLICATIONS

Takeuchi, N., Yamae, T., Luo, W., Hirayama, F., Yamamoto, T. & Yoshikawa, N. Scalable flux controllers using adiabatic superconductor logic for quantum processors. Phys. Rev. Res. 5, 013145 (2023).

Takeuchi, N., Yamae, T., Yamashita, T., Yamamoto, T. & Yoshikawa, N. Microwave-multiplexed qubit controller using adiabatic superconductor logic. npj Quantum Inf 10, 1-8 (2024).

Takeuchi, N., Yamae, T., Suzuki, H. & Yoshikawa, N. An Adiabatic Superconductor Comparator With 46 nA Sensitivity. IEEE Trans. Appl. Supercond. 31, 1-5 (2021).

Hironaka, Y., Yamae, T., Ayala, C. L., Yoshikawa, N. & Takeuchi, N. Low-Latency Adiabatic Quantum-Flux-Parametron Circuit Integrated With a Hybrid Serializer/Deserializer. IEEE Access 10, 133584-133590 (2022).

Takeuchi, N., Suzuki, H. & Yoshikawa, N. Measurement of low bit-error-rates of adiabatic quantum-flux-parametron logic using a superconductor voltage driver. Appl. Phys. Lett. 110, 202601 (2017).

Yoo, J., Chen, Z., Arute, F., Montazeri, S., Szalay, M., Erickson, C., Jeffrey, E., Fatemi, R., Giustina, M., Ansmann, M., Lucero, E., Kelly, J. & Bardin, J. C. Design and characterization of a <4-mW/qubit 28-nm cryo-CMOS integrated circuit for full control of a superconducting quantum processor unit cell. IEEE J. Solid-State Circuits 58, 3044-3059 (2023).

Chakraborty, S., Frank, D. J., Tien, K., Rosno, P., Yeck, M., Glick, J. A., Robertazzi, R., Richetta, R., Bulzacchelli, J. F., Underwood, D., Ramirez, D., Yilma, D., Davies, A., Joshi, R. V., Chambers, S.

D., Lekuch, S., Inoue, K., Wisnieff, D., Baks, C. W., Bethune, D. S., Timmerwilke, J., Fox, T., Song, P., Johnson, B. R., Gaucher, B. P. & Friedman, D. J. A Cryo-CMOS Low-Power Semi-Autonomous Transmon Qubit State Controller in 14-nm FinFET Technology. IEEE J. Solid-State Circuits 57, 3258-3273 (2022).

McDermott, R., Vavilov, M. G., Plourde, B. L. T., Wilhelm, F. K., Liebermann, P. J., Mukhanov, O. A. & Ohki, T. A. Quantum-classical interface based on single flux quantum digital logic. Quantum Sci. Technol. 3, 024004 (2018).

Liu, C. H., Ballard, A., Olaya, D., Schmidt, D. R., Biesecker, J., Lucas, T., Ullom, J., Patel, S., Rafferty, O., Opremcak, A., Dodge, K., Iaia, V., McBroom, T., DuBois, J. L., Hopkins, P. F., Benz, S. P., Plourde, B. L. T. & McDermott, R. Single flux quantum-based digital control of superconducting qubits in a multichip module. PRX quantum 4, 030310 (2023).

Takeuchi, N., Yamae, T., Ayala, C. L., Suzuki, H. & Yoshikawa, N. Adiabatic quantum-flux-parametron: A tutorial review. IEICE Transactions on Electronics 105, 251-263 (2022).

Mizushima, N., Takeuchi, N., Yamanashi, Y. & Yoshikawa, N. Adiabatic quantum-flux-parametron boosters for long interconnection and large fanouts. Supercond. Sci. Technol. (2023). doi:10.1088/1361-6668/acef67.

Zinoviev, D. Y. & Likharev, K. K. Feasibility study of RSFQ-based self-routing nonblocking digital switches. IEEE Trans. Appl. Supercond. 7, 3155-3163 (1997).

Likharev, K. K. & Semenov, V. K. RSFQ logic/memory family: a new Josephson-junction technology for sub-terahertz-clock-frequency digital systems. IEEE Trans. Appl. Supercond. 1, 3-28 (1991).

* cited by examiner

FIG. 7B
720
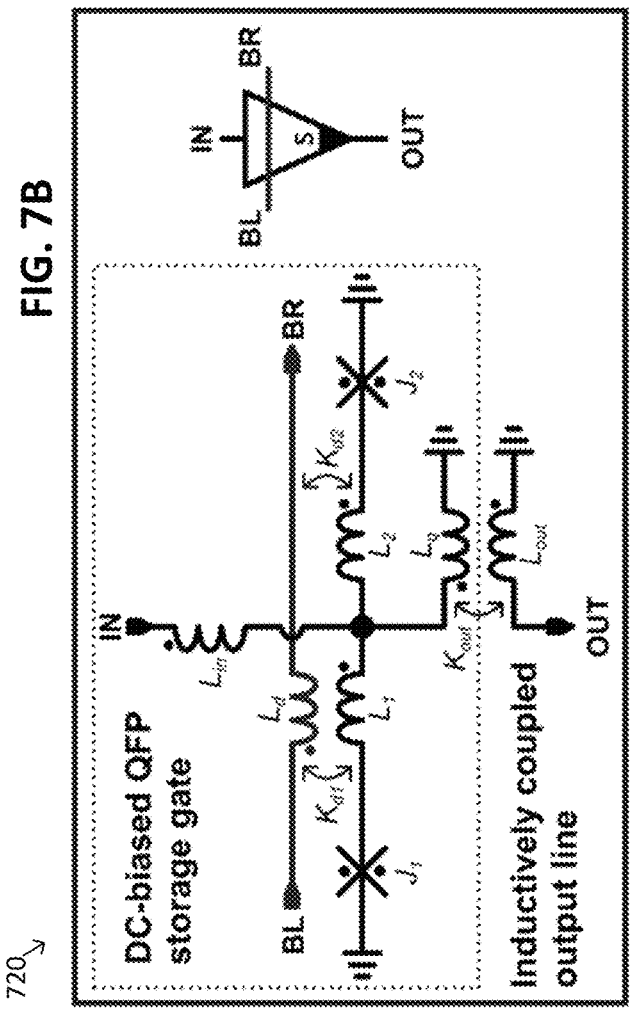
DC-biased QFP storage gate
Inductively coupled output line
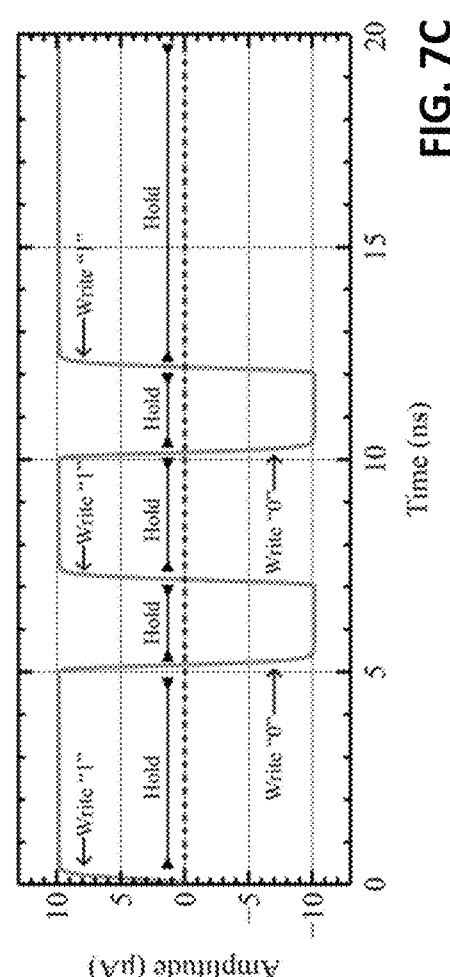
FIG. 7C
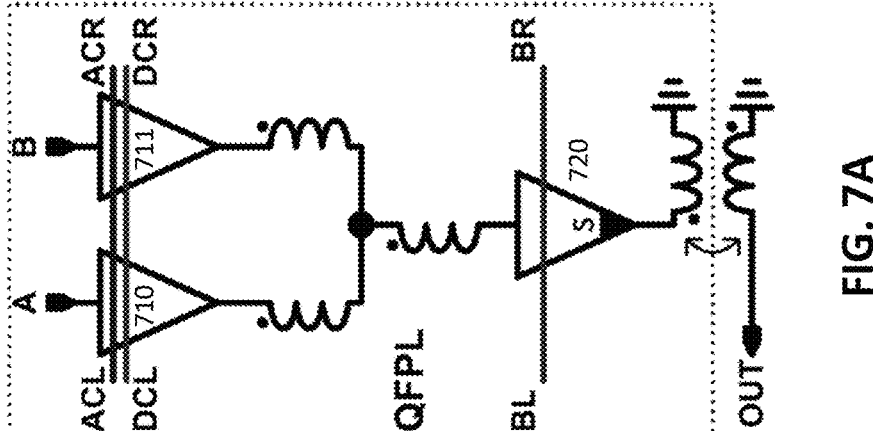
FIG. 7A
700

| A1 | B1 | A2 | B2 | Operation |
|----|----|----|----|-----------|
| 0 | 0 | 0 | 0 | Set to -20 uA |
| 0 | 0 | 1 | 1 | Set to 0 uA |
| 1 | 1 | 0 | 0 | Set to 0 uA |
| 1 | 1 | 1 | 1 | Set to +20 uA |
| 1 | 0 | 1 | 0 | Hold |
| 0 | 1 | 0 | 1 | Hold |

1400

1335     1410

$I_{Lo}$     $I_{BB}$ $K_{lo2}$ $K_{bb2}$

AQFP
A $J_2$ $L_2$ $L_{in}$ $K_{out}$ $K_{bb2}$     $V_{OUT}$

1450

BPF

MICROWAVE
OUTPUT

A $\Phi_A$ $L_{out}$

Digital
input $L_{lo}$     $L_{bb}$     $L_1$ $L_q$ $K_{bb1}$ $K_{lo1}$ $J_1$ $K_{lo2}$

AQFP
B $J_2$

Common inductively
coupled load line $L_2$

Fixed
DC
bias $L_{in}$ $K_{out}$ $\Phi_B$ $L_{out}$ $L_{lo}$     $L_{bb}$     $L_1$ $L_q$ $K_{bb1}$ $K_{lo1}$ $J_1$ $R_S$

2200

2300

2315        2315        2315

2303
Unload AC

AQFP
constant '1'

AQFP-to-
SFQ

A2S    2316        A2S    2316        A2S    2316

2302
Load In

2301
Data In 2310        2310        2310

D2        D2        D2

2325

2310        2310

D2        D2        D2

2310        2310        2310

D2        D2        D2

Load Out

Data Out

2330
S2A AC
SFQ-to-
AQFP

S2A    2317        S2A    2317        S2A    2317

S2A AC Out

Unload AC
Out 2350a        2350b        2350n

1

TECHNIQUES FOR GENERATING QUBIT CONTROL SIGNALS

BACKGROUND

Quantum computing platforms promise to provide solutions to many computationally intractable problems. In a quantum computing platform, information is stored in quantum bits or "qubits," and the power of the platform generally increases with the number of qubits that can be independently and simultaneously controlled. In quantum computing platforms comprising qubits such as trapped ions or neutral atoms, directed electromagnetic waves (e.g., microwaves, optical beams) implement independent qubit manipulations, while platforms comprising qubits such as electron dots or superconducting circuits use guided RF or microwave beams.

SUMMARY

According to some aspects, the techniques described herein relate to a system including: a plurality of qubits including a first qubit; and a plurality of qubit controllers coupled to respective qubits of the plurality of qubits, the plurality of qubit controllers including a first qubit controller configured to apply a baseband pulse sequence to the first qubit, the first qubit controller: a first digital-to-analog converter (DAC) configured to receive a first plurality of digital values and generate a first time-varying current signal based on the first plurality of digital values; and a first tunable coupling circuit coupled to the first DAC and configured to: receive the first time-varying current signal from the first DAC; and generate a first component of the baseband pulse sequence by amplitude-adjusting the first time-varying current signal according to a first control signal received by the first tunable coupling circuit.

According to some aspects, the techniques described herein relate to a method including: generating, by a first digital-to-analog converter (DAC) of a first qubit controller, a first time-varying DC current signal based on a first plurality of digital values received by the first DAC; receiving, by a first tunable coupling circuit of the first qubit controller, the first time-varying DC current signal; generating, by the first tunable coupling circuit, a first baseband pulse sequence component by amplitude-adjusting the first time-varying DC current signal according to a first control signal received by the first tunable coupling circuit; generating, by the first qubit controller, a baseband pulse sequence by combining a plurality of baseband pulse sequence components including the first baseband pulse sequence component; and applying the baseband pulse sequence to a first qubit.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

Figure 1A:
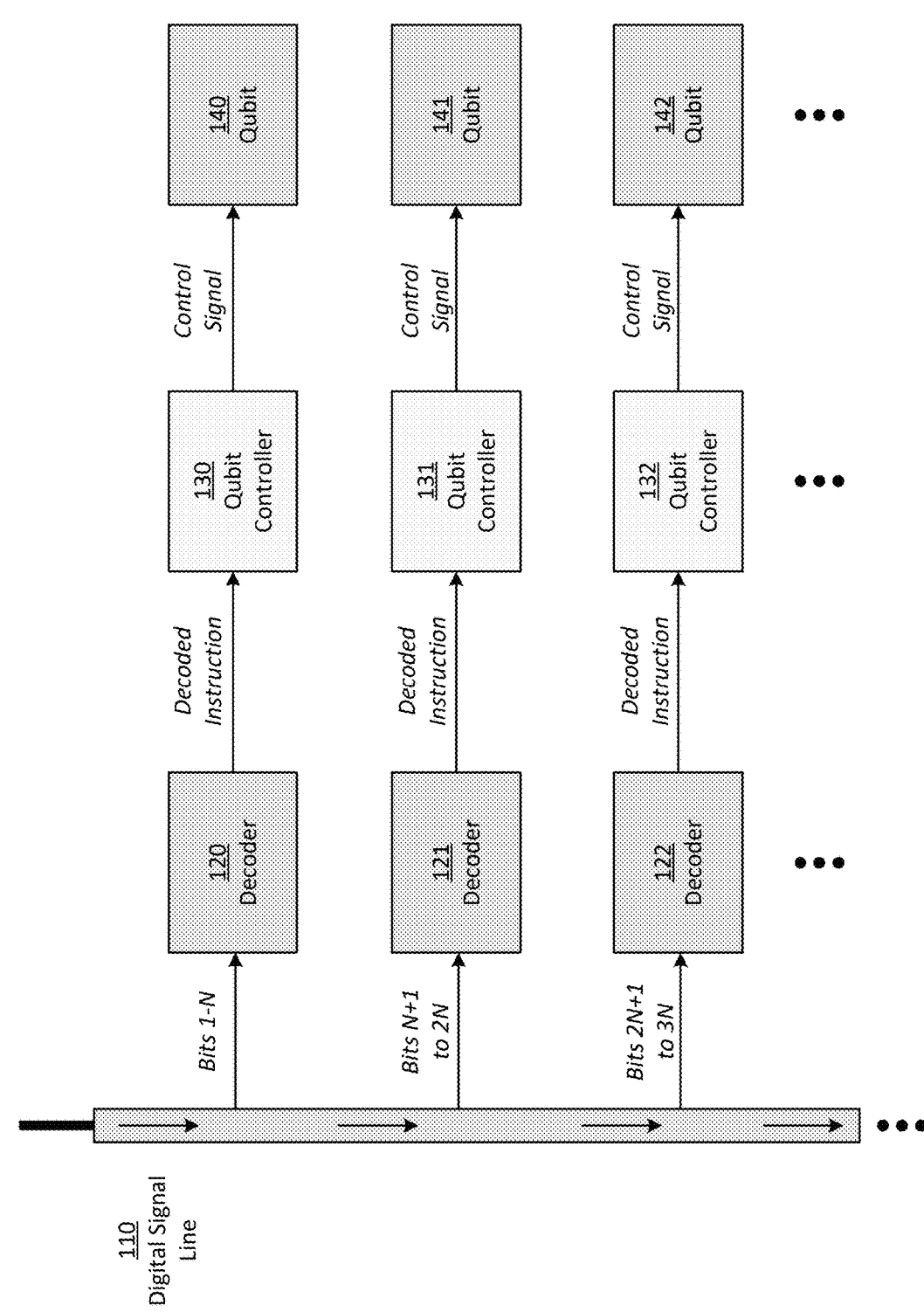
Figure 1B:
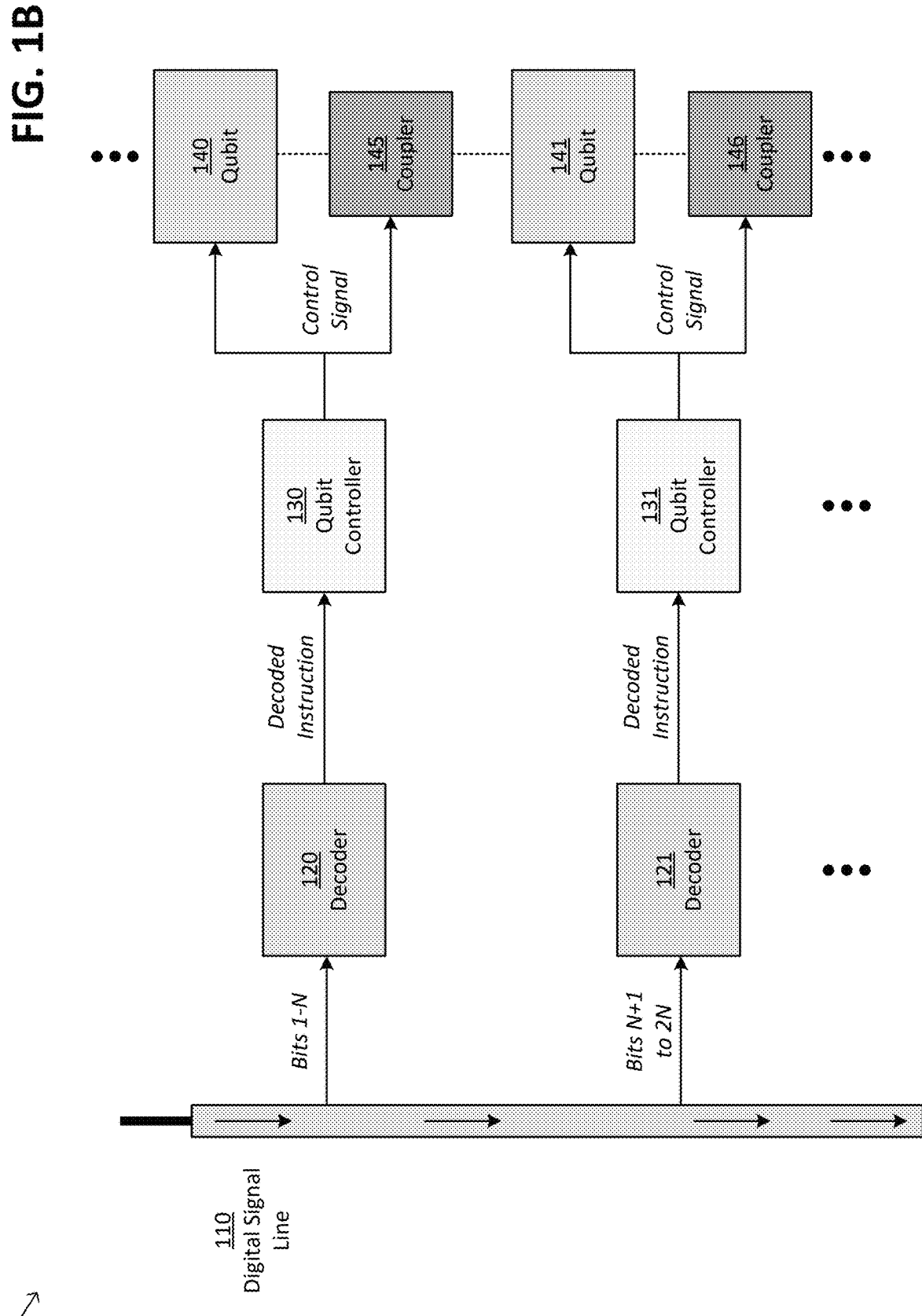
Figure 1C:
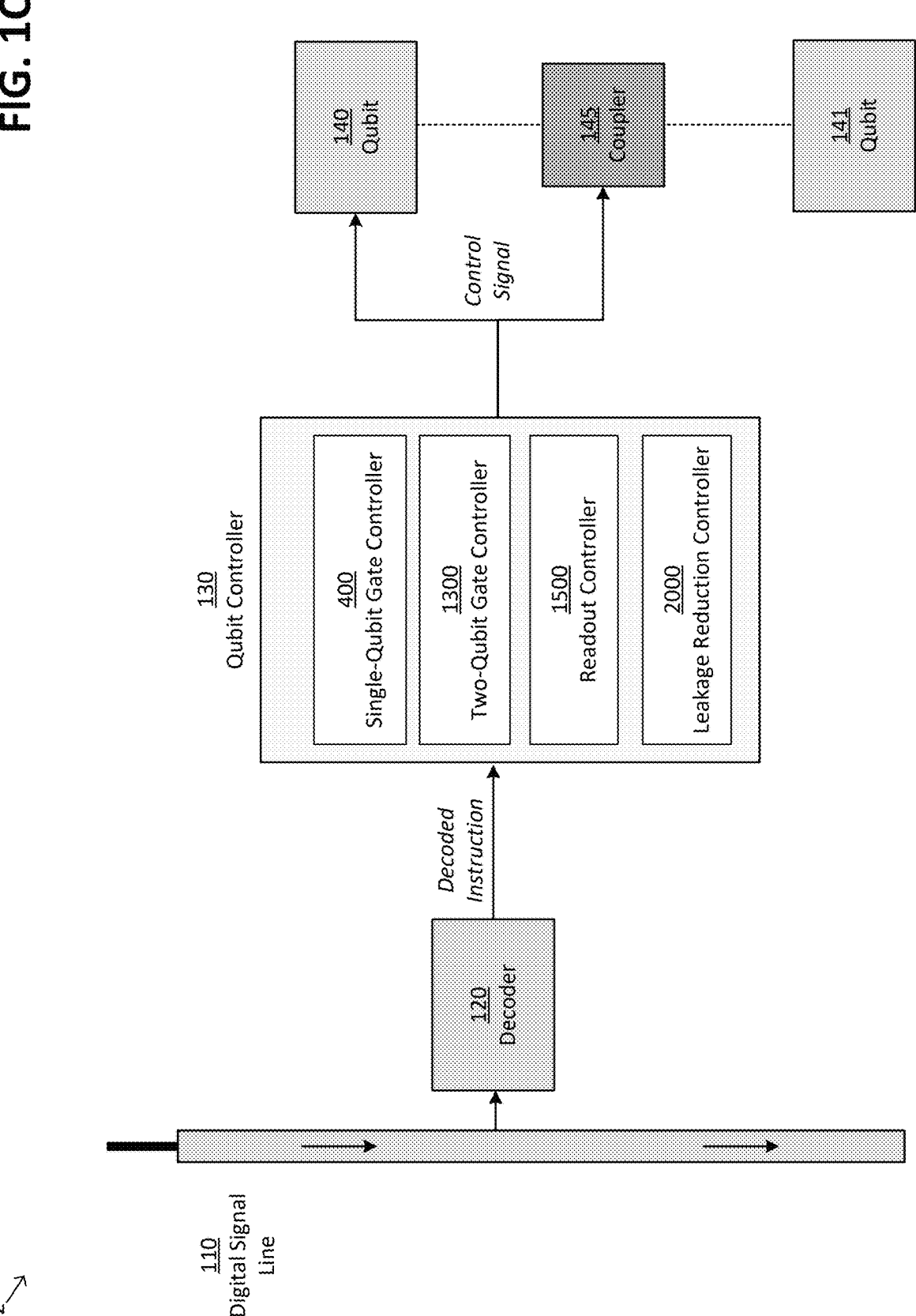
Figure 2A:
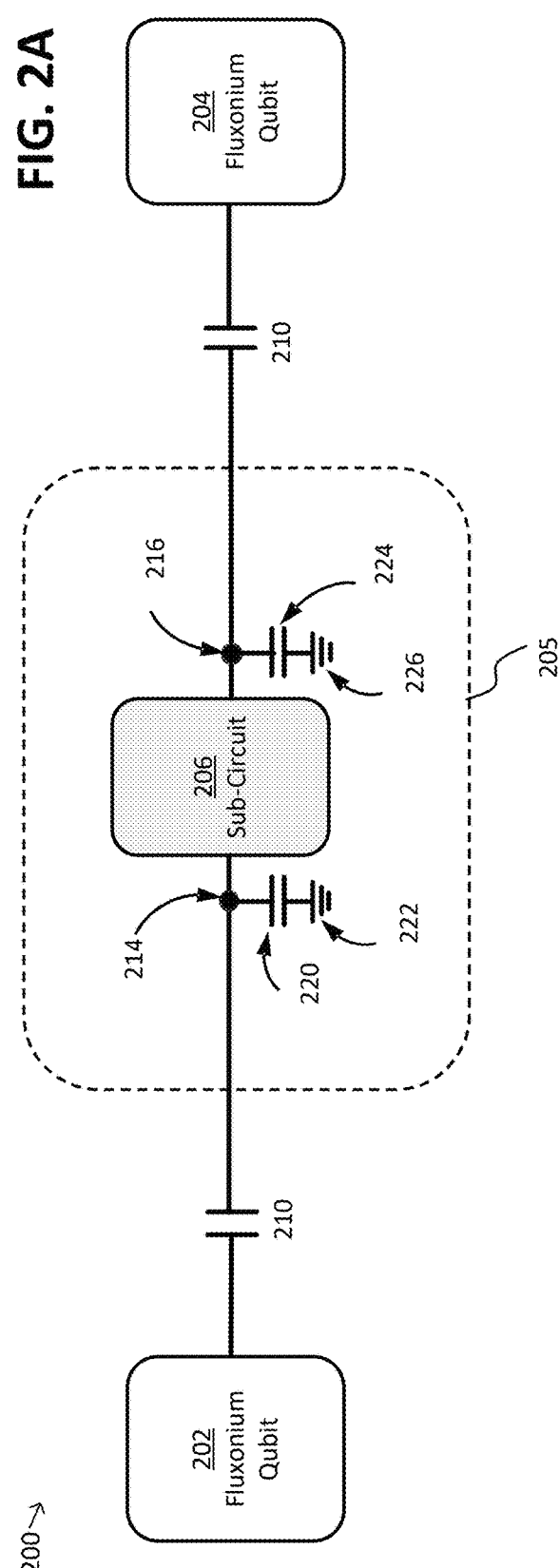
Figure 2C:
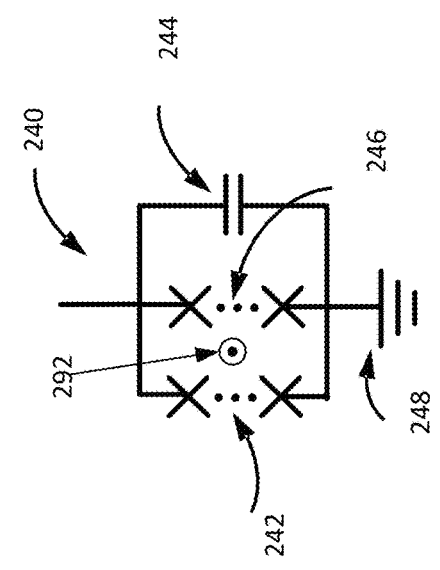
Figure 2B:
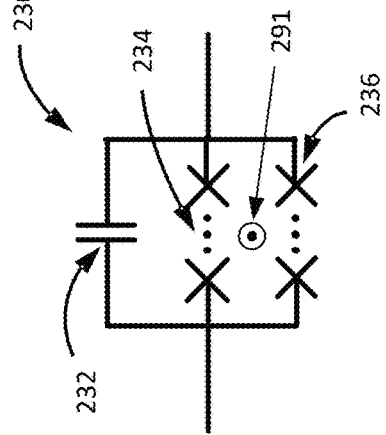
Figure 3:
Figure 4A:
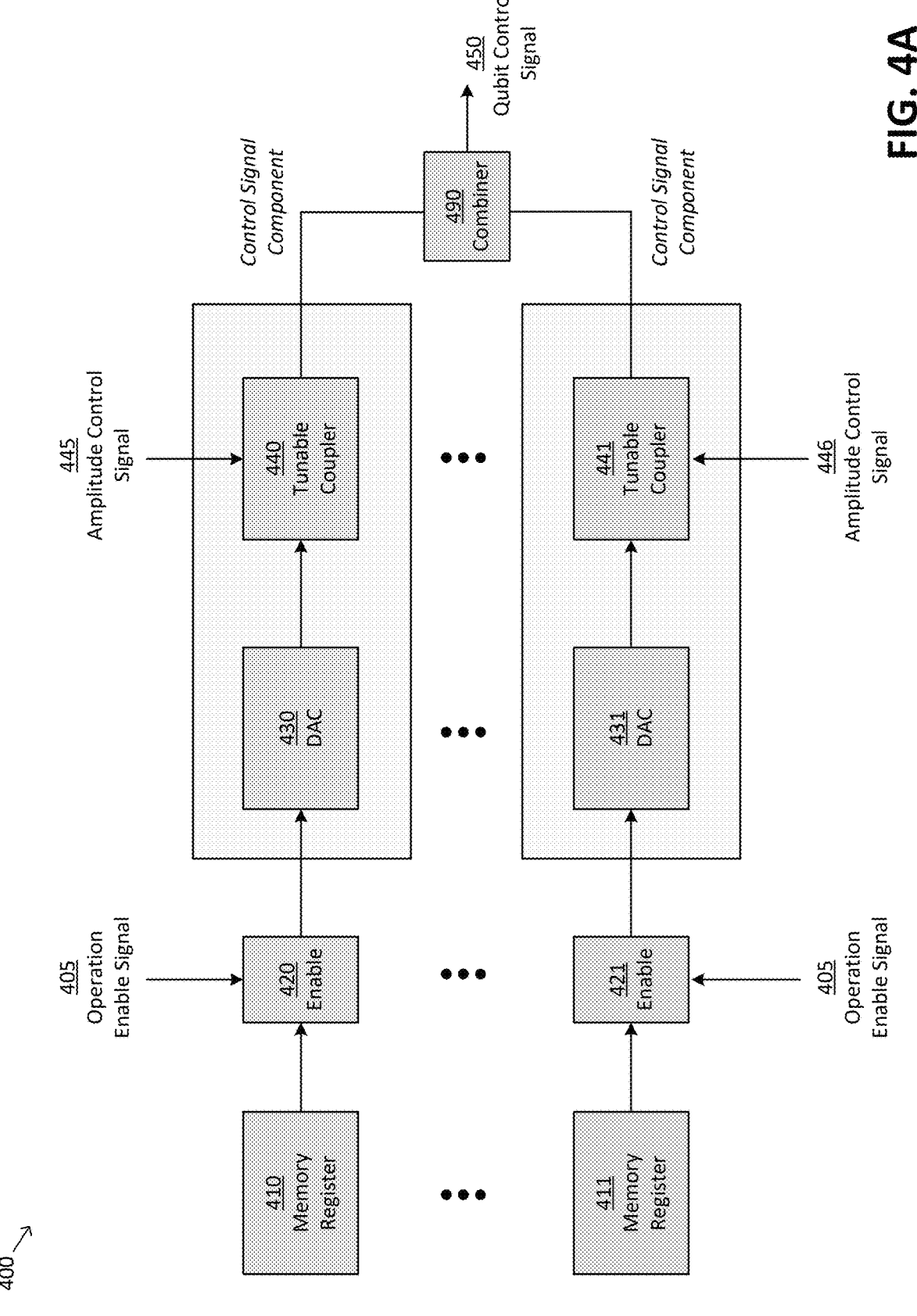
Figure 4B:
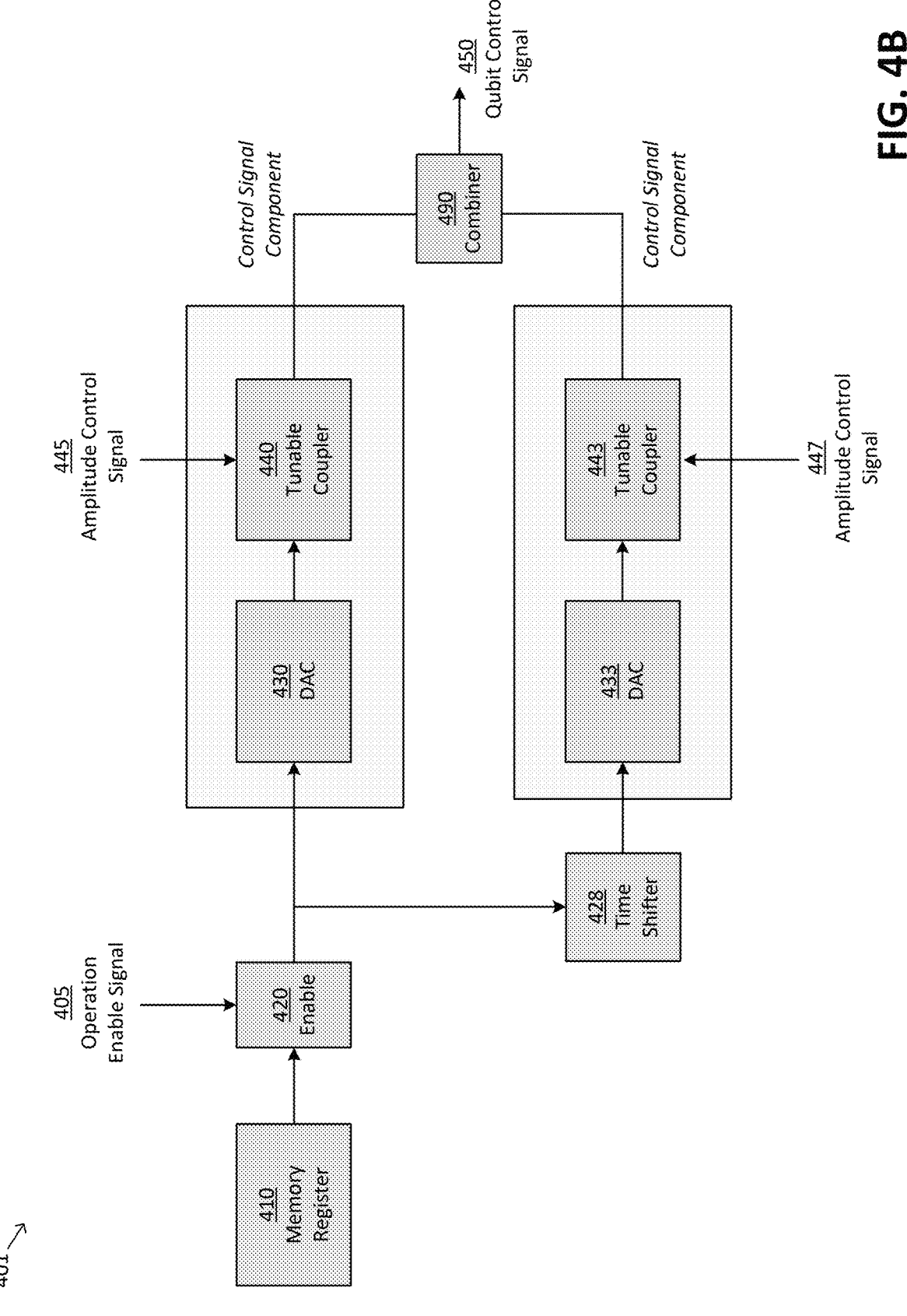
Figure 5:
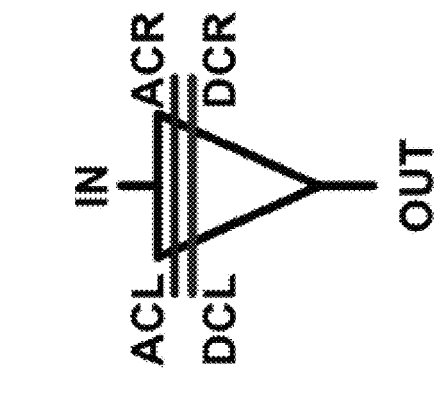
Figure 5:
Figure 6:
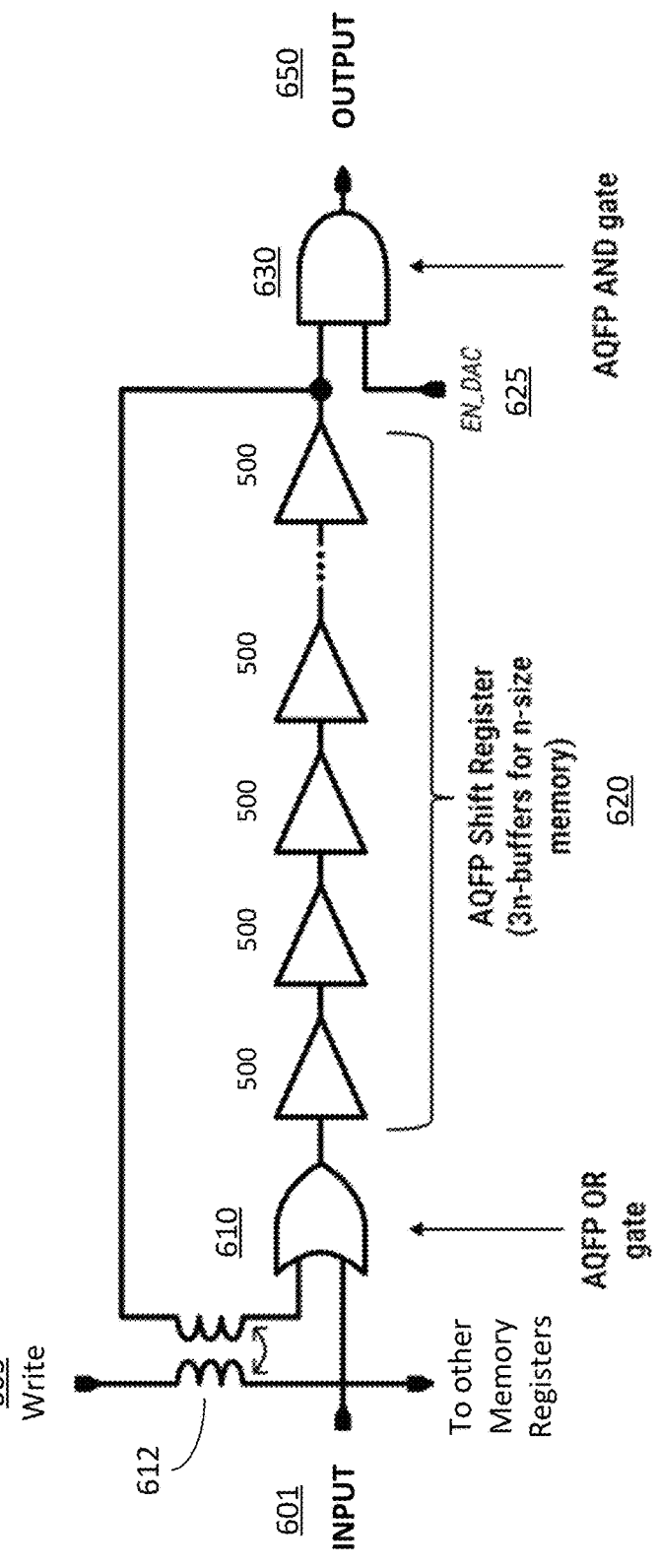
Figure 8B:
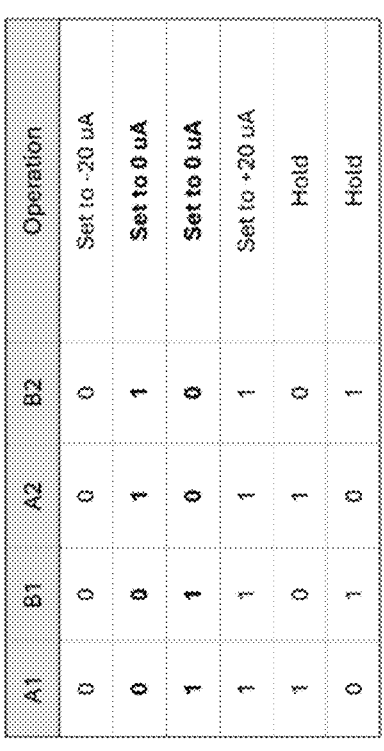
Figure 8A:
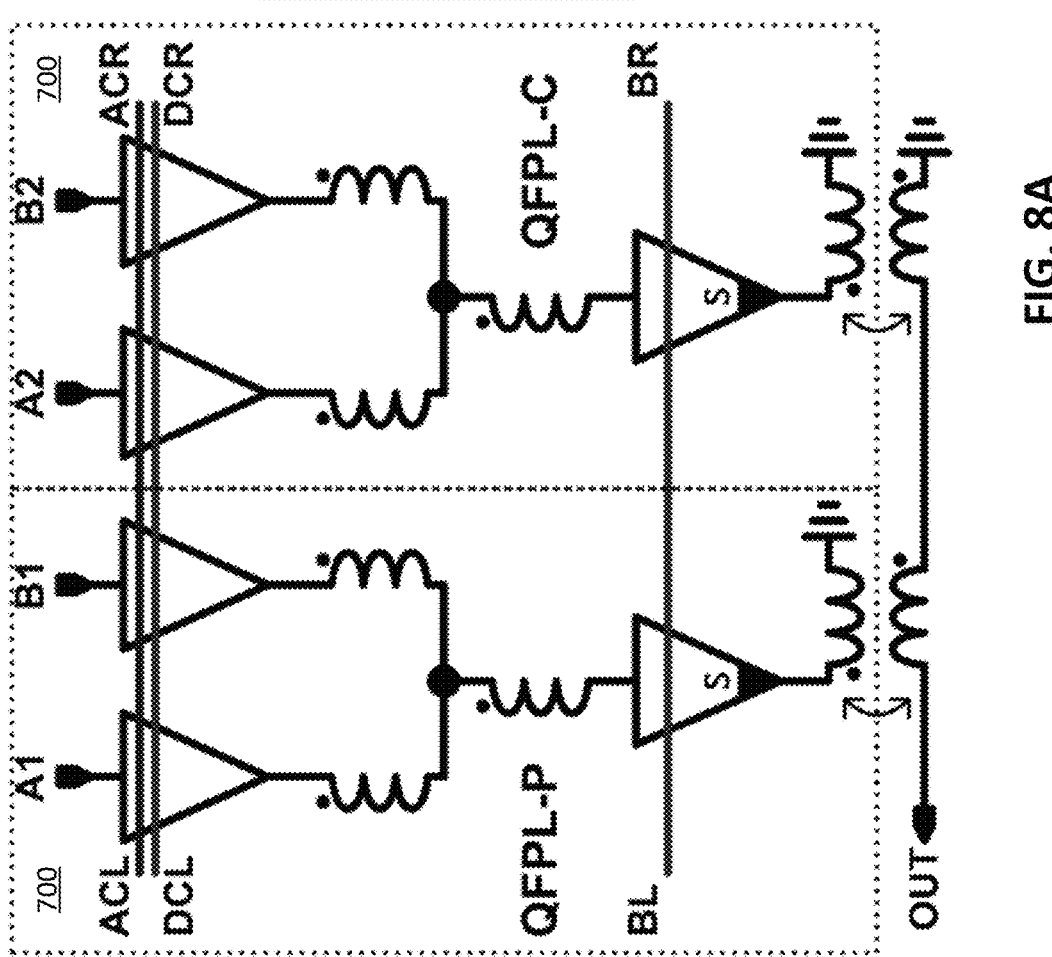
Figure 8C:
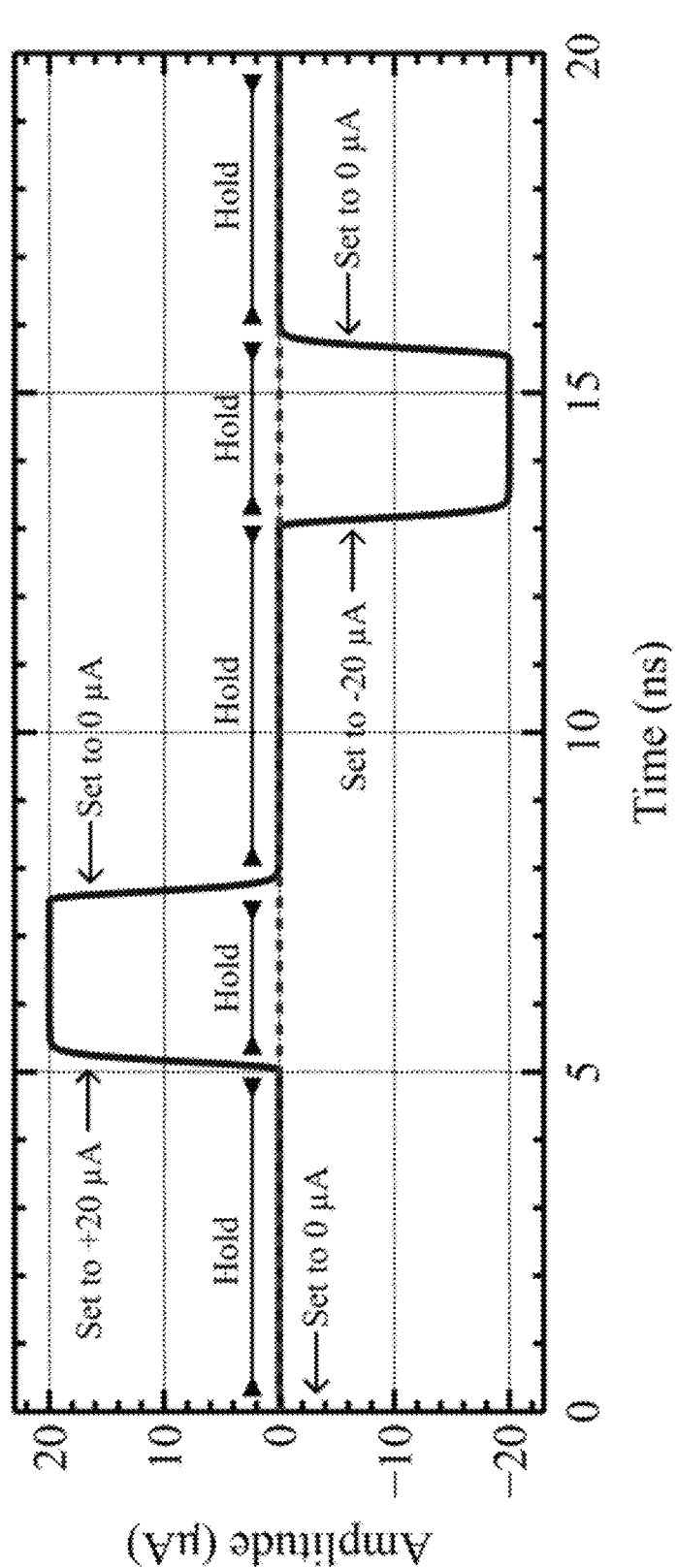
Figure 9:
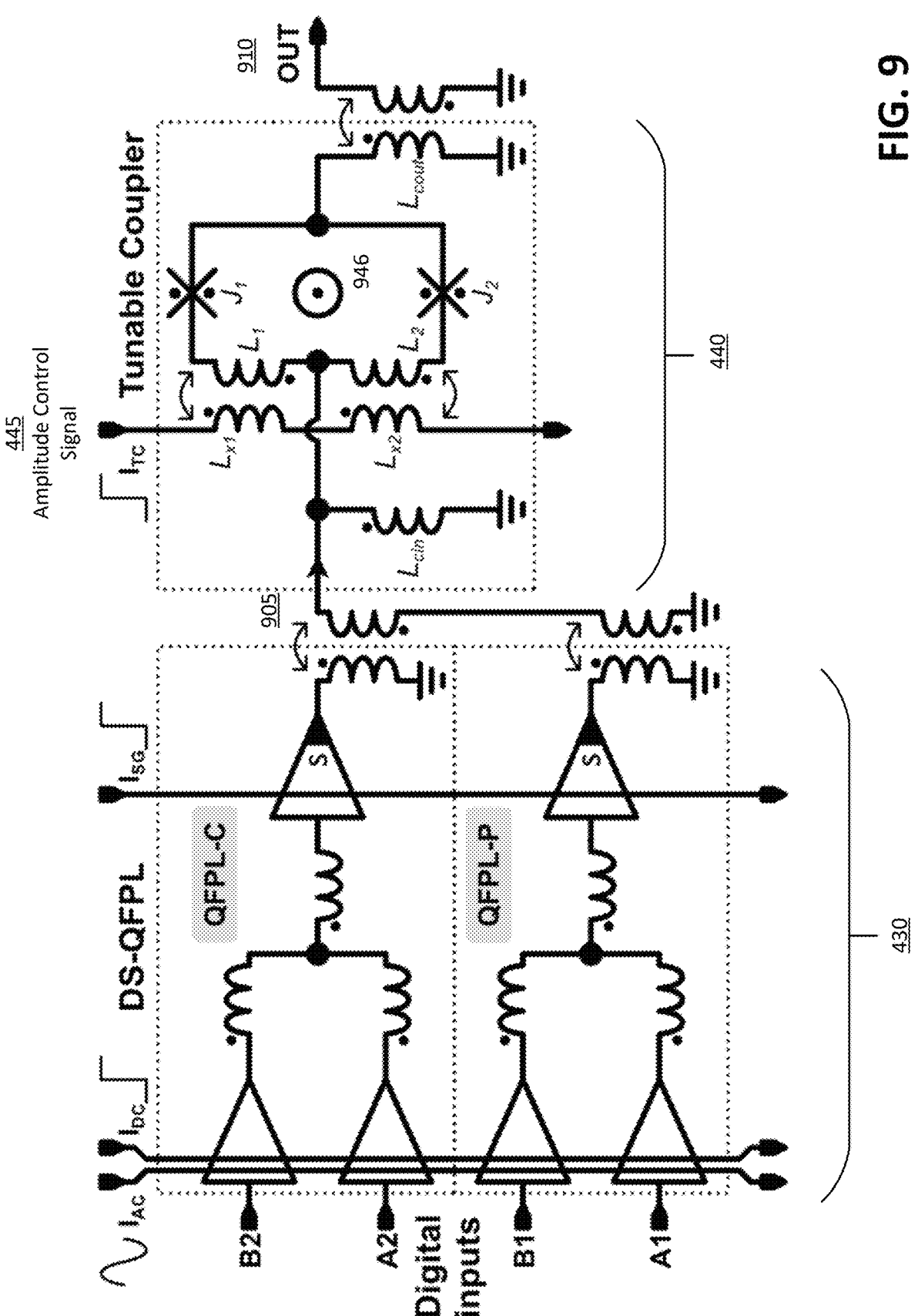
Figure 10:
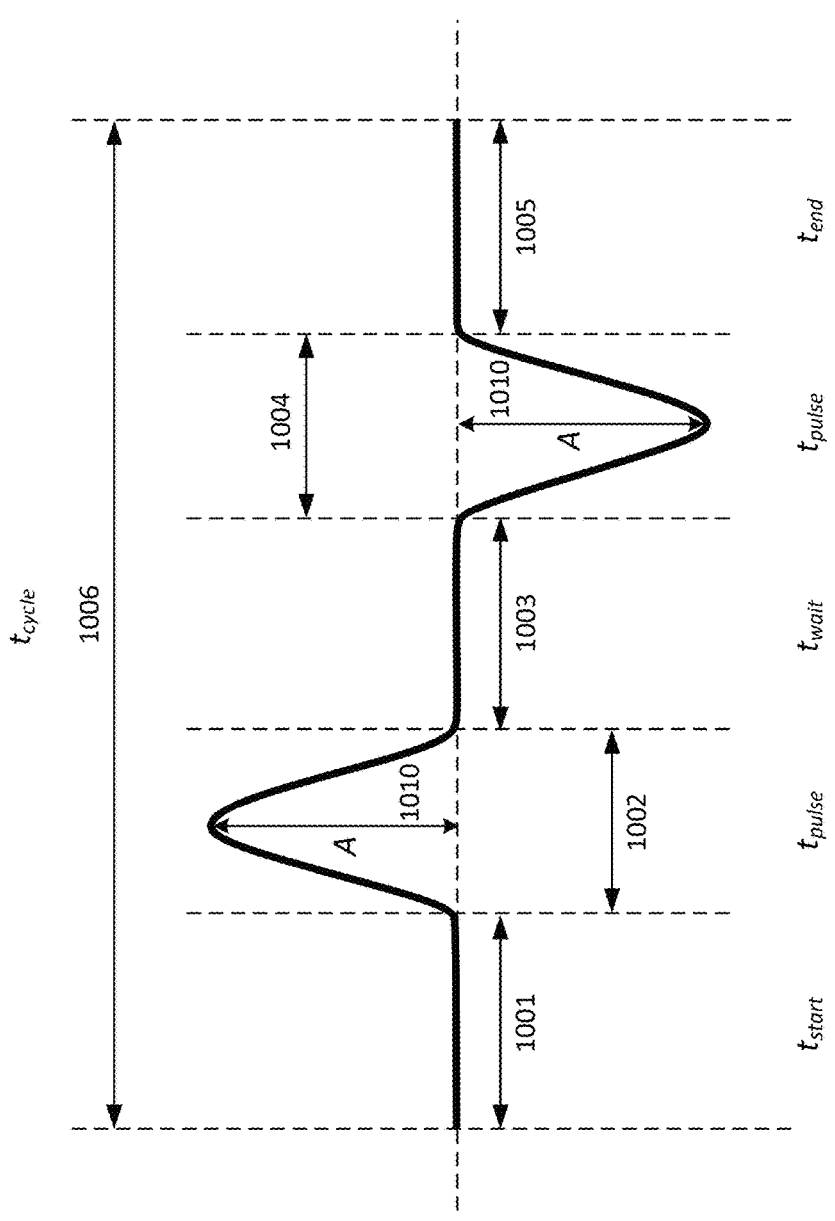

FIG. 1A depicts an illustrative control architecture for controlling a plurality of qubits, according to some embodiments;

FIG. 1B depicts an illustrative control architecture for controlling a plurality of qubits and couplers, according to some embodiments;

FIG. 1C depicts an illustrative control architecture for controlling a plurality of qubits and couplers with a plurality of different controllers, according to some embodiments;

FIG. 2A depicts an illustrative coupler suitable for coupling qubits, according to some embodiments;

FIGS. 2B and 2C depict illustrative sub-circuits for the coupler of FIG. 2A, according to some embodiments;

FIG. 3 depicts a number of clock cycles of a common clock signal and illustrative control operations that may be applied to each of three qubits during these clock cycles, according to some embodiments;

FIG. 4A depicts an illustrative single-qubit gate controller, according to some embodiments;

FIG. 4B depicts an illustrative single-qubit gate controller that includes one or more time shifters, according to some embodiments;

FIG. 5 depicts an illustrative AQFP circuit, according to some embodiments;

FIG. 6 depicts an example implementation of a memory register of the single-qubit gate controller shown in FIG. 4A, according to some embodiments;

FIGS. 7A-7B depict an illustrative QFPL circuit, according to some embodiments;

FIG. 7C depicts an illustrative output signal of the QFPL circuit shown in FIGS. 7A and 7B, according to some embodiments;

FIG. 8A depicts an illustrative circuit comprising a pair of QFPL circuits, according to some embodiments;

FIG. 8B illustrates a truth table for the inputs of the circuit shown in FIG. 8A, according to some embodiments;

FIG. 8C depicts an illustrative output signal of the QFPL circuit shown in FIG. 7A, according to some embodiments;

FIG. 9 depicts an illustrative implementation of a DAC and tunable coupler for a single-qubit gate controller, according to some embodiments;

FIG. 10 depicts an illustrative baseband pulse sequence, according to some embodiments.

Figures 11A, 11B, 11C, 11D:
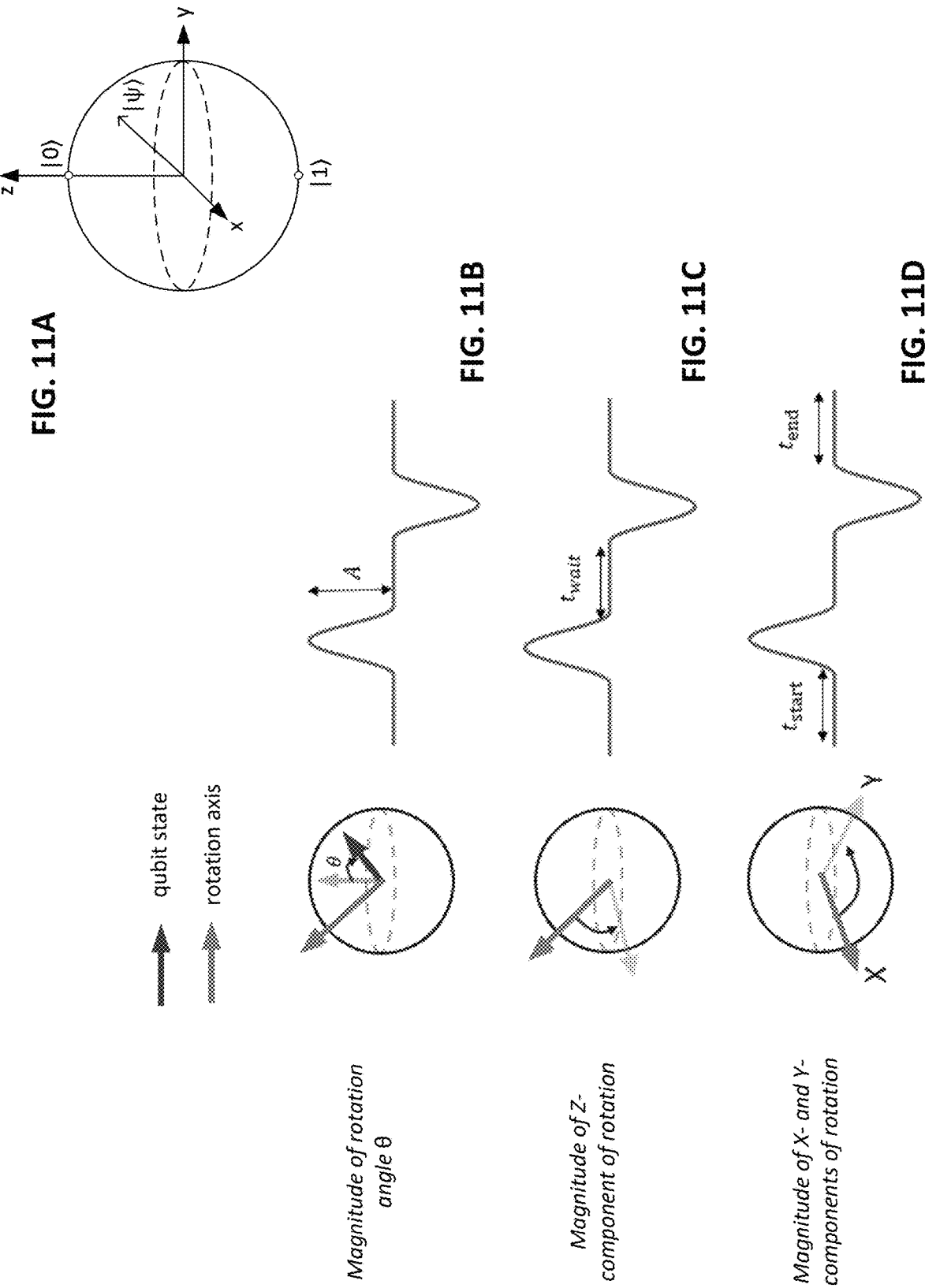
Figure 12A:
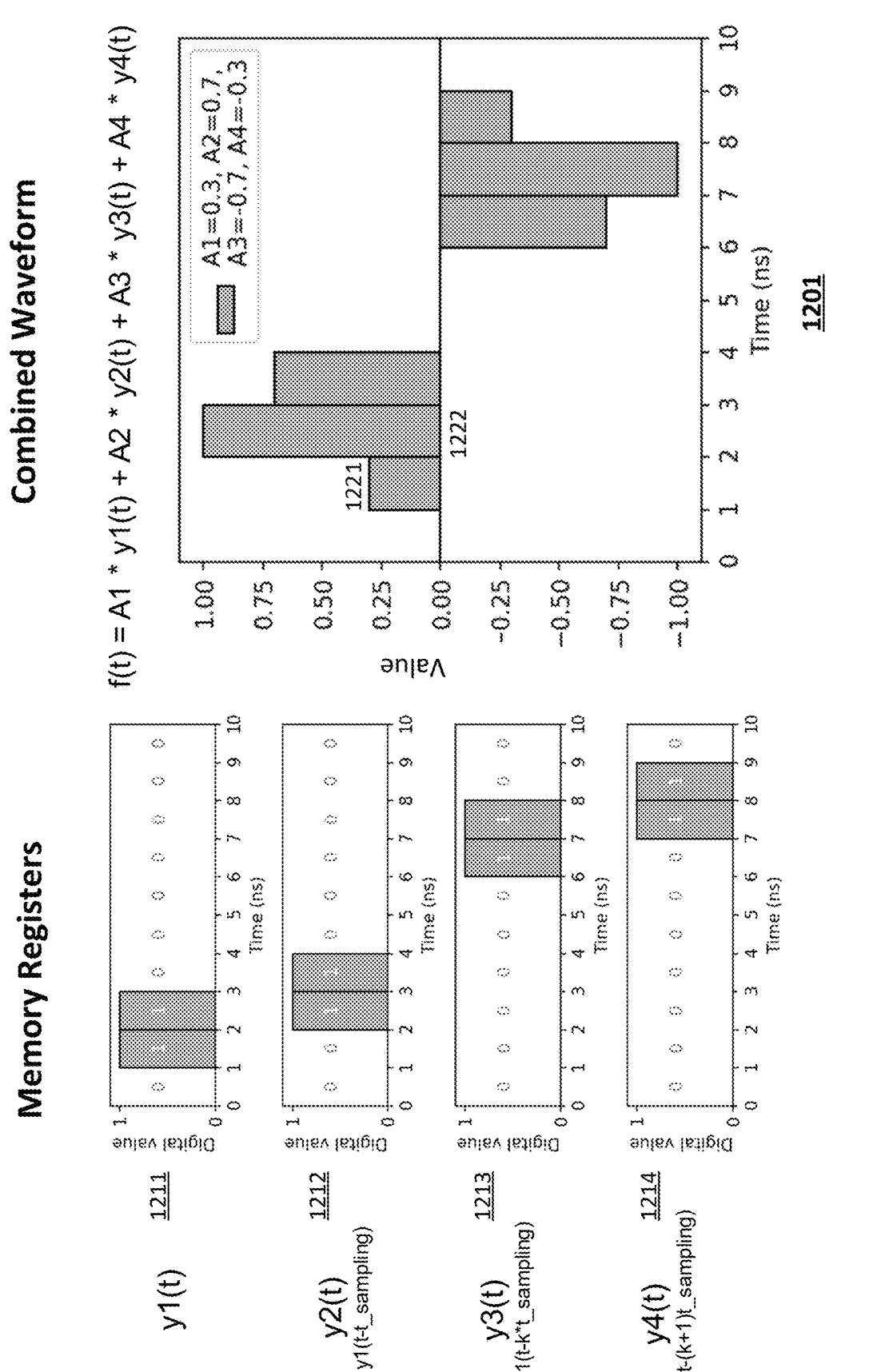
Figure 12B:
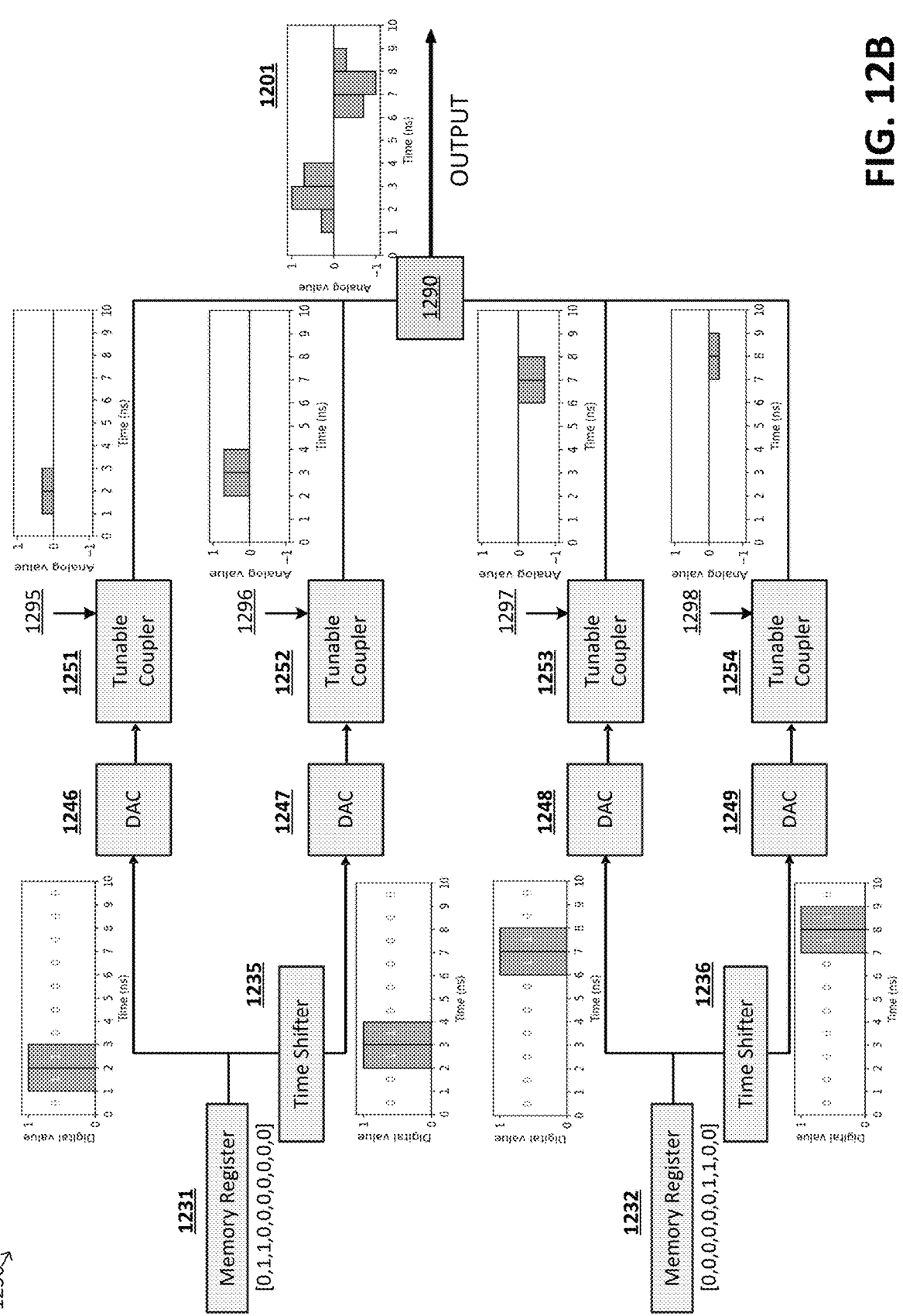
Figure 13:
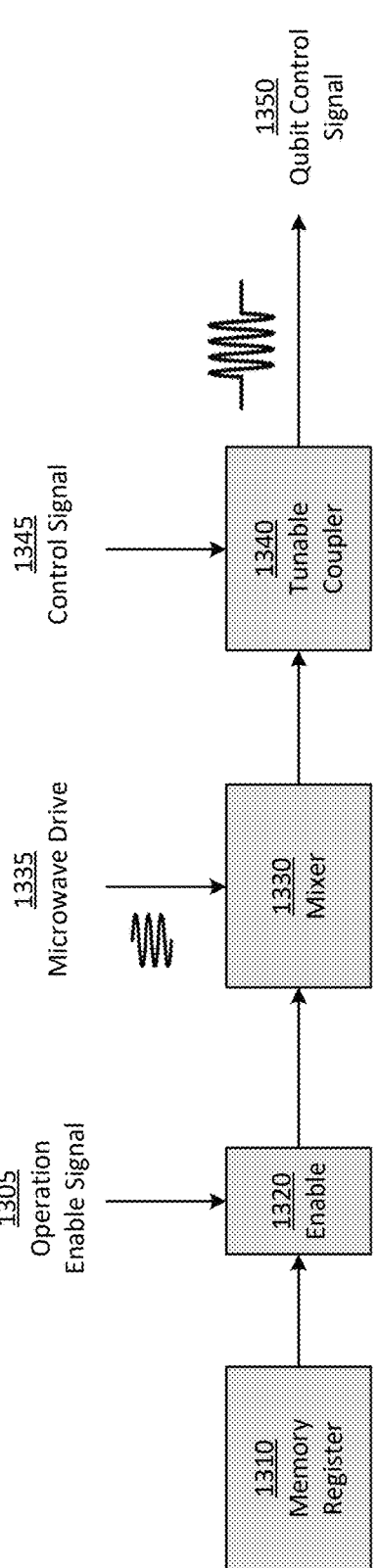
Figure 14:
Figure 15:
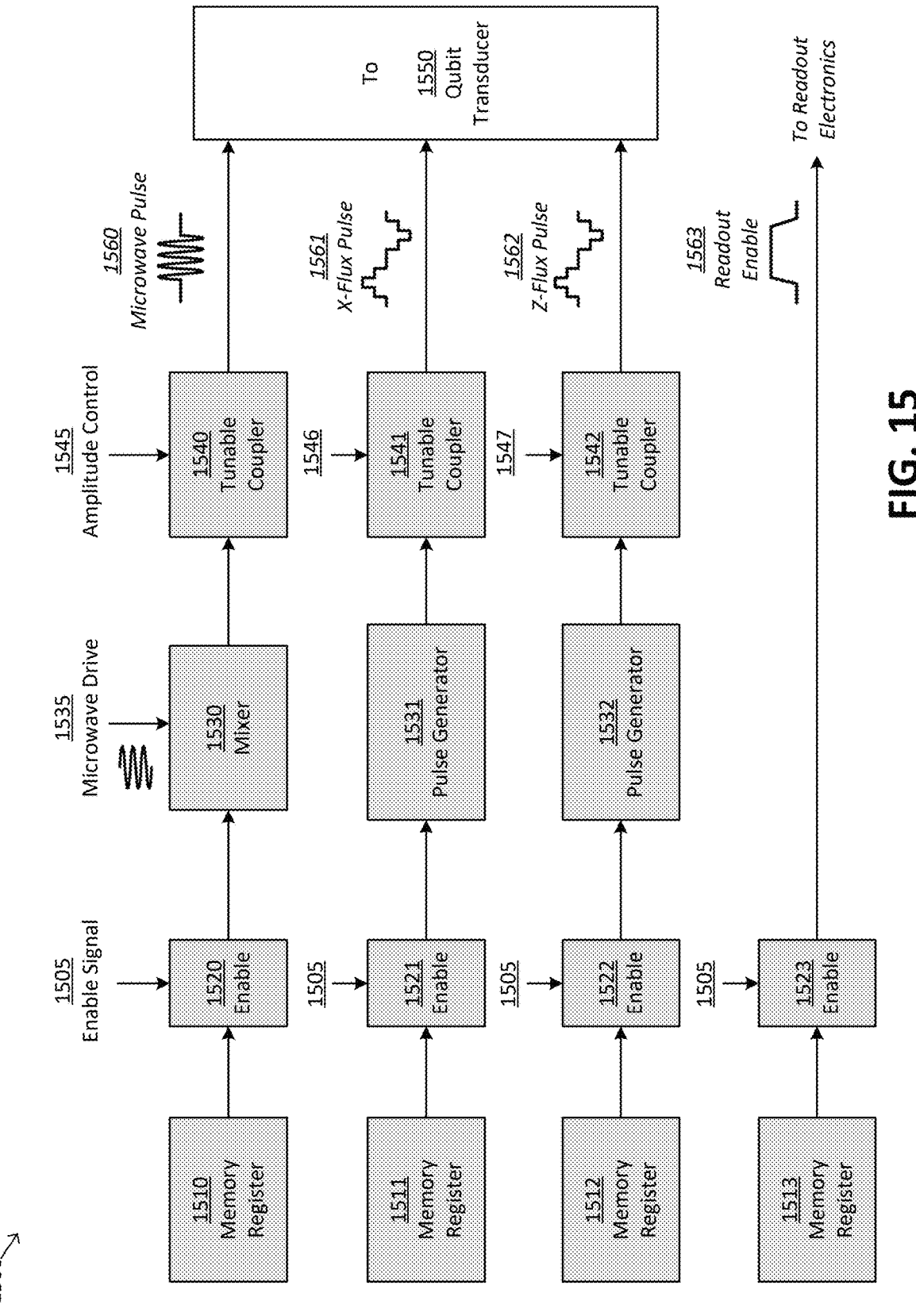
Figure 16:
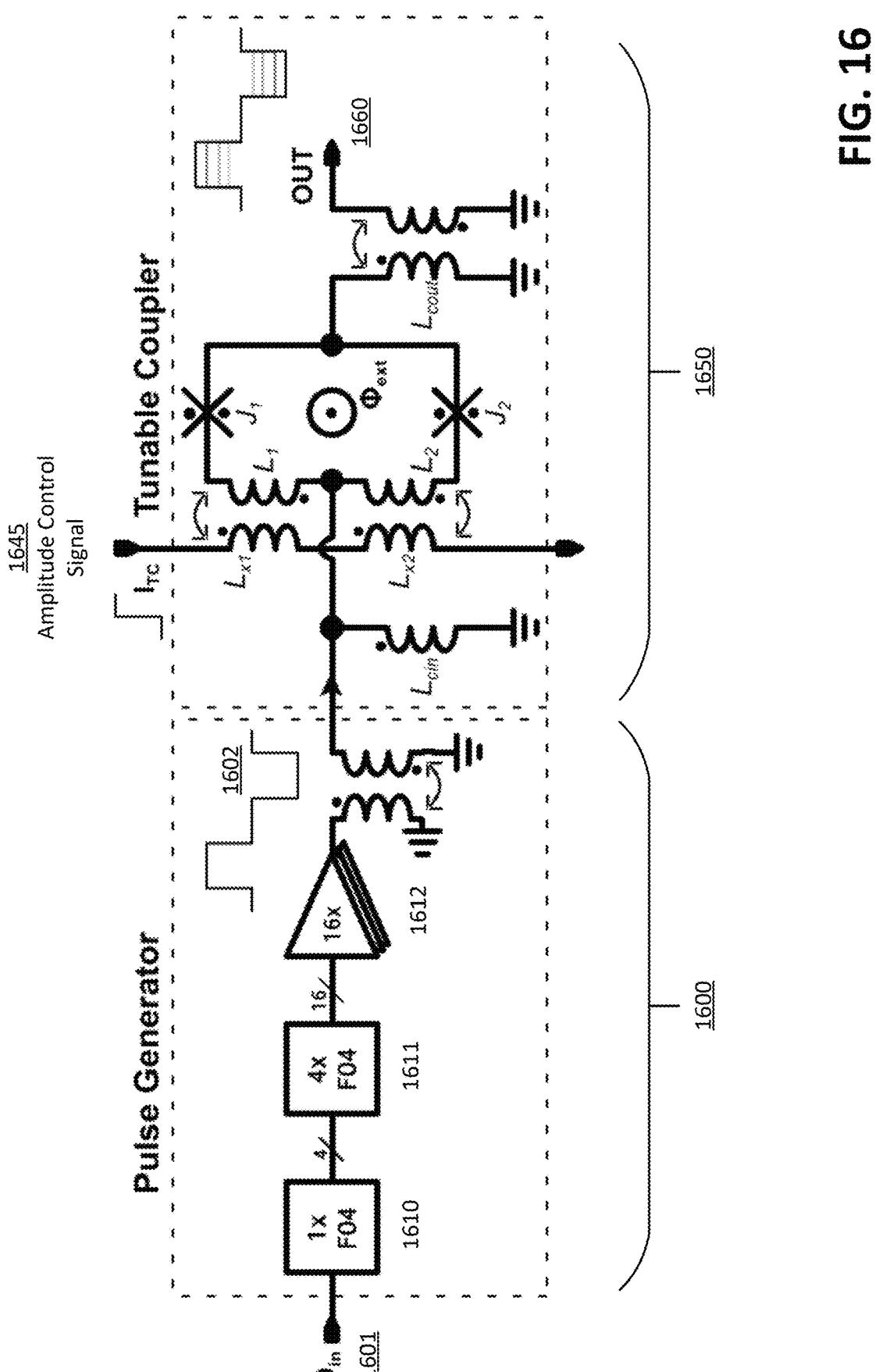
Figures 17A, 17B:
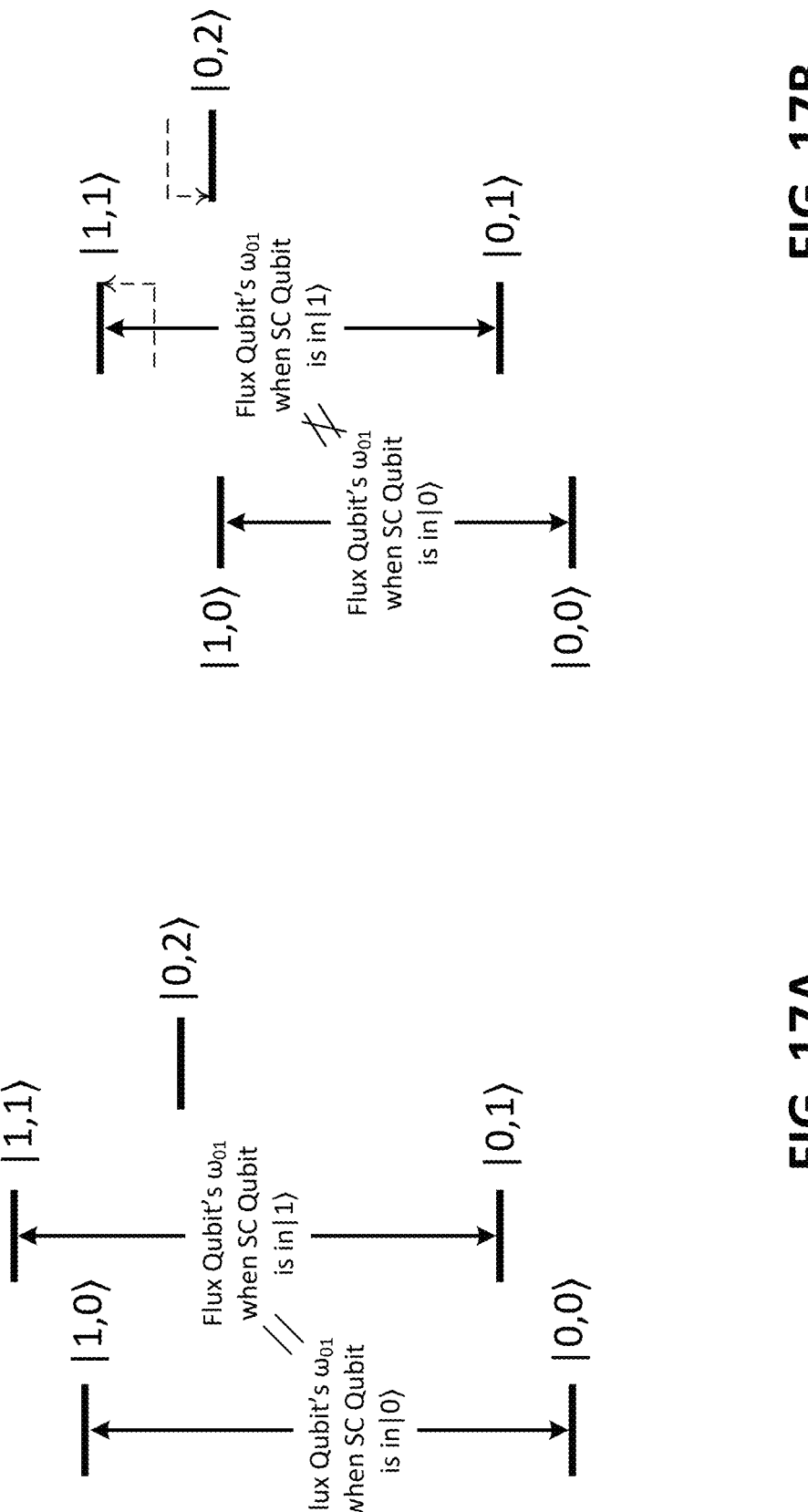
Figure 18:
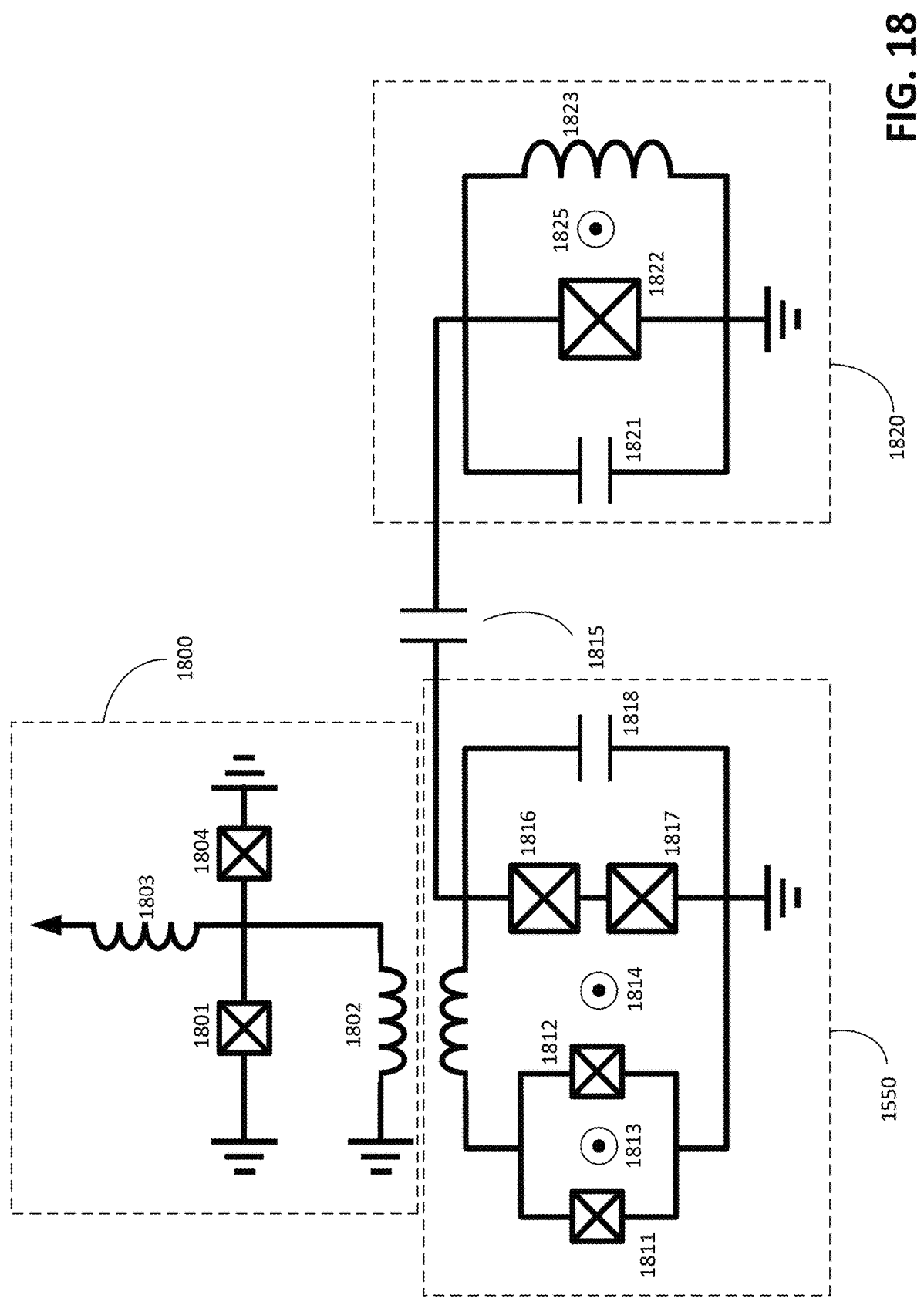
Figure 19:
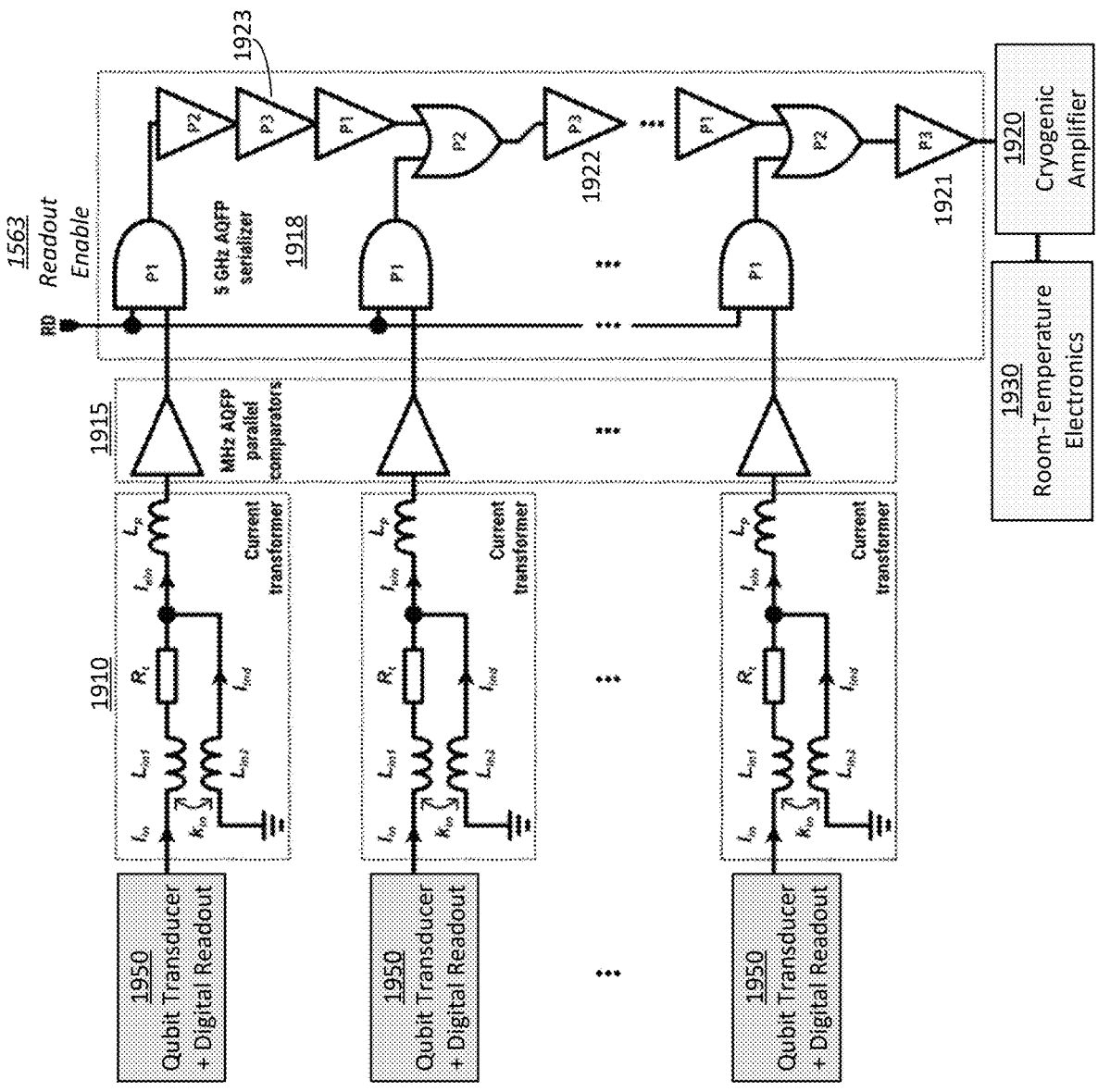
Figure 20:
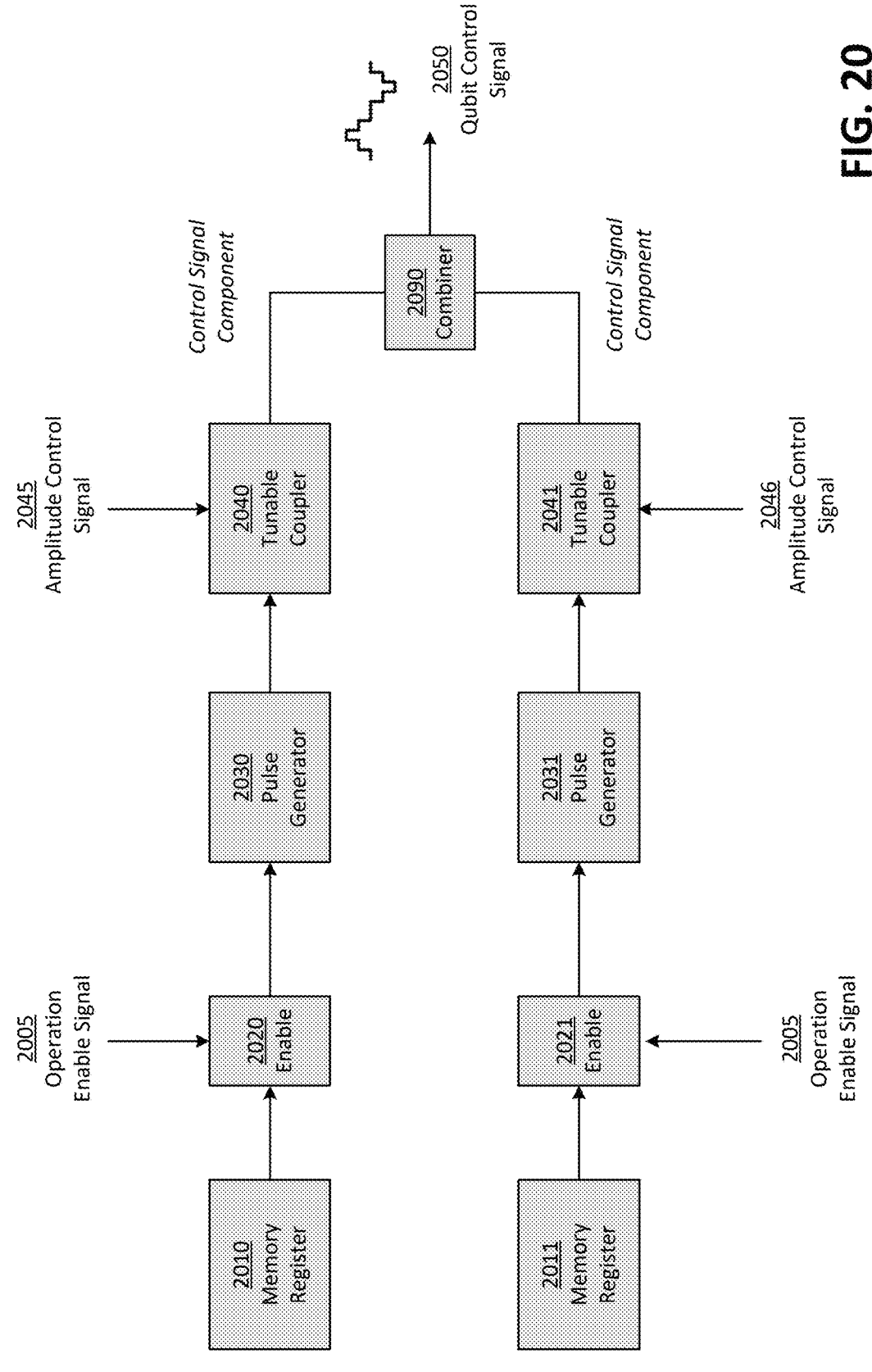
Figure 21:
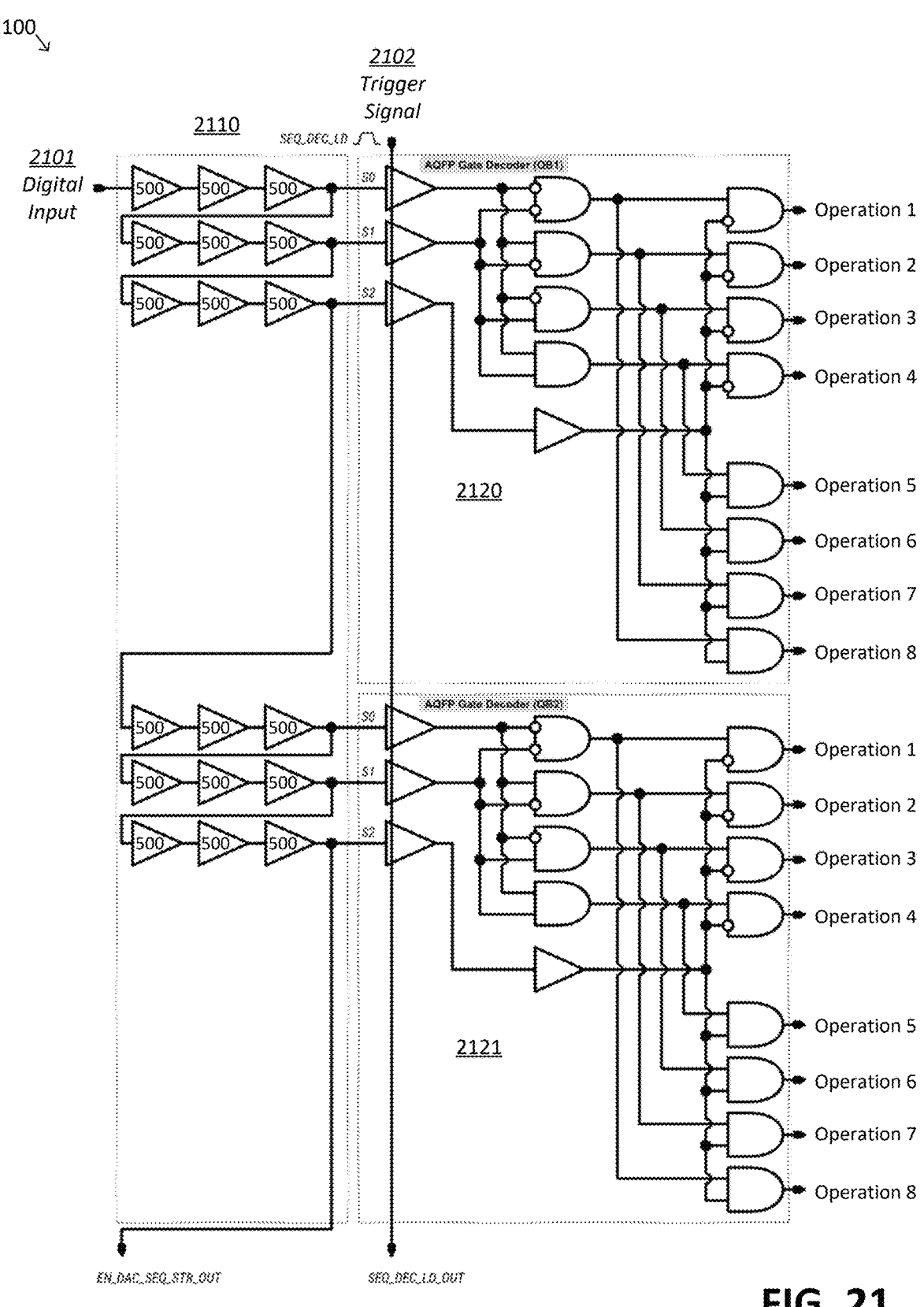
Figure 22:
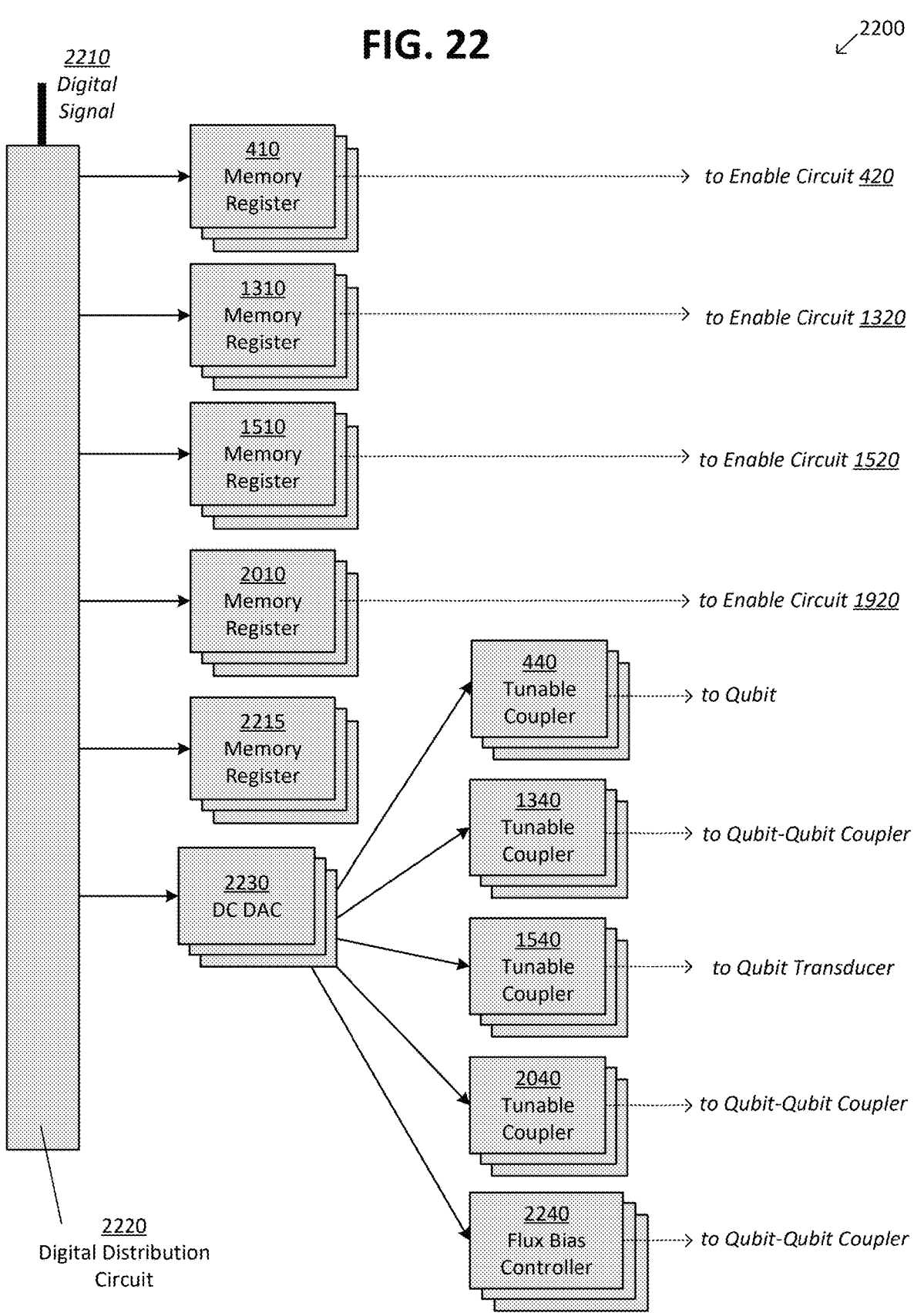
Figure 23:
Figure 24A:
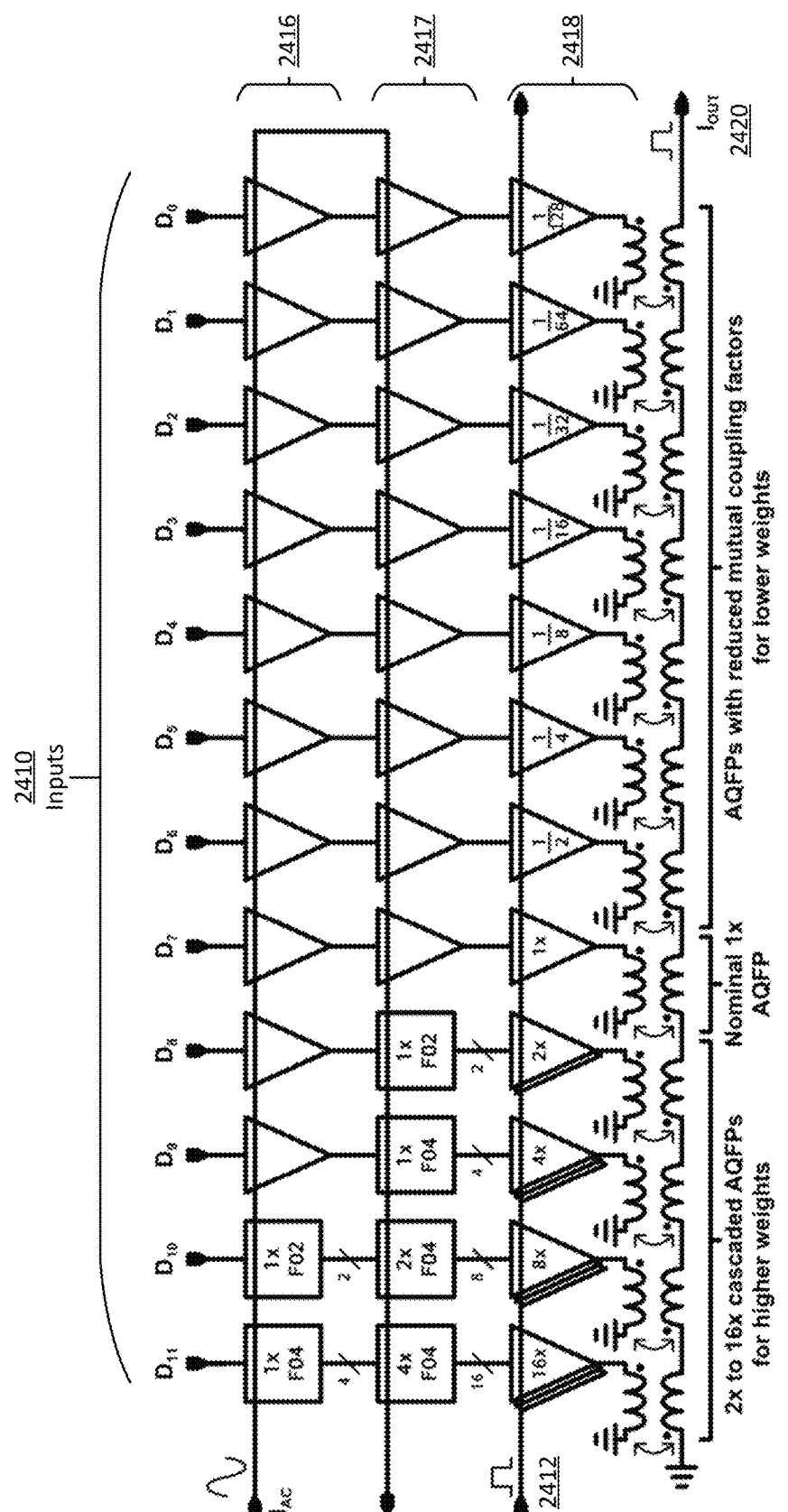
Figure 24B:
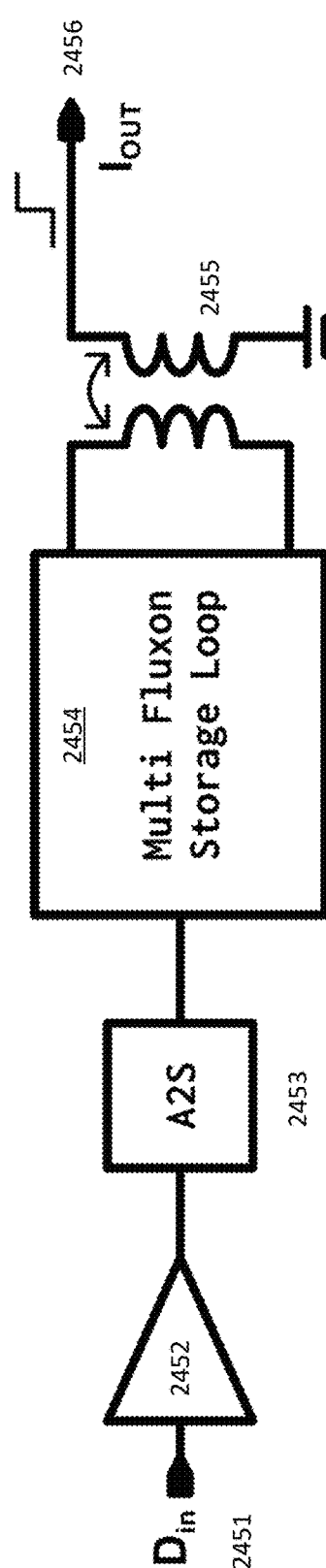
Figure 25:
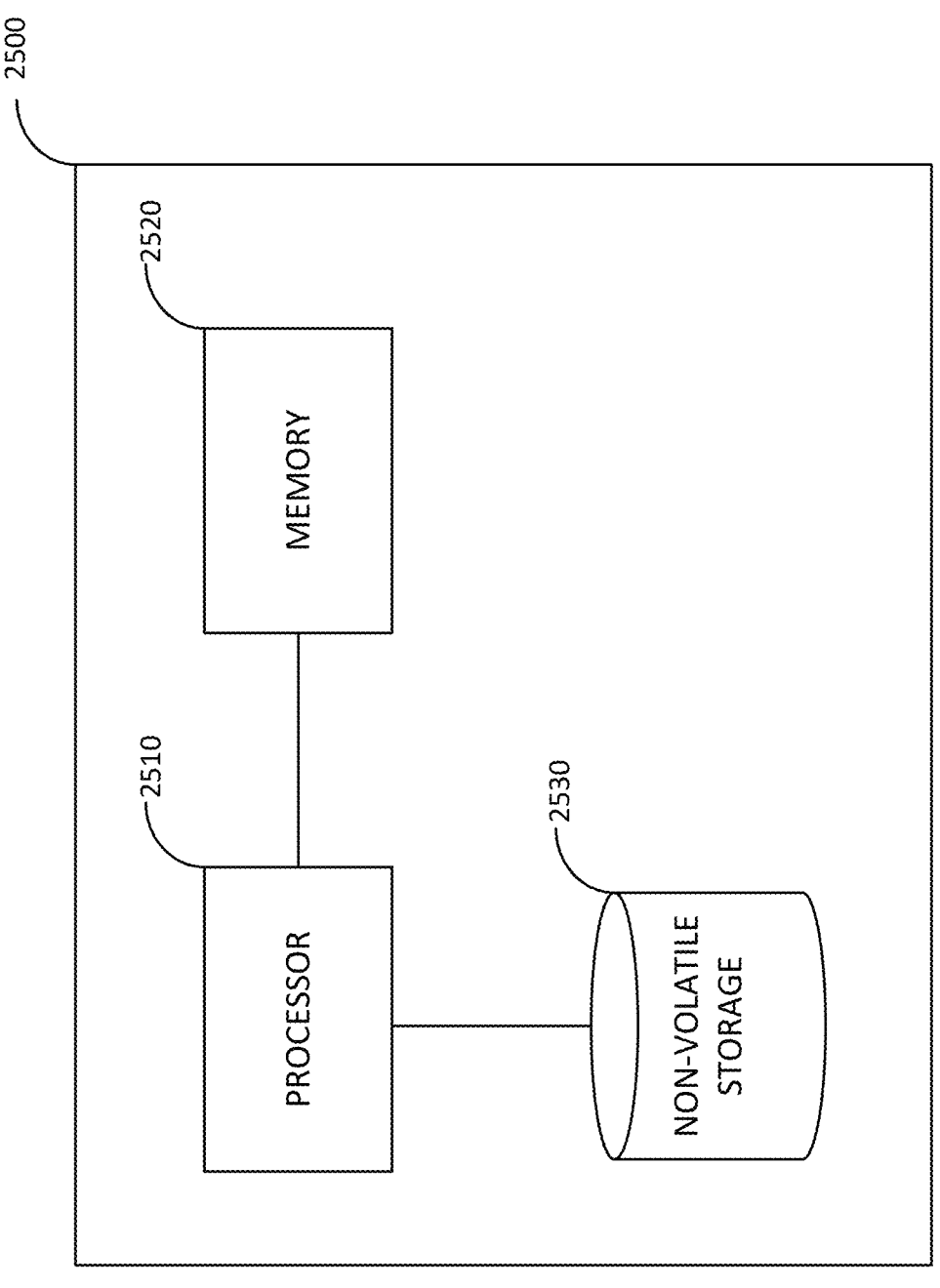

FIG. 11A depicts a Bloch sphere representation;

FIGS. 11B-11D depict parameters of a baseband pulse sequence and their relationship to parameters of single-qubit gates, according to some embodiments;

FIGS. 12A and 12B depict illustrative processes for generating analog baseband pulse sequences, according to some embodiments;

FIG. 13 depicts an illustrative two-qubit gate controller, according to some embodiments;

FIG. 14 depicts an illustrative implementation of a mixer suitable for modulating a microwave drive according to digital values, according to some embodiments;

FIG. 15 depicts an illustrative readout controller, according to some embodiments;

FIG. 16 depicts an illustrative implementation of a pulse generator and tunable coupler, according to some embodiments;

FIGS. 17A-17B depict energy level diagrams of a flux qubit and superconducting qubit system, according to some embodiments;

FIG. 18 depicts an illustrative implementation of a flux qubit, coupler and superconducting qubit, wherein the flux qubit is inductively coupled to a flux readout circuit, according to some embodiments;

FIG. 19 depicts an illustrative system of readout electronics, according to some embodiments;

FIG. 20 depicts an illustrative leakage reduction controller, according to some embodiments;

FIG. 21 depicts illustrative demultiplexing and decoding logic, according to some embodiments;

FIG. 22 depicts an illustrative system suitable for loading digital values in this manner, according to some embodiments;

FIG. 23 depicts an illustrative implementation of a digital distribution circuit, according to some embodiments;

FIGS. 24A and 24B depict illustrative implementations of a DAC, according to some embodiments; and FIG. 25 illustrates an example of a computing system environment on which aspects of the disclosure may be implemented.

DETAILED DESCRIPTION

Qubits can be implemented in superconducting circuits that are engineered to exhibit two or more discrete quantum states at different energy levels. Superconducting qubits typically include one or more non-linear devices, such as Josephson junctions, so that only desired transitions between quantum states can be stimulated. Superconducting circuits also have the advantage of being non-dissipative at low temperatures.

There are several different types of superconducting qubits that exhibit distinct energy levels such that two of the energy levels can be mapped to the logical quantum states $|0>$ and $|1>$. For instance, a charge qubit exhibits energy levels that correspond to different discrete amounts of charge in a small superconducting area, whereas a flux qubit exhibits energy levels that correspond to different persistent current states around a superconducting loop.

In some cases, the various types of superconducting qubits may be conventionally driven by microwave control pulses, which manipulate the quantum states of the qubits to perform quantum logic gates or other operations. For instance, a superconducting qubit is often driven by directing a microwave control pulse through one or more drive lines that are capacitively or inductively coupled to the superconducting qubit. These microwave control pulses are typically fast-oscillating and carefully tuned so that they have a frequency, phase, amplitude and envelope shape that will produce the desired operation on a qubit. The frequency and phase of the microwave control pulses must be controlled in a precise manner to produce the desired results. If these aspects of the signals are not produced accurately, the qubits may accumulate unwanted extra phase, leading to poor fidelity of operations. Moreover, qubits can often exhibit different resonant frequencies, such that the precise control of frequency and phase needs to be managed differently for different qubits. This type of control requires sophisticated microprocessors and other control electronics, in addition to signal routing to deliver control pulses from room temperature to individual qubits in the cryogenic stage.

As a result of these challenges, control of superconducting qubits conventionally requires a great deal of physical overhead, both in physical space and in thermal load, to route signals between qubits and room temperature, to provide cooling, and to provide sufficient electronics to generate highly tailored signals for each qubit. This physical overhead likely imposes physical space limits on the potential size of quantum processors of thousands of qubits. Yet, by most estimates, hundreds of thousands to millions of qubits will be needed to perform practically useful quantum computations.

The inventors have recognized and appreciated techniques for simplifying control requirements for superconducting qubits that require less physical space and exhibit a lower thermal load. In particular, techniques described herein allow aspects of the control electronics to be arranged in the cryogenic stage with minimal routing of signals between room temperature electronics and qubits in the cryogenic stage. The techniques described herein may improve scalability of quantum computing systems by reducing circuit complexity, reducing power needs, and/or reducing footprint. In some embodiments, the techniques may be implemented using adiabatic superconducting digital circuits, which exhibit very low energy dissipation.

According to some embodiments, the techniques described herein include digital demultiplexing techniques in which a digital signal line provides control inputs to a plurality of decoders via a digital bitstream. The decoders each demultiplex (e.g., time-demultiplex) a portion of the digital bitstream and identify a control operation to perform on a qubit based on their respective portions of the bitstream. A qubit controller may be operated in accordance with the indicated control operation to control a qubit, which may include performing various control operations such as single-qubit gates, two-qubit gates, or readout operations. In some embodiments, a qubit controller may, during a control operation indicated by a portion of the digital bitstream, control a first qubit and a second qubit (e.g., when performing a two-qubit gate) by providing a signal to a coupler that is coupled to the first qubit and the second qubit. In some embodiments, the digital signal line provides signals from room temperature to a cryogenic stage, and the decoders, qubit controllers and qubits are arranged in the cryogenic stage and implemented at least in part with superconducting logic. Such a configuration may reduce the footprint and thermal load of cables routing signals into the cryogenic stage, and thereby reduce circuit complexity, power needs, and/or footprint of the control system.

In some embodiments, a system may comprise a plurality of decoders and qubit controllers that share a common digital signal line. In some cases, for instance, each qubit may be coupled to a single qubit controller, which is coupled to a single decoder, so that there are an equal number of decoders, qubit controllers and qubits—although this is not a requirement of the techniques described herein. This configuration may allow a large number of qubits to be controlled with a single digital signal line. For example, if the data rate of the digital signal line bitstream is suitably faster than the time duration of the control operations performed on the qubits, many qubits can be simultaneously controlled by demultiplexing the bitstream. In some embodiments, demultiplexing in this manner may comprise, or consist of, time-division multiplexing (TDM), which may allow time-separated signals to be routed to different qubit controllers over the same digital signal line.

According to some embodiments, the techniques described herein include operating a qubit controller to generate a signal to apply to a qubit (e.g., to perform a control operation such as a gate) using a tunable coupler that controls the amplitude of at least part of the signal. In some embodiments, the qubit controller may comprise a plurality of digital-to-analog converters (DACs) that each convert digital values to an analog waveform (e.g., a DC current signal). The qubit controller may further comprise a plurality of tunable couplers each coupled to a respective DAC that adjusts the amplitude of the analog waveform from the respective DAC. The tunable couplers thereby produce a plurality of analog waveforms, which may be combined to produce a signal to apply to the qubit. In some embodiments, the tunable couplers may each be configured to receive a respective control signal that dictates the scaling factor which that tunable coupler applies to the analog waveform. In some embodiments, the digital values input to the DACs and/or the control signals provided to the tunable couplers may be loaded into programmable components of the qubit controller prior to performing control operations with the qubit controller. At least portions of the qubit controller, including the programmable components, the DACs, and the tunable couplers, may be advantageously implemented at least in part with superconducting logic. By operating the qubit controller to obtain digital values previously loaded into the programmable components and generate the signal to apply to the qubit based on these digital values, this configuration may allow for rapid, low power application of control operations on the qubit at low temperature.

In some embodiments, operating a qubit controller to generate a signal to apply to a qubit may comprise generating a baseband pulse sequence. The above-described DACs and tunable couplers may each generate a component of such a baseband pulse sequence, which may be combined (e.g., added) to produce the baseband pulse sequence. In some embodiments, many (or even all) qubits in a system can be controlled by baseband pulse sequences that are synchronized to a clock signal shared by the qubits and their associated qubit controllers. While the qubits may exhibit different resonant frequences, the qubits may be driven with the same parameterized baseband pulse sequence applied based on the shared clock signal, with parameters of the baseband pulse sequence applied by the qubit controller based on the control operation to be performed.

According to some embodiments, the techniques described herein include operating a superconducting data distribution circuit to load digital values into programmable components of a qubit controller. As described above, portions of a qubit controller, including the programmable components, the DACs, and the tunable couplers, may be advantageously implemented in superconducting logic. According to some embodiments, the superconducting data distribution circuit may be configured to receive digital data from a digital signal line and demultiplex portions of the digital bitstream, then supply the demultiplexed portions of the bitstream to the programmable components of the qubit controller. In some embodiments, the superconducting data distribution circuit may be configured to load data from the bitstream into a plurality of logic components (e.g., flip flops), then to synchronously unload the data from the logic components to the programmable components of the qubit controller.

According to some embodiments, a superconducting data distribution circuit may be configured using multiple types of superconducting logic to optimize speed and power usage across the data distribution circuit. For instance, adiabatic quantum flux parametron (AQFP) superconducting logic exhibits extremely low energy dissipation compared with single flux quantum (SFQ) superconducting logic, whereas SFQ superconducting logic can operate at higher speeds than AQFP superconducting logic. As referred to herein, SFQ logic refers generally to superconducting digital logic that encodes, processes, and/or transmits digital information using single flux quanta. Examples of SFQ logic include rapid single flux quantum (RSFQ) logic, energy-efficient rapid single flux quantum (ERSFQ) logic, and energy-efficient single flux quantum (ESFQ) logic. In some embodiments, the superconducting data distribution circuit may be implemented in part using SFQ superconducting logic, and in part using AQFP superconducting logic. For instance, the superconducting data distribution circuit may comprise SFQ components (e.g., SFQ flip flops) configured to store digital values during loading and unloading, and AQFP components configured to control the processes performing by the SFQ components and to direct digital values from the superconducting data distribution circuit to the programmable components.

Following below are more detailed descriptions of various concepts related to, and embodiments of, techniques for simplifying control requirements for superconducting qubits. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

While illustrative examples may be provided herein that relate to flux qubits, and particularly fluxonium qubits, the techniques described herein are generally applicable to any type of superconducting qubit, in addition to any other types of qubits where transitions between the qubit energy levels can be controlled by external control parameters such as voltage or current.

FIG. 1A depicts an illustrative control architecture for controlling a plurality of qubits, according to some embodiments. As described above, the techniques described herein include digital demultiplexing techniques in which a digital signal line provides control inputs to a plurality of decoders via a digital bitstream. System 100 is an example of such an approach in which a plurality of qubits including qubit 140, qubit 141, qubit 142, etc. may each be controlled via digital data supplied via the digital signal line 110. The decoders 120, 121, 122, etc. are configured to receive bits from the digital signal line 110 and generate instructions to control respective qubit controllers 130, 131, 132, etc. based on the received bits. The qubit controllers are configured to generate one or more control signals based on the instructions received from the decoders, and direct those control signals to the qubits to perform one or more control operations.

According to some embodiments, the decoders 120, 121, 122, etc., the qubit controllers 130, 131, 132, etc. and the qubits 140, 141, 142, etc. may each implemented, in whole or in part, with superconducting digital logic components. As such, the decoders 120, 121, 122, etc., the qubit controllers 130, 131, 132, etc. and the qubits 140, 141, 142, etc. may all be arranged within a low temperature stage, such as a cryogenic environment below 4K, such as below 1K, or below 100 mK, or below 50 mK. According to some embodiments, the digital signal line 110 may be arranged in part in a cryogenic environment below 4K, such as below 1K, or below 100 mK, or below 50 mK, with the decoders, controllers and qubits, and in part in a room temperature stage.

In some embodiments, the digital signal line 110 may be operated at a clock frequency greater than or equal to 1 GHZ, 2 GHZ, 3 GHZ, 4 GHZ, 5 GHZ, 7.5 GHZ, or 10 GHz. In some embodiments, the digital signal line 110 may be operated at a clock frequency less than or equal to 15 GHZ, 10 GHZ, 7.5 GHZ, 5 GHZ, 4 GHZ, 3 GHZ, or 2 GHz. Any suitable combinations of the above-referenced ranges are also possible (e.g., the digital signal line 110 is operated at a clock frequency greater or equal to 4 GHz and less than or equal to 6 GHz, etc.).

In some embodiments, the bitrate of the digital bitstream transmitted along the digital signal line 110 is greater than or equal to 1 Gbps, 2 Gbps, 3 Gbps, 4 Gbps, 5 Gbps, 7.5 Gbps, or 10 Gbps. In some embodiments, the bitrate of the digital bitstream transmitted along the digital signal line 110 is less than or equal to 15 Gbps, 10 Gbps, 7.5 Gbps, 5 Gbps, 4 Gbps, 3 Gbps, or 2 Gbps. Any suitable combinations of the above-referenced ranges are also possible (e.g., the bitrate of the digital bitstream transmitted along the digital signal line 110 is greater or equal to 4 Gbps and less than or equal to 6 Gbps, etc.). In some embodiments, the digital bitstream is a serial bitstream.

As shown in the example of FIG. 1A, each of the decoders serially time-multiplexes N bits from the digital bitstream. The size of N may be selected so that each type of control operation to be performed by the qubit controller may be represented by N bits. For example, if the qubit controllers are configured to perform one of eight different control operations, a value of N=3 may be selected so that the qubit controller may be instructed by three bits of data. As will be described further below, the qubit controllers may comprise programmable components that may be programmed with selected data values prior to operating the qubit controllers to control their respective qubits. As such, while a control operation may be identified using a small number of bits, data used in performing this control operation may be preprogrammed into components of the qubit controller (or otherwise to components coupled to the qubit controller). For example, a particular single qubit gate may be identified using a small number of bits (e.g., 3 bits). While 3 bits of data may be insufficient to generate a control signal to perform this gate, the 3-bit value may nonetheless allow a qubit controller to access data that allows the qubit controller to generate the control signal. As one non-limiting example, a qubit controller may be configured to perform a single-qubit gate operation on a qubit, and parameters describing aspects of a signal to be generated to perform this operation may be preprogrammed into components of the qubit controller. When a bit value that indicates this single-qubit gate is to be performed is received by the qubit controller, it accesses these preprogrammed values in response to the bit value when preparing the signal to be generated.

By demultiplexing a digital signal in the manner shown in FIG. 1A, and described in other embodiments below, a large number of qubits may be controlled with one digital signal line. For instance, if control operations are performed on qubits over a duration of 25 ns, and the digital signal rate is 5 Gbps, then 125 bits may be transmitted to a plurality of decoders within a 25 ns window. If each decoder demultiplexes 3 bits of the signal, for example, then 41 qubits may be instructed in the 25 ns time window from one digital signal line through demultiplexing.

According to some embodiments, the decoders 120, 121, 122, etc. each comprises one or more registers (e.g., shift registers) configured to receive bits from the digital signal line 110 and hold these bits until a trigger signal is received, at which time the bits in the registers are processed by the decoder and/or transmitted to the respective qubit controllers 130, 131, 132, etc. By sending such a trigger signal to multiple decoders at the same time that are holding bits in this way, the decoders may synchronously generate respective decoded instructions despite receiving bits from the digital signal line 110 at different times. In some embodiments, for instance, system 100 may be configured to periodically send a trigger signal to each of the decoders 120, 121, 122, etc. that causes the decoders to synchronously send decoded instructions to their respective qubit controllers. Such a trigger signal may be sent, for example, at a fixed point within a control operation time window (e.g., in the 25 ns window as described above), in which case the trigger signal may be sent to the decoders with a frequency corresponding to the control operation period (e.g., at 40 MHz for a 25 ns control operation period).

According to some embodiments, the digital signal line 110 may comprise a chain of digital logic components that store data, such as latches, registers or flip flops. Such components may for instance be implemented in superconducting digital logic, such as with adiabatic quantum flux parametron (AQFP) digital logic, described further below. In some embodiments, the digital signal line 110 comprises a shift register comprising a chain of flip flops. A clock signal, or other suitable signal, may trigger bits in each flip flop being moved from one flip flop to the next in the chain.

According to some embodiments, the qubit controllers 130, 131, 132, etc. may each comprise (or otherwise be configured to receive data from) a plurality of programmable components, such as memory registers and/or digital-to-analog converters (DACs). System 100 may be configured to receive data (e.g., along the digital signal line 110 and/or along a different digital signal line) and route data to such programmable components, which store the data to be used during subsequent control operations. In some embodiments, the system 100 may be operated in two distinct phases: (i) a period during which data is loaded into programmable components and no control operations are performed; and (ii) a period in which the data in the programmable components is fixed and control operations are performed. Since loading data into the programmable components may dissipate energy into the cryogenic stage of the system 100, it may be beneficial to perform operations in phase (i), then to power down any components used in phase (i) before beginning phase (ii).

In the example of FIG. 1A, qubits 140, 141, 142, etc. may each be a superconducting qubit, such as but not limited to, a charge qubit such as a transmon qubit, a gatemon qubit, or an Xmon qubit; a flux qubit such as a fluxonium qubit or a capacitively shunted flux qubit (CSFQ); or a phase qubit. In some cases, the qubit may be a logical qubit formed from multiple physical qubits, such as a resonator coupled to an ancilla transmon qubit, two coupled resonators (dual-rail cavity qubit), or a two coupled transmon qubits (dual-rail transmon qubit). In some embodiments, one or more of qubit 140, 141, 142, etc. is a flux qubit, which comprises a superconducting circuit that exhibits energy eigenstates with different persistent currents depending on its flux bias. In some embodiments, one or more of qubit 140, 141, 142, etc. comprises a superconducting circuit arranged as a loop threaded by an external magnetic field and interrupted by a Josephson junction, such that the magnetic flux within the loop is proportional to a phase difference across the Josephson junction. For example, one or more of qubits 140, 141, 142, etc. may be a fluxonium qubit, which comprises a Josephson junction, a capacitor and an inductor arranged in parallel with one another in a superconducting circuit, with an external magnetic flux threaded through the loop. For example, one or more of qubits 140, 141, 142, etc. may be a dual-rail transmon qubit, which comprises two coupled transmon qubits. One or both transmon qubits may include a superconducting loop interrupted by Josephson junctions and threaded by an external magnetic field.

In some embodiments, system 100 may comprise additional components not shown in FIG. 1A. For instance, in some embodiments, system 100 may comprise qubit transducers coupled to each of the qubits 140, 141, 142, etc. The qubit transducers may be coupled to respective qubits and provide for readout operations of the respective qubits. In such instances, control signals may be directed to the qubit transducers to cause readout of the qubits. Further examples of such a process are described below.

In some embodiments, system 100 may comprise additional components coupled to the qubits that allow for certain control operations, such as entangling (two-qubit) gates. System 101 shown in FIG. 1B is an example of such an embodiment of system 100, and shows couplers 145 and 146 arranged coupled to neighboring qubits, with coupler 145 coupled to qubits 140 and 141, and coupler 146 coupled to qubit 141 and another qubit, etc. In the example of FIG. 1B, each of the couplers is coupled to two qubits, and certain control operations may be performed by directing a signal to the coupler and/or to one or both of the qubits.

According to some embodiments, coupler 145 comprises one or more modes through which the qubits 140 and 141 can interact. The state of two qubits connected by a coupler having two modes can be represented as |QB1 QB2 CPLR>, where QB1 and QB2 are the states of qubit mode 1 and qubit mode 2, respectively, and CPLR is the state of the coupler that provides coupling between the qubits. Qubit 140 and qubit 141's higher excited states—the |210> and |120> states—can interact through a coupler-excited state |111>. By tuning the energy of |111>, the effective coupling strength between |210> and |120> can be adjusted. For example, if |111> is brought closer to |210> and |120>, the effective qubit-qubit interaction through |111> becomes stronger (e.g., may effectively turn on the coupling). On the other hand, if |111> is brought further from |210> and |120>, the effective qubit-qubit interaction strength through |111> decreases. For instance, adjusting |111> in this manner may effectively turn off the coupling if the effective coupling strength through |111> is reduced to be negligibly small. Additionally, or alternatively, adjusting |111> in this manner may effectively turn off the coupling if the effective coupling strength through |111> is canceled out by the direct coupling between |210> and |120>.

According to some embodiments, entangling gates can be implemented by adjusting the flux bias of coupler 145 while applying a microwave signal to the qubit 140, qubit 141, and/or coupler 145. For instance, entangling gates may be implemented through Baseband- and Microwave-Activated Phase (BMAP) gates. According to some embodiments, performing an entangling gate may comprise generating a baseband signal by superconducting digital logic, thereby generating a time-varying current signal that adjusts the flux bias of a coupler, whereas the microwave signals may be generated by superconducting digital logic that applies an envelope to a shared microwave source signal according to digital values, and produces an analog microwave pulse that drives the qubit(s) and/or coupler between energy states.

Prior to performing an entangling gate, the qubits 140 and 141, and the coupler 145, can be arranged in an idle state in which qubits are not undergoing any entangling gate operations. Subsequently, the coupler 145 may be biased by the control signal from the qubit controller so that the coupling between the qubits 140 and 141 is active or turned on, thereby allowing entangling gates to be performed between the qubits.

One illustrative implementation of the coupler 145 is depicted in FIGS. 2A-2C in the case where qubits 140 and 141 are fluxonium qubits, according to some embodiments. In the example of FIG. 2A, fluxonium qubits 202 and 204 are connected to a coupler 205 which comprises a sub-circuit 206 that is connected to two nodes 214 and 216. Node 214 is connected to capacitor 220 that is connected to ground 222, and node 216 is connected to capacitor 224 that is connected to ground 226. The sub-circuit 206 has a coupler mode associated with a phase difference ($\varphi_{214}-\varphi_{216}$) across node 214 and node 216. Thus, a suitable control signal that adjusts this phase difference will control the coupling strengths between the qubit modes and the coupler modes. Capacitors 210 are distributed in the circuit between the nodes and the qubits and determine the capacitive coupling strengths between the qubit modes and the coupler modes. In some embodiments, rather than the sub-circuit 206 being arranged capacitively coupled to ground as shown in FIG. 2A (i.e., floating), the sub-circuit is instead directly coupled to ground. In this configuration, nodes 214 and 216 can share the same phase ($\varphi_{214}=\varphi_{216}$), and the coupler mode is associated with the phase relative to ground 222 or ground 226.

FIGS. 2B and 2C depict illustrative circuits that can each be used as the sub-circuit 206. FIG. 2B depicts a sub-circuit 230 comprising single or multiple Josephson junctions 234 connected in series with single or multiple Josephson junctions 236 shunted by a capacitor 232. A magnetic flux 291 is threaded through the lower superconducting loop (i.e., bounded by the Josephson junction(s) 234 and the Josephson junction(s) 236). FIG. 2C depicts a sub-circuit 240 that is connected to ground 248 and comprises a set of one or more Josephson junctions 242 connected in series to single or multiple Josephson junctions 246 shunted by a capacitor 244. In addition, a with a magnetic flux 292 is threaded through the left superconducting loop (i.e., bounded by the Josephson junction(s) 242 and the Josephson junction(s) 246). In each of the examples of FIGS. 2B and 2C, the coupling strengths between the qubit modes and the coupler modes may be adjusted by controlling the magnetic flux 291 or 292 threaded through each of the illustrative sub-circuits 230 and 240, respectively.

More generally, the sub-circuit 206 may comprise a first circuit portion that includes two or more Josephson junctions connected in series over a first closed path without any capacitors in the first closed path and a second circuit portion including two or more Josephson junctions connected in series over a second closed path without any capacitors in the second closed path. A magnetic flux may be threaded through the first closed path and controlled to adjust the coupling strengths between the qubit modes and the coupler modes and thereby perform entangling (two-qubit) gates between the qubits.

Returning to FIG. 1B, in some embodiments, the decoders 120, 121, 122, etc. are configured to route signals to different portions of the respective qubit controllers 130, 131, 132, etc. depending on the value of the bits received by the decoder. For instance, certain portions of the qubit controller may process data or otherwise be active based on the bit value received by the decoder. As such, a decoded instruction may encompass signals that enable or otherwise instruct portions of the qubit controller to operate to generate a control signal. The qubit controllers may thereby be viewed as containing a plurality of sub-controllers that each are responsible for performing one or more types of control operations. For instance, as shown in system 102 in FIG. 1C, which is an illustrative embodiment of system 100 shown in FIG. 1A, the qubit controller 130 may comprise a single-qubit gate controller 400, a two-qubit gate controller 1300, a readout controller 1500, and a leakage reduction controller 2000. These controllers (and/or other controllers) within qubit controller 130 may each be configured to direct a control signal to qubit 140 and/or coupler 145 to control the qubit 140 or to control both the qubits 140 and 141 according to a decoded instruction received from the decoder 120. Detailed examples of each of these sub-controllers are described below.

According to some embodiments, control operations may be performed on multiple qubits at the same time according to a common clock signal. For instance, system 100 may be configured to synchronize application of control signals to multiple qubits with a common clock signal such that the control signals can be applied to each qubit simultaneously at the start of a given clock cycle. For instance, the decoders 120, 121, 122, etc. may be configured to receive bits from the digital signal line 110 and hold these bits until a trigger signal is received, at which time the bits in the registers are processed by the decoder and/or provided to the respective qubit controllers 130, 131, 132, etc., which over the course of a clock cycle generate and apply a control signal to a qubit and/or coupler. This approach may allow control signals to be produced over a clock cycle and initiated synchronously by the qubit controllers at the start of the clock cycle, according to a common clock signal shared by the decoders and qubit controllers. For instance, control operations may be executed according to a series of fixed duration time windows that are synchronized across the qubits of system 100.

In some embodiments, a control operation may be operated over multiple clock cycles by applying a first control signal (representing a first portion of the control operation) over a first clock cycle, then applying a second control signal (representing a second portion of the control operation) over a second clock cycle immediately after the first clock cycle.

FIG. 3 depicts a number of clock cycles of a common clock signal and illustrative control operations that may be applied to each of three qubits during these clock cycles, according to some embodiments. In the example of FIG. 3, each control operation is represented by a rectangle labeled with the operation being performed as a result of application of the control operation. For example, in the example of FIG. 3, during the first illustrated clock cycle 301, an X($\pi$/2) gate is performed on qubit 1, an X($\pi$/2) gate is performed on qubit 2, and an Identity gate/is performed on qubit 3. For instance, system 100 may be configured to apply a respective control operation to each of the three qubits 140, 141 and 142 during the clock cycles 301, 302 and 305. Also in the example of FIG. 3, a CZ entangling gate is applied to qubits 1 and 2 over two clock cycles 303 and 304. For example, in each of clock cycles 303 and 304, a control operation may be applied to each of qubits 140 and 141 (e.g., via coupler 145) so that the net effect of the control operation is to perform a CZ gate on qubits 140 and 141. The CZ gate in clock cycles 303 and 304 in FIG. 3 is an example of a gate performed over multiple clock cycles through application of multiple control operations.

FIG. 4A depicts an illustrative single-qubit gate controller, according to some embodiments. Single-qubit gate controller 400 is an illustrative example of a portion of a qubit controller 130, 131, 132, etc. of system 100 shown in FIG. 1A, and of single-qubit gate controller 400 shown in FIG. 1C. The single-qubit gate controller 400 may be operated by system 100 to generate a control signal that is directed onto a qubit (e.g., by qubit controller 130 onto qubit 140) to perform a single-qubit gate. For instance, single-qubit gate controller 400 may be operated by system 100 to generate a control signal that performs a single-qubit gate on the qubit such as an X($\pi$/2) gate, a Y($\pi$/2) gate, an identity gate I, etc. According to some embodiments, the single-qubit gate controller 400 may be implemented at least in part with superconducting digital logic.

In some embodiments, the single-qubit gate controller 400 may be configured to perform one particular single-qubit gate, with another instance of single-qubit gate controller 400 included within the qubit controller 130 to perform a different single-qubit gate. The different instances of single-qubit gate controller 400 may be operated based on the output of the decoder produced from the digital bitstream of signal line 110. As one non-limiting example, a digital value of 000 may cause the decoder to produce a signal to operate a first instance of single-qubit gate controller 400 configured to perform a X($\pi$/2) gate; a digital value of 001 may cause the decoder to produce a signal to operate a second instance of single-qubit gate controller 400 configured to perform a Y($\pi$/2) gate; a digital value of 010 may cause the decoder to produce a signal to operate a third instance of single-qubit gate controller 400 configured to perform an identity gate, etc. Any desired number of instances of single-qubit gate controller 400 may be provided in the qubit controller 130, depending on the number of different single-qubit gates that the system is configured to perform.

In the example of FIG. 4A, single-qubit gate controller 400 comprises memory register 410, enable circuit 420, DAC 430, and tunable coupler 440, which together produce a first component of qubit control signal 450. Similarly, memory register 411, enable circuit 421, DAC 431, and tunable coupler 441 together produce a second component of qubit control signal 450. Additional memory registers, enable circuits, DACs and tunable couplers may also be included in single-qubit gate controller 400 to produce additional components of the qubit control signal 450. Irrespective of how many components of the qubit control signal are produced, they are combined by combiner 490 to produce the qubit control signal 450.

In operation, single-qubit gate controller 400 receives an operation enable signal 405 from a decoder (e.g., in the example of system 100, the single-qubit gate controller 400 within qubit controller 130 receives the enable signal from decoder 120). The enable signal 405 is supplied to each of the enable circuits 420, 421, etc. which causes the memory registers 410, 411, etc. to output digital values. In the example of FIG. 4A, the memory registers 410 and 411 are each configured to store information describing at least part of a pulse, such as when to apply the pulse (or part thereof) and its duration. An illustrative implementation of memory register 410 or 411 is shown in FIG. 6 and described below.

The digital values from the memory register 410, 411, etc. are directed to the respective DAC 430, 431, etc. which converts these digital values into analog (e.g., current) signals (e.g., a time-varying current signal). Respective tunable couplers 440 and 441 then adjust the amplitude of (or otherwise modulate) the analog signals according to amplitude control signal 445 or 446, respectively. An illustrative implementation of a DAC and tunable coupler is shown in FIG. 9 and described below.

In some embodiments, the digital values stored by the memory registers 410 and 411 are a string of bits indicating when a pulse should be applied during a time window (e.g., within a clock cycle or multiple clock cycles of a clock), with each bit representing a time point within that time window and whether or not a pulse should be applied, or not, at that time point. The DACs may produce an analog signal (e.g., a time-varying current signal) from this bit value that varies between two different current values corresponding to the bit value. For instance, the digital values 00110000 may be stored by memory register 410 indicating that a pulse should be applied at the third and fourth time points within a time window with eight time points. The DAC 430 may receive these digital values and output an analog signal that is at a low current at the start, then a high current during the third and fourth time points, and then at a low current again for the remainder. The tunable coupler 440 may adjust (increase or decrease) the amplitude of the analog signal as it generated to produce a signal that is a component of the qubit control signal 450.

In the example of FIG. 4A, the combiner 490 is configured to combine multiple qubit control signal components to produce the qubit control signal 450. In some embodiments, the combiner 490 receives multiple current signals and outputs a single current signal with amplitude equal to the sum of the multiple current signals at a given time. In some embodiments, the combiner comprises a plurality of inductors that are galvanically and/or magnetically coupled to a shared output inductor, where the inductance ratios (if galvanically coupled) or coupling coefficients (if magnetically coupled) determine the contribution of each input current signal to the combined output current signal. In some embodiments, the combiner 490 comprises a band-pass filter and/or a low-pass filter, which may remove unwanted noise and/or oscillations from the qubit control signal. Such a band-pass filter may be implemented as one or more superconducting components.

In some embodiments, single-qubit gate controller 400 may comprise one or more time shifters that are each coupled to the output of an enable circuit and coupled to the input of a DAC. That same enable circuit may also be coupled to the input of a different DAC. The time shifter may be configured to delay the input of digital values from a memory register into a DAC, so that the same digital values are provided to a first DAC and to a second DAC, but the second DAC, to which the time shifter is coupled, receives those digital values at a later time than the first DAC. In some embodiments, a time shifter may be implemented as a shift register (e.g., as a chain of serially connected flip flops or buffers), with the number of registers in the shift register being selected to produce the desired time delay.

In some embodiments, the single-qubit gate controller 400 is configured to generate flux bias signals (e.g., current signals directed to a flux antenna) as the qubit control signal 450. For example, the single-qubit gate controller 400 may be configured to generate flux signals to dynamically adjust one or more fluxes threaded through a superconducting loop in the qubit. In some cases, the qubit may be a flux qubit, such as a fluxonium qubit, and the single-qubit gate controller 400 is configured to control the flux through a superconducting loop in the qubit. In some embodiments, the single-qubit gate controller 400 is configured to direct flux signals and/or microwave signals to the qubit. In some embodiments, FIG. 4B depicts an illustrative single-qubit gate controller 401, which is an illustrative embodiment of single-qubit gate controller 400 that includes a time shifter 428 arranged in this manner. As shown, the digital values from memory register 410 are supplied directly to DAC 430, and also to DAC 433 via the time shifter 428. Since the amplitude control signals 445 and 447 may generally apply a different amplitude scaling to each of the two signals received from DACs 430 and 433, respectively, the qubit control signal components produced by the tunable couplers 440 and 443 are not necessarily time-shifted versions of one another. In general, single-qubit gate controller 400 may comprise any number of time shifters arranged as shown in FIG. 4B, and each of the memory registers may be coupled to any number of time shifters (e.g., a single memory register and enable circuit may be coupled to three, four, etc. time shifters each with different time shifts applied, and each coupled to respective DACs and tunable couplers). The single-qubit gate controller 400 may also comprise some memory registers coupled to one or more time shifters and other memory registers coupled to different numbers of time shifters (including zero time shifters).

As described above, various components of system 100 may be implemented with superconducting digital logic components. As one illustrative example, aspects of the digital signal line 110, decoders 120, 121, 122, etc., and/or qubit controllers 130, 131, 132, etc. may be implemented using AQFP logic components.

FIG. 5 depicts an illustrative AQFP component, according to some embodiments. The left side of FIG. 5 depicts the circuit representation 500 of the AQFP component, and the right side shows a symbol 550 representing this circuit. The circuit 500 has a single input 501, which is provided as a DC current that represents a digital 1 or 0 (e.g., positive or negative). The AQFP component 500 is driven by an AC power-clock signal, which is supplied in the example of FIG. 5 as an AC signal with a DC offset. The AC component of the power-clock signal is supplied to either of the bidirectional ports ACL or ACR, and the DC component of the power-clock signal is supplied to either of the bidirectional ports DCL or DCR. When the power-clock signal is applied, a persistent current is produced at the output while the power-clock signal continues to be applied. If the input is a digital 1 (e.g., positive current) when the power-clock signal is first applied, the output signal 502 is also a digital 1 (e.g., positive current). Similarly, if the input is a digital 0 (e.g., negative current) when the power-clock signal is first applied, the output signal 502 is also a digital 0 (e.g., negative current).

The parameters of the various inductors and Josephson junctions of the circuit 500 may be configured to adjust the behavior of the circuit. For instance, the coupling factor of the output transformer $K_{out}$ represented by the inductances $L_q$ and $L_{out}$ may be inverted to cause the circuit to behave as a NOT gate rather than a component whose input matches its output. Similarly, asymmetry of the $L_1$ and $L_2$ inductors and removal of the input can cause the circuit to always produce a logical 1 or logical 0 when the power-clock signal is applied. Multiple instances of the AQFP circuit 500 with different configurations of the various inductors and Josephson junctions may be combined and their outputs connected together to create different types of Boolean logic gates.

AQFP logic and the more general Quantum Flux Parametron (QFP) logic share the circuit topology shown in FIG. 5, but differ in circuit parameters. For example, the product of the critical current of junctions $J_1$ and $J_2$ and the inductance of the input inductor ($L_{in}$), and/or the product of the critical current of the same junctions and the inductance of the load inductor ($L_q$), may be varied, affecting energy efficiency and determining whether the circuit operates closer to the adiabatic (AQFP) or non-adiabatic (QFP) regime. This distinction between AQFP and QFP regimes does not necessarily affect the waveform produced, however, outside of possible amplitude differences (which can be rectified). As such, while the term "AQFP" may be used herein to refer to superconducting digital logic circuits, it will be appreciated that by adjusting components of circuit 500, the same circuit may be employed in the same way in a QFP regime. As such, any examples below utilizing circuit 500 should be understood not to be limited to AQFP implementations, and implicitly also describe QFP implementations.

The AQFP circuit 500 may also be used as a flip flop or buffer in a multi-phase clocking implementation by directing one of a plurality of phase-separated AC currents to the power-clock input of successive AQFP circuits in a chain of AQFP circuits. This causes each of the AQFP circuits 500 to produce output at different times in a given clock cycle so that the net effect is that digital values move step-by-step through the chain in a pipelined manner. For example, a three-phase clocking implementation utilizes three AQFP circuits 500 in a chain so that data propagates through the chain with a latency of one clock cycle (equivalently, ⅓ of the clock cycle per AQFP circuit).

Use of AQFP logic as shown in FIG. 5 can, in at least some implementations, reduce dynamic energy dissipation due to the adiabatic operation of the circuit. In particular, AQFP logic can achieve an energy-delay-product (EDP) close to the theoretical quantum limit.

FIG. 6 depicts an example implementation 600 of a memory register 410 of the single-qubit gate controller 400 shown in FIG. 4A, according to some embodiments. In the example of FIG. 6, the memory register 600 comprises a number of AQFP components, including an AQFP shift register 620 comprising a plurality of AQFP circuits 500 arranged in series, an AQFP OR gate 610 and an AQFP AND gate 630. The AQFP shift register 620 may be operated as described above, e.g., using three AQFP circuits 500 for each register in the shift register in a three-phase clocking implementation so that data flows from one register to the next in each clock cycle.

In the example of FIG. 6, the illustrative memory register 600 may be operated in the following modes. In a write mode, the illustrative memory register 600 is operated to write digital values received at the data input 601 into the shift register 620. In particular, an input signal is provided to the write input 603 so that values from the end of the AQFP shift register are changed to 0 values and are inputs to the OR gate 610 along with values from the input 601. In the example of FIG. 6, the write input allows new values to input by coupling the write input 603 to coupling inductor 612 such that the write input induces a large negative offset on the feedback loop effectively creating digital '0' data, which is input to the OR gate 610 along with the input data 601. In the write mode, digital values received at the data input 601 are propagated into the shift register 620, replacing any digital values already in the shift register. In the write mode, a signal input to EN_DAC input 625 is set to 0 (e.g., off) so that no data is sent to the output 650 through the AND gate 630. In the example of FIG. 6, the shift register 620 is operated in a three-phase clocking configuration so that there are three AQFP circuits 500 for each digital value being stored in the shift register. For instance, a shift register configured to store a 3-bit value data would comprise nine AQFP circuits. Other multi-phase clocking configurations are also possible, however.

Subsequent to writing data into the shift register 620, the reset input 603 and the data input 601 are turned off, causing the data values in the shift register to circulate around the loop repeatedly each clock cycle.

In a read mode, the reset input 603 and the data input 601 are turned off, and the EN_DAC input 625 is activated, causing the digital values in the shift register to be sent to the output 650.

According to some embodiments, the DACs and/or tunable couplers of the single-qubit gate controller shown in FIG. 4A may each comprise one or more AQFP components arranged to form a quantum flux latch circuit (e.g., a quantum flux parametron latch (QFPL) circuit). A DAC and a tunable coupler may each comprise any number of such quantum flux latch circuits, examples of which are described with reference to FIGS. 7A-7C.

FIG. 7A depicts illustrative QFPL circuit 700, according to some embodiments. QFPL circuit 700 comprises AQFP circuits 710 and 711 (both examples of circuit 500 described above) whose outputs are combined and input into storage gate 720, shown in more detail in FIG. 7B. In operation, the QFPL circuit 700 can maintain a persistent output current level, depending on the state of the storage gate 720, when a DC flux bias is provided to either input BL or BR. When the inputs A and B represent different bit values (e.g., 0 and 1, or 1 and 0), the currents output from the AQFP circuits 710 and 711 cancel each other out, thereby not changing the state of the storage gate 720. When the inputs A and B represent the same bit value, however, a sufficiently large current is output which switches the state of the storage gate. In particular, when the inputs A and B both represent input values of 1, their combined currents are large and positive, whereas when the inputs A and B both represent input values of 0, their combined currents are large and negative. In each case, the storage gate 720 outputs a matching current signal to the output of the QFPL circuit 700. If, subsequently, the inputs A and B are different once again, this has the effect of holding the state of the storage gate in its present configuration (e.g., producing a large positive or large negative current output).

This behavior is shown in FIG. 7C, which depicts the amplitude of an output from the QFPL circuit 700 over time as the inputs A and B are changed. At time t=0, both A and B are 1, consequently, the output is a large positive value. For the next few nanoseconds, the inputs A and B may be different, resulting in the high positive output current being held, until the inputs A and B are both 0, producing an output with a large negative value, etc.

The QFPL circuit 700 may thereby be operated as a DAC by suitably transforming digital input values into corresponding inputs A and B and thereby generating an analog current signal that is high or low according to a digital input value. For instance, the output signal shown in FIG. 7C may be produced to correspond to a digital signal 111110011110011111111 with the positive amplitudes representing each 1 and the negative amplitudes representing each 0. Each bit in this digital signal can be converted into suitable inputs at A and B that will produce this behavior.

In some embodiments, two instances of QFPL circuit 700 may be combined to produce a circuit that can output a current signal at one of three different current levels, including a zero current. Such a circuit may be desirable to operate as a DAC that can output a zero current signal (e.g., for a digital 0 input) or a positive or negative current signal (e.g., for a digital 1 input). Additionally, or alternatively, such a circuit may be desirable to operate as a DAC where the output currents can be selected to be negative or positive, or zero, based on the input (e.g., a digital input of 1 could produce a high positive current output or a high negative positive current output, whereas a digital input of 0 could produce zero current output).

In particular, two instances of QFPL circuit 700 may be arranged with their outputs coupled together into a common output line as shown in FIG. 8A, according to some embodiments. This configuration may be referred to herein as dual-storage QFPL (DS-QFPL). As shown by the truth table in FIG. 8B, a zero output current is output from circuit 800 when one QFPL circuit 700 produces a positive output (in response to digital inputs of 1 and 1) and the other QFPL circuit 700 produces a negative output (in response to digital inputs of 0 and 0). FIG. 8C depicts an illustrative output current profile for circuit 800 shown in FIG. 8A, according to some embodiments.

FIG. 9 depicts an illustrative example of utilizing circuit 800 as the DAC 430 of the single-qubit gate controller 400 shown in FIG. 4A, according to some embodiments. In the example of FIG. 9, the DAC 430 is implemented as circuit 800 and receives digital inputs A1, B1, A2 and B2. The digital input values provided to these inputs may be generated from a single digital value using a suitable combination of Boolean logic gates (e.g., AQFP logic gates) so that the output of the DAC 430 matches the digital value being input (e.g., high when the digital input is 1, and zero when the digital input is 0). In some embodiments, the logic gates may be configured so that a suitable input value may be provided to one or more of these logic gates to switch the output of the DAC 430 between a high positive current and a high negative current (e.g., generate inputs of 1, 1, 1, 1 to the circuit 800 or generate inputs of 0, 0, 0, 0 to the circuit 800 depending on a control bit value). As a result, the DAC 430 may be operated to produce positive current signals based on input digital values, or to produce negative current values based on input digital signal, depending on a suitable control value.

The tunable coupler 440 in the example of FIG. 9 is implemented with a superconducting loop comprising two Josephson junctions $J_1$ and $J_2$. In operation, the DC amplitude control signal 445 induces a DC magnetic flux 946 threading the superconducting loop comprising the two Josephson junctions $J_1$ and $J_2$ and the inductors $L_1$ and $L_2$, which modifies the effective load inductance of the superconducting loop, which in turn adjusts the amount of current flowing into the output inductor $L_{cout}$. As a result, the tunable coupler 440 will produce a current signal at output 910 that is scaled relative to the current signal at the input 905 based on the amplitude control signal 445.

Returning to the single-qubit gate controller 400 shown in FIG. 4A, in some embodiments the qubit control signal 450 may be generated as a baseband pulse sequence. In particular, qubits may be controlled using baseband pulse sequences having a fixed duration and which are synchronized with the clock signal shared by the qubits (also referred to herein as a "common" clock signal). For instance, the common clock signal may have a rate of 50 MHz and the baseband pulse sequences applied to qubits may each have a duration of 20 ns (that is, the length of one clock cycle). Equivalently, the common clock signal may have a rate of 5 GHz and the baseband pulse sequences are each applied to qubits over a period of 100 clock cycles. In either case, the baseband pulse sequences may be temporally aligned according to the common clock signal, such as with each baseband pulse sequence being applied over the duration of one clock cycle, or some other fixed number of clock cycles. Any number of qubits may be controlled in this manner using the same common cycle. For instance, each of the qubit controllers 130, 131, 132, etc. in system 100 shown in FIG. 1A may be configured to generate a baseband pulse sequence to control their respective qubits 140, 141, 142, etc. in each clock cycle. Applying the baseband pulse sequences to the qubits in this manner may have greatly simplified timing requirements compared with conventional approaches that may require adjusting gate lengths or clock frequencies for qubits with different frequencies, and/or which finely tune pulse start times down to the picosecond level using a very high-frequency clock.

FIG. 10 depicts an illustrative baseband pulse sequence, according to some embodiments. To further describe the structure of the baseband pulse sequences that may be utilized by the techniques described herein, FIG. 10 depicts a baseband pulse sequence 1000, which includes five distinct non-overlapping durations 1001, 1002, 1003, 1004 and 1005, and which occur during the period 1006 of the baseband pulse sequence. Time period 1001, also referred to herein as $t_{start}$, is an initial period before a first pulse having amplitude 1010, also referred to herein as A. The first pulse occurs during time period 1002, also referred to herein as $t_{pulse}$. Time period 1003, also referred to herein as $t_{wait}$, occurs between the first pulse and the second, negative, pulse which occurs in time period 1004 and has a negative amplitude 1010 (–A) opposite to that of the first pulse, and which also occurs within a duration $t_{pulse}$. Subsequent to the second pulse is a final time period 1005, also referred to herein as $t_{end}$, up to the end of the baseband pulse sequence 1000.

As described above, baseband pulse sequences such as baseband pulse sequence 1000 may be applied to qubits in synchronization with a common clock signal, which in the example of FIG. 10 has a clock cycle of period 1006, also referred to herein as $t_{cycle}$. As such, the length of $t_{cycle}$ may be fixed at the length of one cycle of the common clock, such that the frequency of the common clock signal$=1/t_{cycle}$. For instance, if the common clock signal has a rate of 50 MHz, the duration of $t_{cycle}$ is 20 ns. In addition, the duration of $t_{cycle}$ may be written as a sum of its constituent time periods, i.e., $t_{cycle}=t_{start}+2\times t_{pulse}+t_{wait}+t_{end}$. In some embodiments, $t_{start}$ and $t_{end}$ may be selected to be equal to one another, or to be approximately equal to one another. The periods $t_{start}$, $t_{wait}$ and $t_{end}$ may be referred to herein as "idle" periods during which the amplitude of the baseband pulse sequence is zero, or approximately zero.

A baseband pulse sequence as shown in FIG. 10 (or a suitable approximation thereof), can be applied to a qubit to perform any desired single-qubit gate. In particular, the lengths of each of the durations within $t_{cycle}$ may be adjusted (while maintaining the total time as $t_{cycle}$) and/or the amplitude A of the two pulses may be adjusted to control various aspects of a single-qubit gate, such as a rotation axis and/or a rotation angle. According to some embodiments, baseband pulse sequences as described herein may perform Landau-Zener gates when applied to a qubit.

References to rotations of the state of a qubit refer to changes in the state of the qubit in the Bloch sphere representation, which is shown in FIG. 11A. In this representation, the computational basis states of the qubit |0> and |1> are poles of a sphere, and the state of the qubit |ψ> is represented by a vector to a point on the surface of the sphere, with points between the poles representing superpositions of the |0> and |1> states. Single-qubit gates may be viewed as rotations on the Bloch sphere, for example the X(π/2) gate performs a rotation of π/2 radians around the X axis.

Returning to the manner in which the parameters of a baseband pulse sequence may control various aspects of the gate, as shown in FIG. 11B, the amplitude 1010 (A) may control the rotation angle θ of a single-qubit gate (although in some cases other aspects of the rotation, such as the rotation axis, may also have a dependence on the amplitude). As shown in FIG. 11C, the duration of time period 1003 ($t_{wait}$) may control the Z-component of the rotation axis of a single-qubit gate. As shown in FIG. 11D, the duration of time periods 1001 ($t_{start}$) and 1005 ($t_{end}$) may control the X-component and Y-component of the rotation axis, respectively, of a single-qubit gate. It may be noted that since $t_{cycle}$ is set by the frequency of the common clock signal, setting values of $t_{wait}$, $t_{start}$ and $t_{end}$ in effect dictates the duration of $t_{pulse}$.

FIG. 12A depicts an illustrative approach for generating a digital baseband pulse sequence from digital values stored in memory registers, according to some embodiments. In the example of FIG. 12A, a qubit control signal waveform 1201 is generated with a duration of 10 nanoseconds (ns) by amplitude-scaling and combining four primitive digital pulse sequences 1211, 1212, 1213 and 1214. This process may be performed by, for instance, the single-qubit gate controller 400 shown in FIG. 4A or 4B. For instance, memory registers including memory registers 410, 411, etc. may store the digital values 1211, 1212, 1213 and 1214 and may generate the waveform 1201 by supplying the digital values stored in the memory registers to respective DACs 430, 431, etc., amplitude-scaling the current signals produced by the DACs using tunable couplers 440, 441, etc. and combining the amplitude-scaled current signals using combiner 490 to produce the qubit control signal waveform 1201.

In the example of FIG. 12A, the duration of $t_{cycle}$ is 10 ns, representing a single clock cycle of a common clock signal with frequency 100 MHz. The waveform 1201 is built from 10 digital values sampled at a frequency of 1 GHZ, and the digital values are determined by amplitude-scaling the digital pulse sequences 1211-1214.

In the example of FIG. 12A, the first two primitive digital pulse sequences 1211 and 1212, also labeled y1(t) and y2(t), control the timing of the first pulse in waveform 1201, and are amplitude-scaled and combined to form the positive amplitude pulse in the baseband pulse sequence. As shown in FIG. 12A, the digital pulse sequences 1211-1214 are structured as square-waves with digital values of 1 at two time points, and with digital values of 0 at other time points. Advantageously, since the digital pulse sequences 1211-1214 are time-shifted versions of the same digital waveform in the example of FIG. 12A, only a single digital primitive need be stored in memory if desired, and this single primitive digital pulse sequence can be time-shifted to produce the set of primitive digital pulse sequences 1211-1214, such as using the approach shown in FIG. 4B.

In the example of FIG. 12A, the waveform 1201 is generated from the primitive digital pulse sequences 1211-1214 by scaling each of the primitive digital pulse sequences according to respective amplitudes $A_1=0.3$, $A_2=0.7$, $A_3=-0.7$ and $A_4=-0.3$. For instance, the digital value 1221 is generated from the first digital value of the primitive digital pulse sequence 1211 scaled by the amplitude $A_1=0.3$, thereby producing a digital value of 0.3; and the digital value 1222 is generated from the second digital value of the primitive digital pulse sequence 1211 scaled by the amplitude $A_1=0.3$, added to the first digital value of the primitive digital pulse sequence 1212 scaled by the amplitude $A_2=0.7$, thereby producing a digital value of 1.0. As such, the overall amplitude of the first pulse is the sum of amplitudes $A_1$ and $A_2$, and similarly, the overall amplitude of the second pulse is the sum of amplitudes $A_3$ and $A_4$.

FIG. 12B depicts an illustrative implementation of single-qubit gate controller 400 shown in FIG. 4B in the context of the illustrative qubit control signal waveform 1201 shown in FIG. 12A, according to some embodiments. In particular, a qubit control signal waveform 1201 is generated from digital values stored in the memory registers 1231 and 1232, by generating time shifted copies of these digital values with time shifters 1235 and 1236, thereby producing four sets of digital values, which are each converted to analog signals via DACs 1246, 1247, 1248 and 1249, and tunable couplers 1251, 1252, 1253 and 1254. Each pair of DAC and tunable coupler (e.g., DAC 1246 and tunable coupler 1251) may in some embodiments be implemented as shown in FIG. 9. Each of the tunable couplers separately receives amplitude control signals 1295, 1296, 1297 or 1298 that each dictates how the respective tunable coupler scales the analog signal received from its respective DAC. Signals from the tunable couplers 1251, 1252, 1253 and 1254 are provided to combiner 1290, which may be implemented as described above in relation to combiner 490.

It will be appreciated that, in operation, the digital values may flow through the illustrative single-qubit gate controller 1230 according to a clock signal. For instance, a digital value may be output from the memory registers 1231 and 1232 and flow through the remaining components to produce a current signal with a particular value at the output during each clock cycle. As such, the depiction in FIG. 12B should be understood to convey the state of each component at each time step during the clock cycle.

FIG. 13 depicts an illustrative two-qubit gate controller, according to some embodiments. Single-qubit gate controller 1300 is an illustrative example of a portion of a qubit controller 130, 131, 132, etc. of system 100 shown in FIG. 1A, and of two-qubit gate controller 1300 shown in FIG. 1C. The two-qubit gate controller 1300 may be operated by system 100 to generate a control signal that is directed onto a qubit (e.g., by qubit controller 130 onto qubit 140) and/or onto a coupler (e.g., by qubit controller 130 onto coupler 145) to perform a two-qubit gate. For instance, controller 1300 may be operated by system 100 to perform a gate on the qubit such as a CZ gate, a CZ/2 gate (i.e. a CPhase gate with a 90-degree conditional phase shift), a CNOT gate, etc. For example, a CZ-like gate can be implemented by applying a sequence of gates: a CZ/2 gate, $\pi$ pulses (e.g., $X(\pi)$ or $Y(\pi)$) on both qubits, followed by another CZ/2 gate. This sequence echoes out unwanted single-qubit phases accumulated during the two-qubit gate operation. According to some embodiments, the two-qubit gate controller 1300 may be implemented at least in part with superconducting digital logic.

In some embodiments, the two-qubit gate controller 1300 may be configured to perform one particular two-qubit gate, with another instance of two-qubit gate controller 1300 included within the qubit controller 130 to perform a different two-qubit gate. The different instances of two-qubit gate controller 1300 may be operated based on the output of the decoder produced from the digital bitstream of signal line 110. Any desired number of instances of two-qubit gate controller 1300 may be provided in the qubit controller 130, depending on the number of different two-qubit gates that the system is configured to perform.

In the example of FIG. 13, two-qubit gate controller 1300 comprises memory register 1310, enable circuit 1320, mixer 1330, and tunable coupler 1340, which together produce a qubit control signal 1350. In the example of FIG. 13, the qubit control signal is a microwave pulse generated from a microwave drive 1335 by operating the mixer 1330 in accordance with digital values stored by the memory register 1310. In some embodiments, the generated microwave pulse is provided to a charge line coupled to a qubit-qubit coupler (e.g., coupler 145), and which selectively drives a level transition from a computational state to a non-computational state (e.g., between the qubit-qubit-coupler state |000> and the state |001> as described above in relation to FIGS. 2A-2C), inducing a conditional phase shift on the qubits. Therefore, the pulse can enact a controlled-phase (CPhase) gate, where the amount of conditional phase is controlled by adjusting the frequency and/or amplitude of the pulse. Two-qubit gates such as CZ and CZ/2 can be implemented by choosing the appropriate phase.

In some embodiments, the mixer 1330 may be configured as a switch that modulates the microwave drive 1335 based on digital values provided from the memory register. In operation, two-qubit gate controller 1300 receives an operation enable signal 1305 from a decoder (e.g., in the example of system 100, the two-qubit gate controller 1300 within qubit controller 130 receives the enable signal from decoder 120). The enable signal 1305 is supplied to the enable circuit 1320 which causes the memory register 1310 to output digital values. In the example of FIG. 13, the memory register 1310 is configured to store information describing a pulse, such as when to apply the pulse (or part thereof) and its duration. In some embodiments, memory register 1310 may be implemented as memory register 600 shown in FIG. 6 and described above. In some embodiments, the memory register 1310 may be omitted if the mixer requires only a single digital value to control whether the qubit control signal pulse is being generated or not. In some embodiments, the memory register 1310 is configured to store a plurality of digital values that represent a microwave signal. For instance, the memory register 1310 is configured to store a plurality of digital values representing a digital pulse train that mimics a microwave signal with a frequency $f_{mod}$, such that the frequency of the qubit control signal 1350 can be either the frequency of the microwave 1335 plus $f_{mod}$ (frequency up-conversion) or the frequency of the micro-wave 1335 minus $f_{mod}$ (frequency down-conversion).

In some embodiments, the qubit control signal 1350 is directed to a coupler that is coupled to two qubits (e.g., coupler 145 shown in FIG. 1B), which may for instance be implemented as the illustrative coupler 200 shown in FIG. 2A. The qubit control signal 1350 may, when applied to a coupler in this way, drive a level transition from a computational state to a non-computational state (e.g., between the qubit-qubit-coupler state |000> and the state |001> as described above in relation to FIGS. 2A-2C), inducing a conditional phase shift on the two qubits. The amplitude, frequency, shape, and duration of the qubit control signal 1350 may be selected to optimize the performance of a selected two-qubit gate on each qubit pair. In some embodiments, the qubit control signal 1350 may be applied to the coupler in conjunction with a flux bias signal that is applied to the coupler. For instance, a baseband flux pulse may be applied to the coupler to change its flux bias, thereby changing the coupler frequency while the qubit control signal 1350 is applied. The baseband flux pulse applied to the coupler can be using any of the various techniques described herein (e.g., techniques to generate and apply the (X- or Z-) flux pulse generation described in relation to FIG. 15, and/or the single-qubit flux pulse described in relation to FIGS. 4A and 4B), thereby producing a baseband flux pulse with controllable pulse timing, duration, shape, and amplitude.

FIG. 14 depicts an illustrative implementation of a mixer suitable for modulating a microwave drive according to digital values, according to some embodiments. Mixer 1400 is provided as one illustrative way to implement mixer 1330 in two-qubit gate controller 1300. In the example of FIG. 14, the mixer 1400 comprises two AQFP circuits 500, labeled AQFP A and AQFP B in FIG. 14. AQFP A is configured to receive digital values from the memory register 1310, whereas AQFP B has a fixed DC bias input (e.g., a positive DC bias). In each clock cycle, both AQFP circuits output a pulse. Since AQFP B is constantly biased, it always produces a positive pulse. If the digital input to AQFP A from the memory register 1310 is a digital 1, the output pulses from the AQFP circuits constructively interfere. The resulting signal is passed through a band pass filter 1450 to exclude frequency components not at (or close to) the clock frequency. On the other hand, if the digital input to AQFP A from the memory register 1310 is a digital 0, the output pulses from the AQFP circuits destructively interfere and the mixer 1400 produces no output. As shown in FIG. 14, the microwave drive 1335 (also labeled ILO) is input to the circuit 1400, in addition to a baseband signal 1410 (also labeled IBB), which controls the pulse envelope shape of the microwave signal produced.

FIG. 15 depicts an illustrative readout controller, according to some embodiments. Readout controller 1500 is an illustrative example of a portion of a qubit controller 130, 131, 132, etc. of system 100 shown in FIG. 1A, and of readout controller 1500 shown in FIG. 1C. The readout controller 1500 may be operated by system 100 to generate a control signal that is directed onto a qubit (e.g., by qubit controller 130 onto qubit 140) to read the state of a qubit. In the example of FIG. 15, the readout controller 1500 is configured to generate a control signal that is directed onto a qubit transducer, which is a component of a qubit arranged so that a suitable control signal directed onto the qubit transducer will generate a current signal representative of the qubit's state, which can be amplified and read out at room temperature. According to some embodiments, the readout controller 1500 may be implemented at least in part with superconducting digital logic.

In the example of FIG. 15, readout controller 1500 comprises memory registers 1510, 1511, 1512 and 1513, enable circuits 1520, 1521, 1522 and 1523, mixer 1530, pulse generators 1531 and 1532, and tunable couplers 1540, 1541 and 1542. These components together generate four separate signals (which for the purposes of this disclosure may be viewed collectively as a "control signal") that are directed onto a qubit transducer 1550.

In operation, readout controller 1500 receives an operation enable signal 1505 from a decoder (e.g., in the example of system 100, the readout controller 1500 within qubit controller 130 receives the enable signal from decoder 120). The enable signal 1505 is supplied to the enable circuits 1520, 1521, 1522 and 1523 which causes the memory registers 1510, 1511, 1512 and 1513 to output digital values. In the example of FIG. 15, the memory registers 1510, 1511, 1512 and 1513 are configured to store information describing at least part of a pulse, such as when to apply the pulse (or part thereof) and its duration.

In the example of FIG. 15, the qubit control signal is a microwave pulse generated from a microwave drive 1535 by operating the mixer 1530 in accordance with digital values stored by the memory register 1510. In some embodiments, the mixer 1530 may be configured as a switch that modulates the microwave drive 1535 based on digital values provided from the memory register. For example, the mixer 1530 may be implemented as mixer 1400 shown in FIG. 14.

In operation, the readout controller 1500 receives an operation enable signal 1505 from a decoder (e.g., in the example of system 100, the two-qubit gate controller 1300 within qubit controller 130 receives the enable signal from decoder 120). The enable signal 1505 is supplied to each of the enable circuits 1520, 1521, 1522 and 1523. The enable signal causes the memory register 1510 to output digital values to the mixer 1530, the memory register 1511 to output digital values to the pulse generator 1531, the memory register 1512 to output digital values to the pulse generator 1532, and the memory register 1513 to output a digital signal to the qubit transducer 1550. The signals produced by the pulse generators 1531 and 1532 are amplitude-adjusted by tunable couplers 1541 and 1542, respectively, according to amplitude control signals 1546 and 1547, respectively. In the example of FIG. 15, the memory registers 1510, 1511, 1512 and 1513 are each configured to store information describing a pulse, such as when to apply the pulse (or part thereof) and its duration. In some embodiments, any one or more of memory registers 1510, 1511, 1512 and 1513 may be implemented as memory register 600 shown in FIG. 6 and described above.

In the example of FIG. 15, the qubit transducer 1550 is a flux qubit coupled to the superconducting qubit and the combination of memory register 1510, enable circuit 1520, mixer 1530 and tunable coupler 1540 are configured to generate microwave signals (e.g., microwave pulses) that are applied to the flux qubit transducer and which drive a level transition of the flux qubit. As described further below, by tuning the flux bias of a flux qubit transducer and subsequently directing the microwave pulse 1560 onto the flux qubit to drive a level transition, the quantum state of a superconducting qubit coupled to the flux qubit transducer may be mapped onto a state of the transducer. The microwave pulse 1560 may be configured to drive such a transition by applying a microwave pulse that stimulates Rabi oscillations between two energy levels having a transition frequency that corresponds to the frequency of the microwave pulse (or which is detuned therefrom). In some embodiments, the microwave pulse 1560 is configured to drive the flux qubit transducer (and optionally one or more other such flux qubits) by directing a microwave pulse through one or more drive lines that are capacitively coupled to the flux qubit.

In the example of FIG. 15, the qubit transducer 1550 is a flux qubit, and readout controller 1500 is configured to control the magnitude of a magnetic flux threaded through the flux qubit transducer. In particular, the flux pulses 1561 and 1562 may be configured to control an external magnetic flux threaded through a superconducting loop that is part of the qubit transducer. In some embodiments, a baseline DC current signal may be applied to the qubit transducer that is fixed, and the flux pulses 1561 and 1562 represent time-dependent current signals that modulate the baseline DC current signal. For instance, system 100 may comprise an antenna that is mutually inductively coupled to a superconducting loop of the qubit transducer, and a current signal may be provided to this antenna to adjust the magnetic flux threaded through the superconducting loop of the qubit transducer. According to some embodiments, controlling the flux bias of the qubit transducer by the readout controller 1500 comprises directing a flux bias signal (e.g., a current signal) along a flux bias line that is inductively coupled to a superconducting loop of the qubit transducer (e.g., inductively coupled via an antenna).

In some embodiments, the qubit transducer comprises two distinct superconducting loops with a flux bias being threaded through each of these loops, and the flux pulses 1561 and 1562 are each directed to modulate the flux bias through one of these two superconducting loops. An example of this approach in which the qubit transducer is a capacitively shunted flux qubit (CSFQ) is described below in relation to FIG. 18.

In the example of FIG. 15, the readout enable signal 1563 is configured to provide an enable signal to the readout electronics coupled to the qubit transducer and which causes the readout electronics to read a signal from the qubit transducer or components coupled thereto. The readout enable signal may be a digital signal produced from the memory register 1513, and readout controller 1500 configured to direct the readout enable signa 1563 to one or more superconducting digital logic components as a trigger, thereby causing the components to provide a signal indicative of the state of the qubit to room temperature electronics.

According to some embodiments, either or both of the pulse generators 1531 and 1532 may be implemented as pulse generator 1600 shown in FIG. 16, according to some embodiments. In the example of FIG. 16, pulse generator 1600 comprises a plurality of AQFP circuits 500 and is coupled to a tunable coupler 1650, which receives an amplitude control signal 1645. The tunable coupler 1650 may be one implementation of the tunable couplers 1541 and 1542, for example, and is configured to modulate the amplitude of a signal received from the pulse generator and to produce an amplitude-adjusted signal at its output based on the signal received from the pulse generator 1660.

In the example of FIG. 16, an input 1601 to the pulse generator 1600 is used to generate four output signals via the AQFP fan-out component 1610, each of which is further used to generate four output signals via the AQFP fan-out component 1611, thereby producing 16 signals that are copies of input 1601, and which are input to sixteen AQFP circuits 1612. The AQFP circuits 1612 are all coupled to a common output 1602 of the pulse generator, which receives a pulse with amplitude equal to the sum of the outputs of all sixteen AQFP circuits 1612. The output 1602 is thereby amplitude adjusted by a factor of sixteen compared with input 1601.

Returning to FIG. 15, as mentioned above, when the qubit transducer 1550 is a flux qubit, the flux bias of the flux qubit may be controlled by the flux pulses 1561 and 1562 to bring a frequency corresponding to a level transition of the flux qubit in, or out of, resonance with a transition frequency of a level transition of the qubit to which the qubit transducer is coupled. For example, in system 100 the qubit 140 may be a superconducting qubit and coupled to a flux qubit transducer, to which flux pulses may be directed as control signals (in addition to the microwave pulse 1560) to perform readout operations. When the flux qubit transducer is flux biased so that the transitions are resonant with one another (or sufficiently close to resonant to induce the desired effect, described below), the level transition of the flux qubit may be driven by the microwave pulse 1560, which conditionally excites the flux qubit according to the state of the superconducting qubit coupled to the flux qubit transducer. States of the flux qubit transducer and superconducting qubit associated with this process are illustrated by the energy level diagrams shown in FIGS. 17A-17B, according to some embodiments.

In the example of FIGS. 17A-17B, the states |0> and |1> of a flux qubit used as qubit transducer 1550 are considered, along with the states |0>, |1> and |2> of a superconducting qubit (e.g., qubit 140) that is coupled to the qubit transducer 1550 via a suitable coupler. The state of the combined flux qubit and superconducting qubit system is written in FIGS. 17A-17B as |F, Q> where |F> is the state of the flux qubit, and |Q> is the state of the superconducting qubit. Each of the energy levels in FIGS. 17A-17B therefore represents an energy level associated with a pair of the states of the flux qubit and the superconducting qubit.

Two different configurations of the flux qubit and superconducting qubit are depicted in FIG. 17A and in FIG. 17B. In the example of FIG. 17A, the flux qubit is flux biased so that the transition frequency $\omega_{01}$ of the transition between its |0> and |1> states is detuned from each of the transition frequencies associated with the |0>↔|1> and |1>↔|2> transitions of the superconducting qubit. In this configuration, the difference in energy $\omega_{01}$ between the |0,0> and |0,1> states is the same as the difference in energy $\omega_{01}$ between the |1,0> and |1,1> states. That is, the same frequency stimulates a transition of the flux qubit between its |0> and |1> states, irrespective of whether the superconducting qubit is in its |0> or |1> state. In this configuration, the superconducting qubit may be driven independently of the flux qubit transducer, such as to perform a quantum circuit in which the state of the superconducting qubit is manipulated by a qubit controller (e.g., qubit controller 130).

To readout the quantum state of the superconducting qubit, the readout controller 1500 is operated to flux bias the flux qubit transducer so that the transition between its |0> or |1> state is resonant, or close to resonant, with the transition between the |1> and |2> states of the superconducting qubit. When these two transitions are sufficiently resonant, the same drive frequency would in principle drive the transition |0>↔|1> of the flux qubit as well as drive the |1>↔|2> transition of the superconducting qubit. Writing this in the notation of FIGS. 17A and 17B, this means that transitions can be driven between the |0,2> and |1,1> states with a resonant drive frequency. Due to the phenomenon of level repulsion, however, this resonance causes the |0,2> and |1,1> states to change in energy, as shown by the dotted lines and arrows in FIG. 17B. In particular, the |1,1> state increases to a higher energy, while the |0,2> state decreases to a lower energy. As a result of this level repulsion, it is no longer true that the difference in energy $\omega_{01}$ between the |0,0> and |0,1> states is the same as the difference in energy $\omega_{01}$ between the |1,0> and |1,1> states. It may be noted that in some cases, the level repulsion might cause the |0,2> state to increase to a higher energy and the |1,1> state to decrease to a lower energy; in either case, the resulting energy levels allows for conditional driving of the flux qubit as described below.

The above process thereby allows conditional driving of the flux qubit transducer, which effectively maps the state of the superconducting qubit onto the state of the transducer. In particular, by driving the flux qubit transducer with a microwave pulse 1560 that is resonant with the |0,1> to |1,1> transition, this will cause the flux qubit transducer to be excited to the |1> state only if the superconducting qubit is in its |1> state. Since the |0,0> to |1,0> transition now has a different transition frequency, that transition is not stimulated by this microwave pulse. The result of this process is that the microwave pulse 1560 applied to the flux qubit transducer once it is flux biased as described above will produce a |1> state in the flux qubit when the superconducting qubit is in its |1> state, and will produce a |0> state in the flux qubit when the superconducting qubit is in its |0> state, effectively mapping the superconducting qubit state onto the flux qubit transducer state. Since the flux qubit transducer's state represents a persistent current in either the clockwise or counterclockwise direction, by measuring the direction of the current in the flux qubit transducer, its state may be measured. In some embodiments, during or before the measurement, the flux qubit transducer's X and Z flux biases may be changed to a point where the persistent current is maximized, enabling high-fidelity (or high signal-to-noise ratio) measurement. This flux bias change can be performed by applying the flux pulses 1561 and 1562.

An illustrative implementation of a qubit transducer 1550 with a readout circuit 1800 and superconducting qubit 1820 is shown in FIG. 18, according to some embodiments. In the example of FIG. 18, a qubit transducer 1550 is implemented as a capacitively shunted flux qubit (CSFQ), which is coupled to a superconducting qubit implemented as a fluxonium qubit 1820 via a capacitor 1815.

In the example of FIG. 18, the flux qubit transducer 1550 comprises a superconducting loop with a capacitor 1818 in parallel with: i) a pair of Josephson junctions 1816 and 1817 and (ii) Josephson junctions 1811 and 1812, themselves arranged in parallel with one another. Magnetic flux bias 1813 (referred to as X flux bias in FIG. 15) is threaded through the superconducting loop that includes the Josephson junctions 1811 and 1812, and a second magnetic flux bias 1814 (referred to as Z flux bias in FIG. 15) is threaded through the larger superconducting loop as shown. Each of magnetic flux bias 1813 and magnetic flux bias 1814 may be independently controlled by the flux pulses 1561 and 1562 generated by the readout controller 1500, which generate a flux bias signal in flux bias lines that are each inductively coupled one of the two superconducting loops, as described above. In addition, the flux qubit transducer 1550 may be driven by the microwave pulse 1560 generated by the readout controller 1500, which generates a microwave signal in drive lines that are capacitively coupled to the flux qubit transducer 1550.

In the example of FIG. 18, the fluxonium qubit 1820 comprises a superconducting loop with a capacitor 1821, a Josephson junction 1822, and an inductor 1823 arranged in parallel with one another. A flux bias 1825 is threaded through the superconducting loop, and may be independently controlled by a suitable controller (e.g., single-qubit controller 400 and/or flux bias controller 2240, described below) which generates a flux bias signal in flux bias lines that are inductively coupled to each loop, as described above.

In the example of FIG. 18, the flux qubit transducer 1550 is coupled to an AQFP circuit 1800, which is configured to perform a flux-based readout of the flux qubit transducer 1550, and to produce a digital readout signal indicative of the state of the flux qubit transducer. The AQFP circuit 1800 includes Josephson junctions 1801 and 1804, and inductors 1802 and 1803.

FIG. 19 depicts an illustrative system of readout electronics that may be included in system 100 shown in FIG. 1A, according to some embodiments. System 1900 may include a plurality of instances of the qubit transducer 1550 and respective associated digital readout circuits, which are shown in FIG. 19 as qubit transducer and digital readout circuits 1950. For instance, each of qubit transducer and digital readout circuits 1950 may be implemented by the flux qubit transducer 1550 and the AQFP circuit 1800 both shown in FIG. 18. In the example of FIG. 19, the qubit transducer and digital readout circuits 1950 are each coupled to a respective transformer circuit 1910, which increases the amplitude of the current signal produced by each circuit 1950. In some embodiments, the transformer circuit 1910 may comprise a flux qubit, which has a higher persistent current than the qubit transducer, and/or an AQFP circuit with high-critical-current Josephson junctions, to amplify the current signal.

In the example of FIG. 19, the amplitude-increased signals are provided to comparators 1915 which produce a digital output based on whether the input signal is positive or negative. For example the comparators 1915 may produce a digital 1 when the input signal is positive, and a digital 0 when the input signal is negative (or vice versa). In some embodiments, the comparators generate a digital AQFP signal.

In the example of FIG. 19, the digital output from the comparators 1915 is input into an AQFP serializer comprising AQFP AND gates 1918. The readout enable signal 1563, described above, when activated, causes the serializer to effectively read out signals from each of the qubit transducer and digital readout circuits at the same time. The serializer thereby produces a digital bitstream which is amplified by cryogenic amplifier 1920, and which converts the AQFP signal into an amplified unipolar signal that can be further amplified by room temperature electronics 1930 for measurement and observation.

In the example of FIG. 19, the AQFP serializer 1918 may be operated as follows. First, the readout enable signal 1563 may be activated for an initial clock cycle (in this description, a three-phase clocking scheme is assumed, although implementing this approach using other clocking schemes may readily be envisioned). This causes the outputs of the comparators 1915 to be directed into the serializer chain. In FIG. 19, the components of the serializer 1918 are labeled with P1, P2 or P3, depending in which of the three phases of the clock cycle they are activated. Due to this scheme, in a single three-phase clock cycle, a digital value will pass through the next P1, P2 and P3 components in the serializer. In an initial clock cycle when the readout enable signal 1563 is activated, for example, the output of the lowermost comparator shown in FIG. 19 will flow to buffer 1921. In the same clock cycle, the output of the middle comparator shown in FIG. 19 will flow to buffer 1922, and the output of the uppermost comparator shown in FIG. 19 will flow to buffer 1923. In the next clock cycle (during which the readout enable signal may be deactivated), the digital value in buffer 1921 may be output to the cryogenic amplifier 1920, the digital value in buffer 1922 may be directed to buffer 1921, and the digital value in buffer 1923 may be directed to buffer 1922. This process may continue over a plurality of clock cycles until all the different digital bits produced by the qubit transducer and digital readout circuits 1950 are transmitted to the cryogenic amplifier in a serial data stream.

FIG. 20 depicts an illustrative leakage reduction controller, according to some embodiments. Leakage reduction controller 2000 is an illustrative example of a portion of a qubit controller 130, 131, 132, etc. of system 100 shown in FIG. 1A, and of leakage reduction controller 2000 shown in FIG. 1C. The leakage reduction controller 2000 may be operated by system 100 to generate a control signal that is directed onto a qubit (e.g., by qubit controller 130 onto qubit 140) and/or onto a coupler (e.g., by qubit controller 130 onto coupler 145) to perform a leakage control operation. For instance, leakage reduction controller 2000 may be operated by system 100 to direct the qubit control signal 2050 onto the coupler 145 to perform a leakage control operation. According to some embodiments, the leakage reduction controller 2000 may be implemented at least in part with superconducting digital logic.

In some embodiments, the leakage reduction controller 2000 may be configured to perform one particular leakage reduction operation, with another instance of leakage reduction controller 2000 included within the qubit controller 130 to perform a different leakage reduction operation. The different instances of leakage reduction controller 2000 may be operated based on the output of the decoder produced from the digital bitstream of signal line 110. Any desired number of instances of leakage reduction controller 2000 may be provided in the qubit controller 130, depending on the number of different leakage reduction operations that the system is configured to perform.

In the example of FIG. 20, leakage reduction controller 2000 comprises memory registers 2010 and 2011, enable circuits 2020 and 2021, pulse generators 2030 and 2031, and tunable couplers 2040 and 2041. The tunable couplers 2040 and 2041 are configured to adjust the amplitude of signals received from pulse generators 2030 and 2031, respectively, according to amplitude control signals 2045 and 2046, respectively. The memory registers 2010 and 2011 may for instance be implemented as memory register 600 shown in FIG. 6 and described above, and the pulse generators 2030 and 2031 may for instance be implemented as pulse generator pulse generator 1600 shown in FIG. 16, according to some embodiments.

In operation, leakage reduction controller 2000 receives an operation enable signal 2005 from a decoder (e.g., in the example of system 100, the leakage reduction controller 2000 within qubit controller 130 receives the enable signal from decoder 120). The enable signal 2005 is supplied to the enable circuits 2020 and 2021, which causes the memory registers 2010 and 2011 to output digital values. In the example of FIG. 20, the memory registers 2010 and 2011 are configured to store information describing at least part of a pulse, such as when to apply the pulse (or part thereof) and its duration.

According to some embodiments, the pulse generators 2030 and 2031 are operated at the same frequency but with different duty cycles so that when the qubit control signal components are combined by the combiner 2090, a 3-level staircase waveform is generated. Irrespective of how the qubit control signal 2050 is generated, the leakage reduction controller 2000 is configured to generate the control signal to remove population in unwanted qubit states. For example, a 3-level staircase flux signal can be applied as the qubit control signal 2050 to a coupler to step through three discrete flux values (bias points), changing the coupler's $|0\rangle - |1\rangle$ transition frequency at each step. At the start (the first bias point), the coupler is biased at its idle bias, where the qubit-qubit coupling is effectively off. At the second point, the coupler is resonant with the qubit's $|1\rangle - |2\rangle$ transition, enabling transfer of population from the $|2\rangle$ (leakage) state to the coupler. At the third point, the coupler is brought into or near resonance with a lossy resonator that acts as a dissipative bath, allowing the coupler to dump any absorbed excitation into the bath. Once the leakage population is removed, the coupler returns to its idle bias. This leakage removal technique can be extended by adding more flux levels. For example, to remove leakage from both the $|2\rangle$ and $|3\rangle$ states, the waveform can include additional steps to target each corresponding level transition.

FIG. 21 depicts illustrative demultiplexing and decoding logic, according to some embodiments. Logic 2100 may for instance be implemented as the digital signal line 110 and decoders 120, 121, 122, etc. shown in FIG. 1A. Logic 2100 includes a digital signal line 2110 and decoders 2120 and 2121, and may in general comprise any number of additional decoders as described above in relation to FIG. 1A.

In the example of FIG. 21, in operation the digital signal line 2110 receives bits at the digital input 2101, which propagate through the AQFP circuits 500 in a top to bottom direction in this illustrative drawing. In the example of FIG. 21, the AQFP circuits 500 are configured with a three-phase clocking scheme so that during each clock cycle of the logic 2100, a digital value propagates through a set of three AQFP circuits. As such, the AQFP circuits 500 in digital signal line 2110 act like a shift register, with the bit values moving downward along the chain of AQFP circuits in each clock cycle of the digital signal line (which may for example be operated at 5 Gbps, or equivalently at 5 GHz).

In the example of FIG. 21, during a selected clock cycle of the digital signal line, a trigger signal 2102 is input to the power/clock inputs of the AQFP circuits of the decoder 2120, which causes these AQFP circuits to output the bit value that they are receiving from their respective chain of three AQFP circuits 500. The selected clock cycle in which the trigger signal is sent may for instance correspond to the beginning of a periodic time period that governs the timing of control operations of qubits. For instance, the qubit control operations may be performed every 25 ns (effectively at a frequency of 40 MHz), whereas the digital signal line 2110 may be operated at a 5 GHz clock frequency so that there are 125 clock cycles of the digital signal line clock during each 25 ns control operation period. The trigger signal 2102 may, in this example, be applied during the last or first of these 125 clock cycles in each 25 ns control operation period.

In the example of FIG. 21, when the trigger signal is provided to the AQFP circuits in the decoders 2120, 2121, etc. this causes the digital bit being output from the neighboring set of three AQFP circuits into the logical components of each decoder. For instance, the last bit provided at the digital input 2101 prior to the trigger signal being provided to the AQFP circuits in the decoders will be input to decoder 2120 at the input labeled S0, the second to last bit input to decoder 2120 at the input labeled S1, etc. The decoders 2120, 2121, etc. in the example of FIG. 21 output a digital 1 at one of the eight outputs labeled Operation 1, 2, etc. depending on the bit values of the three inputs at S0, S1 and S2. For instance, when S0=1, S1=1 and S2=0, the Operation 4 output will produce a digital 1 output, whereas the other seven outputs will produce a digital 0 output. The eight outputs of each decoder may be provided to respective qubit controllers, which may perform an operation corresponding to the indicated digital output from the decoder. The eight output values produced from a decoder in the example of FIG. 21 is an example of a decoded instruction in the context of FIG. 1A.

In some embodiments, each of the eight outputs from decoder 2120 and decoder 2121, etc. is provided as an operation enable signal to a corresponding controller within the qubit controller. For example, one of the outputs from each decoder may be provided to the single-qubit gate controller 400 as operation enable signal 405, another output may be provided to the two-qubit gate controller 1300 as operation enable signal 1305, etc.

It will be appreciated that there are other ways to implement the decoders and digital input line shown in FIG. 21 and that this example is provided as one illustrative approach. For example, the logical flow of the decoders and the types of output produced from the decoders may be configured in many ways so long as a qubit controller coupled to the decoder is configured to perform an appropriate control operation based on one or more output values from the decoder.

As described above, the techniques described herein include operating a superconducting data distribution circuit to load digital values into programmable components of a qubit controller. FIG. 22 depicts an illustrative system suitable for loading digital values in this manner, according to some embodiments. System 2200 comprises a digital distribution circuit 2220 which receives a digital signal 2210 and demultiplexes the data from the digital signal to a number of programmable components which are described above.

In particular, in the example of FIG. 22 the digital distribution circuit 2220 demultiplexes data and provides data to the memory registers 410, 1310, 1510 and 2010 described above. Any of these memory registers that are implemented as shown in FIG. 6, for example, would in system 2200 receive data from the digital distribution circuit 2220 at their respective input 601. As described above, memory registers may be implemented to retain data value, such as in the case of the memory register shown in FIG. 6 which circulates digital data around an AQFP shift register. In this manner or otherwise, the digital distribution circuit 2220 preprograms the memory registers of system 2200.

In addition, in the example of FIG. 22 the digital distribution circuit 2220 provides digital data to a DC DAC 2230, which is configured to receive digital values and produce an analog signal corresponding to the received digital values. In some embodiments, the DC DAC 2230 may hold the digital values provided to the DC DAC (e.g., in a latch) and continuously output an analog signal corresponding to the input digital values to various programmable components of the system. For instance, the DC DAC 2230 may output analog signals to tunable couplers of a single-qubit gate controller (e.g., to tunable coupler 440 as the amplitude control signal 445). Additionally, or alternatively, the DC DAC 2230 may: output analog signals to tunable couplers of a two-qubit gate controller (e.g., to tunable coupler 1340 as the amplitude control signal 1345); output analog signals to tunable couplers of a readout controller (e.g., to tunable coupler 1540 as the amplitude control signal 1545); and/or output analog signals to tunable couplers of a leakage reduction controller (e.g., to tunable coupler 2040 as the amplitude control signal 2045). Illustrative receivers of the signals output by each of these tunable couplers are described above and are noted in FIG. 22. For example, the output of the tunable coupler 1340 in the two-qubit gate controller may be a qubit-qubit coupler (e.g., coupler 145).

Also in the example of FIG. 22, the DC DAC 2230 is configured to provide digital values to a coupler flux bias controller 2240, which is configured to generate a flux pulse that is applied to a coupler that couples together two qubits (e.g., coupler 145). In some embodiments, the flux pulse generated by the flux bias controller 2240 is provided along a flux line of a coupler and is configured to modulate the effective coupling strength between the qubits coupled via the coupler.

In some embodiments, a DC flux bias (whether directed to a coupler or a qubit) may be generated by combining a coarse DC flux bias signal with a fine DC flux bias signal. In such an approach, either or both of the coarse and fine DC flux bias signals may be supplied from the flux bias controller 2240. In some embodiments, the flux bias controller 2240 provides the fine DC flux bias signal (e.g., to a coupler), whereas the coarse DC flux bias signal is provided to a plurality of couplers from a shared DC flux line. For instance, the coarse DC flux bias signal may be set with a relatively large step size, such as a 10 $m\Phi_0$ step size, and provided to multiple couplers and/or qubits to provide a common baseline flux. The fine DC flux bias signal may provide high-resolution control and may be set with a relatively smaller step size, such as a $10\mu\Phi_0$ step size, and is sent by the flux bias controller 2240, as instructed by DC DAC 2230, to qubits and/or couplers. The fine DC flux bias signal may in general have a different magnitude for different qubits or different couplers, whereas the baseline flux bias signal provided by the coarse DC flux bias signal is the same for each qubit or coupler. This two-tiered approach may provide for scalable baseline adjustment and precise per-device control.

In some embodiments, a DC flux bias signal may be provided to a qubit and/or coupler directly from room-temperature electronics, either through shared DC cables (e.g., one cable providing current to multiple qubits) or through dedicated lines (e.g., one cable per qubit). In general, superconducting DC cables contribute much less thermal load than RF cables; therefore, adding more superconducting DC lines may be acceptable from a system scaling perspective.

An illustrative implementation of the digital distribution circuit 2220 is depicted in FIG. 23, according to some embodiments. Digital distribution circuit 2300 is configured to receive digital data (at input 2301) and load the digital values into flip flops 2310 (also labeled "D2" in FIG. 23). Once the digital data has been loaded into the flip flops 2310, the digital distribution circuit 2300 may be operated to synchronously send data from the flip flops through outputs 2350 to a plurality of programmable components such as those shown in FIG. 22. The data being synchronously distributed to the plurality of programmable components may be referred to herein as "control data" to distinguish it from other types of data described herein, such as the data received by the digital distribution circuit 2300 at input 2301. Control data may, for example, include data to be held in a memory register and/or data to be held in a DAC, and may dictate how a qubit controller generates various control signals as described above.

In the example of FIG. 23, the digital distribution circuit 2300 comprises both AQFP superconducting logic, as well as rapid single flux quantum (SFQ) superconducting logic. As described above, AQFP logic exhibits extremely low energy dissipation compared with SFQ logic, whereas SFQ logic can operate at higher speeds than AQFP logic. The illustrative digital distribution circuit 2300 is configured to use the advantages of both types of logic to operate at high speeds while maintaining low energy dissipation.

In operation, the data input 2301 receives digital data (e.g., digital signal 2210 in FIG. 22) while the load input 2302 receives clock pulses, which causes the digital data to be loaded into the flip flops 2310 (of which there are nine in the example of FIG. 23). Subsequently, the load input 2302 is turned off and the unload AC signal input 2303 and the S2A AC signal 2330 are turned on, which causes the digital distribution circuit 2300 to synchronously send the data from the flip flops through the outputs 2350 (2350a, 2350b, . . . 2350n). As shown in FIG. 23, the flip flops 2310 are arranged in an array, with the number of columns corresponding to the number of programmable devices that will receive control data, and the number of rows corresponding to the number of control data bits that each programmable device will receive, although there is no requirement that the flip flops be arranged in an regular array such as that shown.

The digital distribution circuit 2300 may operate according to a clock signal, which may for instance operate at a frequency of over 10 GHz, such as 20 GHz. As will be described further below, the loading period in which the input data is loaded into the flip flops lasts for a number of clock cycles equal to the total number of flip flops, whereas the unloading period in which the control data is synchronously sent to the programmable components lasts for a number of clock cycles equal to the total number of programmable components. For instance, in the simple example of FIG. 23 in which there are nine flip flops and three outputs 2350 depicted, loading may take place over 9 clock cycles and unloading over the subsequent 3 clock cycles. Irrespective of the particular length of each period, the load signal input to 2302 may receive active clock pulses during the loading period and receive no signal during the unloading period. In the example of FIG. 23, the unload AC signal input 2303 and the S2A AC signal 2330 are off during loading, and on during unloading.

In the example of FIG. 23, the flip flops 2310 ("D2") are each configured with a single input (on the left side) and two outputs (on the right side). There are two further inputs on the top and bottom (marked with triangles) that dictate whether the input is passed to one output or the other output at a given clock. In particular, in the example of FIG. 23, when the lower input to a flip flop is clocked, the lower output produces an output (equal to the input), and when the upper input to a flip flop is clocked, the upper output produces an output (equal to the input). As such, during loading when the load signal 2302 is actively clocked, each of the flip flops 2310 passes its input to the upper output at a clock tick. According to some embodiments, the flip flops 2310 are implemented in SFQ superconducting logic. The digital distribution circuit 2300 also comprises confluence buffers 2325, which each pass data from inputs to its output.

As a result, during loading in the example of FIG. 23, the data bits flow along the daisy chain of flip flops: along a path left to right on the top row, right to left on the second row, and left to right on the bottom row. Other ways of arranging this data flow may also be envisioned, so long as data flows through a plurality of flip flops during the loading process.

During offloading, the unload AC signal input 2303 is turned on and the load signal input 2302 is turned off. The unload AC signal input 2303, which is a power/clock signal, causes the AQFP circuits 2315, which are configured with a constant high input, to output a high digital value to the AQFP-to-SFQ ("A2S") components 2316. In addition, the unload AC signal input 2303 activates the A2S components 2316 and the SFQ-to-AQFP ("S2A") components 2317. The A2S components 2316 are configured to convert an AQFP digital logic signal into an SFQ pulse suitable for use with SFQ digital logic.

According to some embodiments, the A2S components 2316 each comprises a non-adiabatic QFP whose output is connected to an SFQ JTL (Josephson transmission line) through a small resistor. The QFP has a low $\beta_c$ Josephson junction and a high $\beta_c$ Josephson junction. When the QFP is excited via a rising AC input while its digital input is logic '1' (positive current), the QFP's high $\beta_c$ Josephson junction switches, generating an SFQ voltage pulse that results in a sufficiently large output current through the resistor to drive the SFQ JTL. The driven SFQ JTL in turn generates an SFQ voltage pulse at its output. But in the same clock cycle as the QFP resets via a falling AC input, a negative SFQ voltage pulse is generated. The resulting negative current does not drive SFQ JTL, so the corresponding SFQ remains in the superconducting loop bridging the QFP and JTL. The resistor in between serves as the current decaying mechanism to ensure the SFQ dissipates before the next clock cycle, otherwise the A2S conversion will fail in the next cycle. When the QFP is excited via a rising AC input while its digital input is logic '0' (negative current), the QFP's low $\beta_c$ Josephson junction switches generating an SFQ voltage pulse but results in insufficient current amplitude through the resistor to drive the SFQ JTL. Thus, no SFQ pulse is generated at the output of the JTL, correctly corresponding to a digital '0'.

The A2S components 2316 each produces inputs to respective ones of the flip flops 2310, causing each to output their bit values through the lower output, which are arranged to daisy chain into the S2A components 2317. The S2A components 2317 are configured to convert an SFQ pulse into an AQFP digital signal when activated by the S2A AC input 2330. According to some embodiments, the S2A components 2317 may comprise an SFQ DFF (D flip flop) and an AQFP buffer, where the storage loop of the SFQ DFF is inductively coupled to the input branch of the AQFP buffer. A negative offset flux may be applied to the input branch of the AQFP buffer (e.g., via the S2A AC input 2330) so that the buffer switches to a logical 1 only when a single flux quantum is kept in the SFQ DFF storage loop and when the negative offset flux is applied.

The net result of this unloading process is that the bit values loaded into the flip flops are synchronously output through the outputs 2350. For instance, the third bit during loading will be held in the lower-left flip flop of the flip flops 2310 at the end of loading, and will be the first bit output through output 2350a during unloading.

According to some embodiments, the unload AC signal input 2303 may be a power/clock signal shared with any number of other AQFP components in system 100. In some embodiments, once the bits have been all been unloaded from the flip flops 2310, the SFQ bias supply that powers the SFQ components in digital distribution circuit 2300 (e.g., the flip flops 2310, the S2A components 2317) may be turned off to reduce energy dissipation. When the SFQ bias supply is turned off in this way, an AQFP power/clock signal provided as the unload AC signal input 2303 and provided to other AQFP components in system 100 may be already active, and may stay active during subsequent control operations on qubits in system 100.

According to some embodiments, so long as all the flip flops 2310 receive an SFQ pulse at their lower input, the particular number of A2S components 2316 being used in digital distribution circuit 2300 may not be needed. For instance, although three A2S components 2316 are used in the example of FIG. 23, in some embodiments a single A2S component (or at least fewer A2S components than the number of outputs of the digital distribution circuit 2300) in addition to one or more splitters may be included and operated to supply SFQ pulses to additional flip flops 2310.

An illustrative implementation of the DC DAC 2230 (of which there are a plurality in system 2200) is depicted in FIG. 24A, according to some embodiments. DAC 2400 is a programmable circuit that receives a multi-bit digital input corresponding to a DC output. In the example of FIG. 24A, the input is a 12-bit value where each bit is provided as input to the twelve inputs 2410 labeled $D_0$, $D_1$, . . . . $D_{11}$. Via AQFP circuits 2416, 2417 and 2418, each of the input bits produces a DC output with a different weight and the outputs are inductively coupled together to produce a single DC output 2420.

In the example of FIG. 24A, the DAC 2400 is configured to receive a latching DC signal 2412 which effectively freezes the data stored in the bottom row of AQFP circuits 2418. As noted above, an AQFP circuit 500 is configured to produce a persistent current while the power/clock signal is applied, where the persistent current is positive or negative depending on the input to the AQFP circuit when the power/clock is applied. As such, the output 2420 can be maintained by turning on the power/clock signal 2412 when the AQFP circuits 2418 receives inputs from the AQFP circuits 2416 and 2417, and which will persist once the inputs from the AQFP circuits 2416 and 2417 are turned off.

In the example of FIG. 24A, the digital input bit $D_7$ produces a nominal output and the other digital input bits are either increased or decreased in weight relative to this input. For instance, digital input bit $D_{10}$ is input to two AQFP circuits (as a fan-out component such as that described in relation to FIG. 16) each of which is then input to four AQFP circuits (as another fan-out component), which are all coupled to a common output. This produces a DC output from the $D_{10}$ digital input bit that is eight times larger than the DC output from the $D_7$ digital input. Illustrative DAC 2400 also includes seven fractional AQFP circuits among the circuits 2418 (the rightmost seven circuits each labeled with a respective fraction). These are AQFP circuits that produce an output current that is a fraction of the input current, which can for instance be realized by reducing the coupling factor to the common output line (e.g., reducing $K_{out}$ in FIG. 5), and/or by including Josephson junctions in the AQFP circuits that exhibit a smaller critical current (e.g., reducing the area of $J_1$ and/or $J_2$ in FIG. 5).

In general, any combination of DC current increasing and/or decreasing components may be included in a DAC, as illustrative DAC 2400 is provided just as one example. For instance, as an alternative to the arrangement shown in FIG. 24A, only weights greater than a nominal AQFP output may be produced so that the nominal AQFP represents the least significant bit and all the other input bits are passed through one or more fan-out components. Alternatively, the nominal AQFP may represent the most significant bit and all of the other input bits are passed to AQFP circuits that output a fraction of their input current.

Another illustrative implementation of the DC DAC 2230 (of which there are a plurality in system 2200) is depicted in FIG. 24B, according to some embodiments. DAC 2450 is a programmable circuit that receives a serial digital input corresponding to a DC output. In the example of FIG. 24B, the DAC 2450 receives digital input values 2451 which are sent to multi fluxon storage loop 2454 via the AQFP buffer 2452 and A2S component 2453 (which is described above in relation to A2S components 2316 in FIG. 23). In operation, a number of digital input values of 1 provided as a serialized input to the DAC 2450 determines the number of fluxons in the storage loop, and thereby the DC output current 2456. The A2S component 2453 loads flux quanta into the multi fluxon storage loop 2454 in accordance with the digital input values 2451, which outputs a DC current 2456 according to the number of flux quanta that have been loaded into the multi fluxon storage loop via the inductor 2455.

In some embodiments, the multi fluxon storage loop 2454 may comprise a single Josephson junction rf SQUID or a two Josephson junction superconducting loop. In either case, the loop inductance $L_{loop}$ and the critical current of the Josephson junctions $I_c$ are such that $L_{loop}I_c > n\Phi_0$, where n is the amount of fluxons to be stored in the loop. As more fluxons are stored in the loop, a larger corresponding output current is generated through the output inductor 2455 coupled to the storage loop. In some embodiments, DAC

2450 may comprise SFQ logic components like DC-to-SFQ converters as an alternative to the A2S component 2453.

Returning to FIG. 22, multiple instances of DAC 2400 may be provided as DC DACs 2230, each of which is arranged with an output coupled to a respective one of the various programmable components described herein. Since, in the example of FIG. 24A, the DAC 2400 continuously produces a DC output once programmed with input digital values, the various programmable components such as the various tunable couplers 440, 1340, etc. may in operation continuously receive a DC signal. However, these components may be configured to produce an output only when enabled by a decoder and/or qubit controller, in which case the continuous DC input may not cause any control signals to be generated. For example, a DAC 2400 may be configured to produce a DC output 2420 that represents the amplitude control signal 445, in the example of single-qubit gate controller 400 shown in FIG. 4A. Unless the operation enable signal 405 is received by the enable circuit 420, the DAC 430 does not produce an output, and the tunable coupler 440 will not produce an output control signal component.

As referred to herein, a "qubit" includes any multi-level quantum-mechanical system capable of being controlled by a quantum information processor. The quantum states of the qubit may for instance include electronic states, polarization states, vibrational states, rotational states, or spin states. As referred to herein, a "superconducting qubit" includes any superconducting electronic circuit that may be operated as a multi-level quantum-mechanical system, such as a charge qubit (e.g., a transmon), a flux qubit (e.g., a fluxonium qubit), or a phase qubit.

Certain components are referred to herein as a buffer, flip flop, register, etc. It will be appreciated that to some extent, these terms may be interchangeable in various embodiments described herein. For instance, in conventional computing a flip flop and a buffer can conventionally differ in the way in which passing an input to an output is triggered (e.g., by edge triggering or level triggering, respectively). These terms may not, however, be used in the same precise manner in the present disclosure. As such, components that receive an input, hold the input for some amount of time, then pass the input to an output when receiving some kind of trigger, may be referred to interchangeably herein as buffer, flip flops, etc. irrespective of the precise nature of the trigger (e.g., whether the trigger is a clock signal or some other enable signal, and whether the leading edge of the level of the trigger signal causes the component to produce an output).

An illustrative implementation of a computer system 2500 that may be used to control a plurality of qubits via any of the techniques described above is shown in FIG. 25. The computer system 2500 may include one or more processors 2510 and one or more non-transitory computer-readable storage media (e.g., memory 2520 and one or more non-volatile storage media 2530). The one or more processors 2510 may control writing data to and reading data from the memory 2520 and the one or more non-volatile storage media 2530 in any suitable manner, as the aspects of the disclosure described herein are not limited in this respect. To perform functionality and/or techniques described herein, the one or more processors 2510 may execute one or more instructions stored in one or more computer-readable storage media (e.g., the memory 2520, storage media, etc.), which may serve as non-transitory computer-readable storage media storing instructions for execution by the one or more processors 2510.

In connection with techniques described herein, code used to, for example, generate a digital bitstream comprising data for one or more memory registers, tunable couplers, etc. and send the digital bitstream to a digital signal line, etc. may be stored on one or more computer-readable storage media of computer system 2500. The one or more processors 2510 may execute any such code to perform any of the above-described techniques as described herein. Any other software, programs or instructions described herein may also be stored and executed by computer system 2500. It will be appreciated that computer code may be applied to any aspects of methods and techniques described herein. For example, computer code may be applied to generate a digital bitstream comprising data for one or more memory registers, etc.

The various methods or processes outlined herein may be coded as software that is executable on one or more processors that employ any one of a variety of operating systems or platforms. Additionally, such software may be written using any of numerous suitable programming languages and/or programming or scripting tools, and also may be compiled as executable machine language code or intermediate code that is executed on a virtual machine or a suitable framework.

In this respect, various inventive concepts may be embodied as at least one non-transitory computer readable storage medium (e.g., a computer memory, one or more floppy discs, compact discs, optical discs, magnetic tapes, flash memories, circuit configurations in Field Programmable Gate Arrays or other semiconductor devices, etc.) encoded with one or more programs that, when executed on one or more computers or other processors, implement the various embodiments of the present disclosure. The non-transitory computer-readable medium or media may be transportable, such that the program or programs stored thereon may be loaded onto any computer resource to implement various aspects of the present disclosure as described above.

The terms "program," "software," and/or "application" are used herein in a generic sense to refer to any type of computer code or set of computer-executable instructions that can be employed to program a computer or other processor to implement various aspects of embodiments as described above. Additionally, it should be appreciated that according to one aspect, one or more computer programs that when executed perform methods of the present disclosure need not reside on a single computer or processor, but may be distributed in a modular fashion among different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in non-transitory computer-readable storage media in any suitable form. Data structures may have fields that are related through location in the data structure. Such relationships may likewise be achieved by assigning storage for the fields with locations in a non-transitory computer-readable medium that convey relationship between the fields. However, any suitable mechanism may be used to establish relationships among information in fields of a data structure, including through the use of pointers, tags or other mechanisms that establish relationships among data elements.

Having thus described several aspects of at least one embodiment of this disclosure, it is to be appreciated that various alterations, modifications, and improvements will readily occur to those skilled in the art. For instance, aspects of the techniques described herein may be combined in any of the following ways:

Aspect 1. A system comprising: a plurality of qubits including a first qubit; a qubit controller coupled to the first qubit, the qubit controller configured to receive a digital value and perform one of a plurality of control operations, selected according to the digital value, on the first qubit; a digital signal line; and a decoder coupled to the qubit controller and to the digital signal line, the decoder configured to demultiplex a portion of a digital bitstream transmitted along the digital signal line, and to send the digital value to the qubit controller based on the portion of the digital bitstream demultiplexed from the digital bitstream.

Aspect 2. The system of aspect 1, wherein the plurality of control operations includes a single-qubit gate, a two-qubit gate and a readout operation.

Aspect 3. The system of any of aspects 1-2, further comprising a coupler coupled to the first qubit and to a second qubit of the plurality of qubits, wherein the plurality of control operations includes performing a two-qubit gate between the first qubit and the second qubit at least in part by directing a microwave pulse to the coupler.

Aspect 4. The system of any of aspects 1-3, wherein the plurality of control operations includes applying performing a single-qubit gate on the first qubit by applying a baseband pulse sequence to the first qubit.

Aspect 5. The system of any of aspects 1-4, wherein the qubit controller is configured to generate the baseband pulse sequence based on a plurality of primitive digital pulse sequences.

Aspect 6. The system of any of aspects 1-5, wherein the qubit controller is configured to generate a plurality of primitive analog pulse sequences by applying a respective amplitude to each of the plurality of primitive digital pulse sequences, and to combine the plurality of primitive analog pulse sequences to produce the baseband pulse sequence.

Aspect 7. The system of any of aspects 1-6, wherein the plurality of control operations includes reading a state of the first qubit at least in part by directing a signal to a readout transducer coupled to the first qubit.

Aspect 8. The system of any of aspects 1-7, wherein the readout transducer is a flux qubit, the system further comprises a readout system coupled to the flux qubit, and reading the state of the first qubit comprises measuring a current in the flux qubit that is indicative of the state of the first qubit.

Aspect 9. The system of any of aspects 1-8, wherein the decoder comprises a plurality of superconducting digital logic elements.

Aspect 10. The system of any of aspects 1-9, wherein plurality of superconducting digital logic elements comprise a plurality of adiabatic quantum flux parametron (AQFP) buffers.

Aspect 11. The system of any of aspects 1-10, wherein the decoder is a first decoder and the qubit controller is a first qubit controller, and wherein the system comprises:

a plurality of qubit controllers that include the first qubit controller; and a plurality of decoders that include the first decoder, each of the plurality of decoders configured to demultiplex respective portions of the digital bitstream transmitted along the digital signal line and to send digital values to respective qubit controllers of the plurality of qubit controllers based on the respective portions of the digital bitstream.

Aspect 12. The system of any of aspects 1-11, wherein the digital bitstream is a serial digital bitstream.

Aspect 13. The system of any of aspects 1-12, wherein the qubit controller is configured to perform a plurality of control operations on the first qubit, each of the plurality of control operations selected according to a successive digital value received from the decoder.

Aspect 14. The system of any of aspects 1-13, wherein the qubit controller performs each of the plurality of control operations in successive time windows each aligned with a gate clock.

Aspect 15. The system of any of aspects 1-14, wherein the qubit controller comprises a plurality of superconducting digital logic elements.

Aspect 16. A method comprising: demultiplexing, with a decoder, a portion of a digital bitstream transmitted along a digital signal line; sending, by the decoder, a digital value to a qubit controller based on the portion of the digital bitstream demultiplexed from the digital bitstream; selecting, by the qubit controller, one of a plurality of control operations according to the digital value received from the decoder; and performing, by the qubit controller, the selected one of the plurality of control operations on a first qubit.

Aspect 17. The method of aspect 16, wherein the selected one of the plurality of control operations is a single-qubit gate, a two-qubit gate, or a readout operation.

Aspect 18. The method of any of aspects 16-17, wherein performing the selected one of the plurality of control operations comprises performing a two-qubit gate between the first qubit and a second qubit at least in part by directing a microwave pulse to a coupler coupled to the first qubit and to the second qubit.

Aspect 19. The method of any of aspects 16-18, wherein performing the selected one of the plurality of control operations comprises performing a single-qubit gate on the first qubit by applying a baseband pulse sequence to the first qubit.

Aspect 20. The method of any of aspects 16-19, wherein the single-qubit gate is an identity gate.

Aspect 21. The method of any of aspects 16-20, further comprising generating, by the qubit controller, the baseband pulse sequence based on a plurality of primitive digital pulse sequences.

Aspect 22. The method of any of aspects 16-21, further comprising generating, by the qubit controller, a plurality of primitive analog pulse sequences by applying a respective amplitude to each of the plurality of primitive digital pulse sequences, and to combine the plurality of primitive analog pulse sequences to produce the baseband pulse sequence.

Aspect 23. The method of any of aspects 16-22, wherein performing the selected one of the plurality of control operations comprises reading a state of the first qubit at least in part by directing a signal to a readout transducer coupled to the first qubit.

Aspect 24. The method of any of aspects 16-23, wherein the readout transducer is a flux qubit, and the method further comprises measuring a current in the flux qubit that is indicative of the state of the first qubit.

Aspect 25. The method of any of aspects 16-24, wherein the first qubit is one of a plurality of qubits, wherein the decoder is a first decoder of a plurality of decoders, wherein the qubit controller is a first qubit controller of a plurality of qubit controllers, and wherein the method comprises:

demultiplexing, with each of the plurality of decoders, respective portions of the digital bitstream; sending, by each of the plurality of decoders, a respective digital value to a respective qubit controller of the plurality of qubit controllers based on the respective portion of the digital bitstream demultiplexed from the digital bitstream; selecting, by each of the plurality of qubit controllers, one of the plurality of control operations according to the respective digital value received; and performing, by each of the plurality of decoders, the selected one of the plurality of control operations on a respective qubit of the plurality of qubits.

Aspect 26. The method of any of aspects 16-25, comprising, by the qubit controller, performing a plurality of control operations on the first qubit each selected according to successive digital values received from the decoder.

Aspect 27. The method of any of aspects 16-26, wherein the qubit controller performs each of the plurality of control operations in successive time windows each aligned with a gate clock.

Aspect 28. A system comprising: a plurality of qubits including a first qubit; and a plurality of qubit controllers coupled to respective qubits of the plurality of qubits, the plurality of qubit controllers including a first qubit controller configured to apply a baseband pulse sequence to the first qubit, the first qubit controller: a first digital-to-analog converter (DAC) configured to receive a first plurality of digital values and generate a first time-varying current signal based on the first plurality of digital values; and a first tunable coupling circuit coupled to the first DAC and configured to: receive the first time-varying current signal from the first DAC; and generate a first component of the baseband pulse sequence by amplitude-adjusting the first time-varying current signal according to a first control signal received by the first tunable coupling circuit.

Aspect 29. The system of aspect 28, wherein the first qubit controller further comprises: a second DAC configured to receive a second plurality of digital values and generate a second time-varying current signal based on the second plurality of digital values; and a second tunable coupling circuit coupled to the second DAC and configured to: receive the second time-varying current signal from the second DAC; and output a second component of the baseband pulse sequence by amplitude-adjusting the second time-varying current signal according to a second control signal input to the second tunable coupling circuit.

Aspect 30. The system of any of aspects 28-29, wherein the first qubit controller further comprises a combiner configured to produce the baseband pulse sequence by combining a plurality of components of the baseband pulse sequence including the first component of the baseband pulse sequence and the second component of the baseband pulse sequence.

Aspect 31. The system of any of aspects 28-30, wherein the first qubit controller further comprises a combiner configured to produce the baseband pulse sequence by combining a plurality of components of the baseband pulse sequence including the first component of the baseband pulse sequence.

Aspect 32. The system of any of aspects 28-31, wherein the first plurality of digital values are a plurality of binary values.

Aspect 33. The system of any of aspects 28-32, wherein the first control signal is a current signal that generates a DC flux around a superconducting loop of the first tunable coupling circuit.

Aspect 34. The system of any of aspects 28-33, wherein a magnitude of the flux around the superconducting loop of the first tunable coupling circuit determines, at least in part, an amplitude of the first component of the baseband pulse sequence.

Aspect 35. The system of any of aspects 28-34, wherein the first DAC and the first tunable coupling circuit each comprises one or more superconducting logic components.

Aspect 36. The system of any of aspects 28-35, wherein the first qubit controller further comprises a first digital memory register, and wherein the first DAC receives the first plurality of digital values from the first digital memory register.

Aspect 37. The system of any of aspects 28-36, wherein the first digital memory register comprises one or more superconducting logic components.

Aspect 38. The system of any of aspects 28-37, wherein the first DAC is configured to generate the first time-varying current signal at, for each of the first plurality of digital values, a first current level when the digital value is 0 and a second current level when the digital value is 1.

Aspect 39. The system of any of aspects 28-38, wherein the first DAC is further configured to generate the first time-varying current signal at, for each of the first plurality of digital values, a third current level when the digital value is −1.

Aspect 40. The system of any of aspects 28-39, wherein the baseband pulse sequence comprises a first pulse and a second pulse, wherein the first pulse and the second pulse have opposite amplitudes.

Aspect 41. The system of any of aspects 28-40, wherein the baseband pulse sequence comprises a first idle period prior to the first pulse, a second idle period between the first pulse and the second pulse, and a third idle period subsequent to the second pulse.

Aspect 42. The system of any of aspects 28-41, wherein the baseband pulse sequence is a first baseband pulse sequence, and wherein the first qubit controller is further configured to apply a second baseband pulse sequence, different from the first baseband pulse sequence, to the first qubit.

Aspect 43. The system of any of aspects 28-42, wherein the first qubit controller is further configured to receive a digital instruction and to apply the first baseband pulse sequence to the first qubit, or apply the second baseband pulse sequence to the first qubit, according to the digital instruction.

Aspect 44. The system of any of aspects 28-43, wherein the first qubit controller comprises adiabatic quantum flux parametron (AQFP) superconducting logic.

Aspect 45. The system of any of aspects 28-44, wherein the first digital-to-analog converter comprises a quantum flux latch.

Aspect 46. The system of any of aspects 28-45, wherein the first digital-to-analog converter comprises a plurality of quantum flux parametron (QFP) components arranged to form a quantum flux parametron latch (QFPL).

Aspect 47. The system of any of aspects 28-46, wherein the first DAC comprises a multi fluxon storage loop.

Aspect 48. A method comprising: generating, by a first digital-to-analog converter (DAC) of a first qubit controller, a first time-varying DC current signal based on a first plurality of digital values received by the first DAC; receiving, by a first tunable coupling circuit of the first qubit controller, the first time-varying DC current signal; generating, by the first tunable coupling circuit, a first baseband pulse sequence component by amplitude-adjusting the first time-varying DC current signal according to a first control signal received by the first tunable coupling circuit; generating, by the first qubit controller, a baseband pulse sequence by combining a plurality of baseband pulse sequence components including the first baseband pulse sequence component; and applying the baseband pulse sequence to a first qubit.

Aspect 49. The method of aspect 48, further comprising: generating, by a second DAC of the first qubit controller, a second time-varying DC current signal based on a second plurality of digital values received by the second DAC; receiving, by a second tunable coupling circuit of the first qubit controller, the second time-varying DC current signal; and generating, by the second tunable coupling circuit, a second baseband pulse sequence component by amplitude-adjusting the second time-varying DC current signal according to a second control signal received by the second tunable coupling circuit, wherein generating the baseband pulse sequence comprises combining the plurality of baseband pulse sequence components including the first baseband pulse sequence component and the second baseband pulse sequence component.

Aspect 50. The method of any of aspects 48-49, wherein the first plurality of digital values are a plurality of binary values.

Aspect 51. The method of any of aspects 48-50, wherein the first control signal is a current signal that generates a DC flux around a superconducting loop of the first tunable coupling circuit.

Aspect 52. The method of any of aspects 48-51, wherein a magnitude of the flux around the superconducting loop of the first tunable coupling circuit determines, at least in part, an amplitude of the first component of the baseband pulse sequence.

Aspect 53. The method of any of aspects 48-52, wherein the first qubit controller comprises a first digital memory register, and wherein the first DAC receives the first plurality of digital values from the first digital memory register.

Aspect 54. The method of any of aspects 48-53, wherein the first DAC generates the first time-varying DC current signal at, for each of the first plurality of digital values, a first current level when the digital value is 0 and a second current level when the digital value is 1.

Aspect 55. The method of any of aspects 48-54, wherein the first DAC generates the first time-varying DC current signal at, for each of the first plurality of digital values, a third current level when the digital value is −1.

Aspect 56. The method of any of aspects 48-55, wherein the baseband pulse sequence comprises a first pulse and a second pulse, wherein the first pulse and the second pulse have opposite amplitudes.

Aspect 57. The method of any of aspects 48-56, wherein the baseband pulse sequence comprises a first idle period prior to the first pulse, a second idle period between the first pulse and the second pulse, and a third idle period subsequent to the second pulse.

Aspect 58. The method of any of aspects 48-57, further comprising, subsequent to applying the baseband pulse sequence to the first qubit, applying, by the first qubit controller, a second baseband pulse sequence, different from the baseband pulse sequence, to the first qubit.

Aspect 59. The method of any of aspects 48-58, comprising: receiving, by the first qubit controller, a first digital instruction, and applying the baseband pulse sequence to the first qubit according to the first digital instruction; and receiving, by the first qubit controller, a second digital instruction, and applying the second baseband pulse sequence to the first qubit according to the second digital instruction.

Aspect 60. A system comprising: a plurality of qubits including a first qubit; a first qubit controller coupled to the first qubit and comprising a plurality of superconducting logic components including a plurality of programmable components, the first qubit controller configured to perform a control operation on the first qubit based on one or more control data bits received by each of the plurality of programmable components; and a superconducting digital distribution circuit configured to: demultiplex a plurality of data bits received serially by the superconducting digital distribution circuit from a digital signal line; and synchronously send, based on the plurality of data bits, the one or more control data bits to each of the plurality of programmable components of the first qubit controller.

Aspect 61. The system of aspect 60, wherein the superconducting digital distribution circuit comprises a plurality of flip flops each configured to store one of the plurality of data bits received from the digital signal line, prior to synchronously sending the one or more control data bits to each of the plurality of programmable components.

Aspect 62. The system of any of aspects 60-61, wherein the superconducting digital distribution circuit is configured to: in a loading stage, load the plurality of data bits received from the digital signal line into the plurality of flip flops; and in an unloading stage, unload respective subsets of the plurality of data bits loaded into the plurality of flip flops as the one or more control data bits to each of the plurality of programmable components.

Aspect 63. The system of any of aspects 60-62, wherein the superconducting digital distribution circuit is configured to perform the loading stage in response to receiving a load signal.

Aspect 64. The system of any of aspects 60-63, wherein the plurality of flip flops are implemented with single flux quantum (SFQ) logic, and wherein the superconducting digital distribution circuit is configured to perform the unloading stage in response to receiving an unload signal from adiabatic quantum flux parametron (AQFP) logic.

Aspect 65. The system of any of aspects 60-64, wherein the superconducting digital distribution circuit comprises one or more AQFP-to-SFQ converter components configured to receive the unload signal, convert the unload signal to an SFQ unload signal, and direct the SFQ unload signal to the plurality of flip flops to control the plurality of flip flops to perform the unloading stage.

Aspect 66. The system of any of aspects 60-65, wherein the plurality of flip flops are implemented with single flux quantum (SFQ) logic.

Aspect 67. The system of any of aspects 60-66, wherein the superconducting digital distribution circuit comprises a plurality of SFQ-to-AQFP (adiabatic quantum flux parametron) converter components each configured to receive data from one or more of the plurality of flip flops, convert the received data to AQFP logic data, and send the AQFP logic data as the one or more control data bits to one of the plurality of programmable components.

Aspect 68. The system of any of aspects 60-67, wherein the superconducting digital distribution circuit is configured to demultiplex the plurality of data bits received from the digital signal line and synchronously send a subset of the plurality of data bits received from the digital signal line as the one or more control data bits to each of the plurality of programmable components.

Aspect 69. The system of any of aspects 60-68, wherein the plurality of programmable components include one or more digital-to-analog converters and/or one or more shift register memories.

Aspect 70. The system of any of aspects 60-69, wherein the system is configured to: operate the superconducting digital distribution circuit to synchronously send the one or more control data bits to each of the plurality of programmable components of the first qubit controller; subsequent to the one or more control data bits being stored by each of the plurality of programmable components of the first qubit controller, powering down the superconducting digital distribution circuit; and subsequent to powering down the superconducting digital distribution circuit, operate the first qubit controller to perform the control operation on the first qubit.

Aspect 71. A method comprising: demultiplexing, by a superconducting digital distribution circuit, a plurality of data bits received serially by the superconducting digital distribution circuit from a digital signal line; synchronously sending, by the superconducting digital distribution circuit, one or more control data bits to each of a plurality of programmable components of a first qubit controller based on the plurality of data bits; and performing, by the first qubit controller, a control operation on the first qubit based on the one or more control data bits received by each of the plurality of programmable components.

Aspect 72. The method of aspect 71, comprising storing, by each of a plurality of flip flops of the superconducting digital distribution circuit, one of the plurality of data bits received from the digital signal line prior to synchronously sending the one or more control data bits to each of the plurality of programmable components.

Aspect 73. The method of any of aspects 71-72, comprising, by the superconducting digital distribution circuit: in a loading stage, loading the plurality of data bits received from the digital signal line into the plurality of flip flops; and in an unloading stage, unloading respective subsets of the plurality of data bits loaded into the plurality of flip flops as the one or more control data bits to each of the plurality of programmable components.

Aspect 74. The method of any of aspects 71-73, comprising performing the loading stage by the superconducting digital distribution circuit in response to the by the superconducting digital distribution circuit receiving a load signal.

Aspect 75. The method of any of aspects 71-74, wherein the plurality of flip flops are implemented with rapid single flux quantum (SFQ) logic, and wherein the superconducting digital distribution circuit performs the unloading stage in response to receiving an unload signal from adiabatic quantum flux parametron (AQFP) logic.

Aspect 76. The method of any of aspects 71-75, comprising, by one or more AQFP-to-SFQ converter components of the superconducting digital distribution circuit: receiving the unload signal; converting the unload signal to an SFQ unload signal; and directing the SFQ unload signal to the plurality of flip flops to control the plurality of flip flops to perform the unloading stage.

Aspect 77. The method of any of aspects 71-76, wherein the plurality of flip flops are implemented with rapid single flux quantum (SFQ) logic.

Aspect 78. The method of any of aspects 71-77, comprising, by each of a plurality of SFQ-to-AQFP (adiabatic quantum flux parametron) converter components of the superconducting digital distribution circuit: receiving data from one or more of the plurality of flip flops; converting the received data to AQFP logic data; and sending the AQFP logic data as the one or more control data bits to one of the plurality of programmable components.

Aspect 79. The method of any of aspects 71-78, comprising, by the superconducting digital distribution circuit, demultiplexing the plurality of data bits received from the digital signal line and synchronously sending a subset of the plurality of data bits received from the digital signal line as the one or more control data bits to each of the plurality of programmable components.

Aspect 80. The method of any of aspects 71-79, wherein the plurality of programmable components include one or more digital-to-analog converters and/or one or more shift register memories.

Aspect 81. The method of any of aspects 71-80, further comprising: operating the superconducting digital distribution circuit to synchronously send the one or more control data bits to each of the plurality of programmable components of the first qubit controller; subsequent to the one or more control data bits being stored by each of the plurality of programmable components of the first qubit controller, powering down the superconducting digital distribution circuit; and subsequent to powering down the superconducting digital distribution circuit, operating the first qubit controller to perform the control operation on the first qubit.

Such alterations, modifications, and improvements are intended to be part of this disclosure and are intended to be within the spirit and scope of the disclosure. Further, though advantages of the present disclosure are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Aspects of the above-described embodiments of the technology described herein can be implemented in any of numerous ways. For example, aspects of the embodiments may be implemented using hardware, software, or a combination thereof. When implemented in software, the software code can be executed on any suitable processor or collection of processors, whether provided in a single computer or distributed among multiple computers. Such processors may be implemented as integrated circuits, with one or more processors in an integrated circuit component, including commercially available integrated circuit components known in the art by names such as CPU chips, GPU chips, microprocessor, microcontroller, or co-processor. Alternatively, a processor may be implemented in custom circuitry, such as an ASIC, or semi-custom circuitry resulting from configuring a programmable logic device. As yet a further alternative, a processor may be a portion of a larger circuit or semiconductor device, whether commercially available, semi-custom or custom. As a specific example, some commercially available microprocessors have multiple cores such that one or a subset of those cores may constitute a processor. Though, a processor may be implemented using circuitry in any suitable format.

Various aspects of the present disclosure may be used alone, in combination, or in a variety of arrangements not specifically described in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, aspects of the disclosure may be embodied as a method, of which examples have been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A system comprising:
a plurality of qubits including a first qubit; and
a plurality of qubit controllers coupled to respective qubits of the plurality of qubits, the plurality of qubit controllers including a first qubit controller configured to apply a baseband pulse sequence to the first qubit, the first qubit controller comprising:
a first digital-to-analog converter (DAC) configured to receive a first plurality of digital values and generate a first time-varying current signal based on the first plurality of digital values; and
a first tunable coupling circuit coupled to the first DAC and configured to:
receive the first time-varying current signal from the first DAC; and
generate a first component of the baseband pulse sequence by amplitude-adjusting the first time-varying current signal according to a first control signal received by the first tunable coupling circuit, wherein the first DAC and the first tunable coupling circuit each comprises one or more superconducting logic components.

2. The system of claim 1, wherein the first qubit controller further comprises:
a second DAC configured to receive a second plurality of digital values and generate a second time-varying current signal based on the second plurality of digital values; and
a second tunable coupling circuit coupled to the second DAC and configured to:
receive the second time-varying current signal from the second DAC; and
output a second component of the baseband pulse sequence by amplitude-adjusting the second time-varying current signal according to a second control signal input to the second tunable coupling circuit.

3. The system of claim 2, wherein the first qubit controller further comprises a combiner configured to produce the baseband pulse sequence by combining a plurality of components of the baseband pulse sequence including the first component of the baseband pulse sequence and the second component of the baseband pulse sequence.

4. The system of claim 1, wherein the first qubit controller further comprises a combiner configured to produce the baseband pulse sequence by combining a plurality of components of the baseband pulse sequence including the first component of the baseband pulse sequence.

5. The system of claim 1, wherein the first plurality of digital values are a plurality of binary values.

6. The system of claim 1, wherein the first control signal is a current signal that generates a DC flux around a superconducting loop of the first tunable coupling circuit.

7. The system of claim 6, wherein a magnitude of the flux around the superconducting loop of the first tunable coupling circuit determines, at least in part, an amplitude of the first component of the baseband pulse sequence.

8. The system of claim 1, wherein the first qubit controller further comprises a first digital memory register, and wherein the first DAC receives the first plurality of digital values from the first digital memory register.

9. The system of claim 8, wherein the first digital memory register comprises one or more superconducting logic components.

10. The system of claim 1, wherein the first DAC is configured to generate the first time-varying current signal at, for each of the first plurality of digital values, a first current level when the digital value is 0 and a second current level when the digital value is 1.

11. The system of claim 10, wherein the first DAC is further configured to generate the first time-varying current signal at, for each of the first plurality of digital values, a third current level when the digital value is −1.

12. The system of claim 1, wherein the baseband pulse sequence is a first baseband pulse sequence, and wherein the first qubit controller is further configured to apply a second baseband pulse sequence, different from the first baseband pulse sequence, to the first qubit.

13. The system of claim 12, wherein the first qubit controller is further configured to receive a digital instruction and to apply the first baseband pulse sequence to the first qubit, or apply the second baseband pulse sequence to the first qubit, according to the digital instruction.

14. The system of claim 13, wherein the first qubit controller comprises adiabatic quantum flux parametron (AQFP) superconducting logic.

15. The system of claim 1, wherein the first digital-to-analog converter comprises a quantum flux latch.

16. The system of claim 15, wherein the first digital-to-analog converter comprises a plurality of quantum flux parametron (QFP) components arranged to form a quantum flux parametron latch (QFPL).

17. The system of claim 1, wherein the first DAC comprises a multi fluxon storage loop.

18. A method comprising:

generating, by a first digital-to-analog converter (DAC) of a first qubit controller, a first time-varying DC current signal based on a first plurality of digital values received by the first DAC;

receiving, by a first tunable coupling circuit of the first qubit controller, the first time-varying DC current signal;

generating, by the first tunable coupling circuit, a first baseband pulse sequence component by amplitude-adjusting the first time-varying DC current signal according to a first control signal received by the first tunable coupling circuit, wherein the first control signal is a current signal that generates a DC flux around a superconducting loop of the first tunable coupling circuit;

generating, by the first qubit controller, a baseband pulse sequence by combining a plurality of baseband pulse sequence components including the first baseband pulse sequence component; and applying the baseband pulse sequence to a first qubit.

19. The method of claim 18, further comprising:

generating, by a second DAC of the first qubit controller, a second time-varying DC current signal based on a second plurality of digital values received by the second DAC;

receiving, by a second tunable coupling circuit of the first qubit controller, the second time-varying DC current signal; and generating, by the second tunable coupling circuit, a second baseband pulse sequence component by amplitude-adjusting the second time-varying DC current signal according to a second control signal received by the second tunable coupling circuit, wherein generating the baseband pulse sequence comprises combining the plurality of baseband pulse sequence components including the first baseband pulse sequence component and the second baseband pulse sequence component.

20. The method of claim 18, wherein the first plurality of digital values are a plurality of binary values.

21. The method of claim 18, wherein a magnitude of the flux around the superconducting loop of the first tunable coupling circuit determines, at least in part, an amplitude of the first component of the baseband pulse sequence.

22. The method of claim 18, wherein the first qubit controller comprises a first digital memory register, and wherein the first DAC receives the first plurality of digital values from the first digital memory register.

23. The method of claim 18, wherein the first DAC generates the first time-varying DC current signal at, for each of the first plurality of digital values, a first current level when the digital value is 0 and a second current level when the digital value is 1.

24. The method of claim 23, wherein the first DAC generates the first time-varying DC current signal at, for each of the first plurality of digital values, a third current level when the digital value is −1.

25. The method of claim 18, wherein the baseband pulse sequence comprises a first pulse and a second pulse, wherein the first pulse and the second pulse have opposite amplitudes.

26. The method of claim 25, wherein the baseband pulse sequence comprises a first idle period prior to the first pulse, a second idle period between the first pulse and the second pulse, and a third idle period subsequent to the second pulse.

27. The method of claim 18, further comprising, subsequent to applying the baseband pulse sequence to the first qubit, applying, by the first qubit controller, a second baseband pulse sequence, different from the baseband pulse sequence, to the first qubit.

28. The method of claim 27, comprising:

receiving, by the first qubit controller, a first digital instruction, and applying the baseband pulse sequence to the first qubit according to the first digital instruction; and receiving, by the first qubit controller, a second digital instruction, and applying the second baseband pulse sequence to the first qubit according to the second digital instruction.

29. A system comprising:

a plurality of qubits including a first qubit; and a plurality of qubit controllers coupled to respective qubits of the plurality of qubits, the plurality of qubit controllers including a first qubit controller configured to apply a baseband pulse sequence to the first qubit, the first qubit controller comprising:

a first digital memory register;

a first digital-to-analog converter (DAC) configured to receive a first plurality of digital values from the first digital memory register and generate a first time-varying current signal based on the first plurality of digital values; and a first tunable coupling circuit coupled to the first DAC and configured to:

receive the first time-varying current signal from the first DAC; and generate a first component of the baseband pulse sequence by amplitude-adjusting the first time-varying current signal according to a first control signal received by the first tunable coupling circuit.

30. The system of claim 29, wherein the first qubit controller further comprises:

a second DAC configured to receive a second plurality of digital values and generate a second time-varying current signal based on the second plurality of digital values; and a second tunable coupling circuit coupled to the second DAC and configured to:

receive the second time-varying current signal from the second DAC; and output a second component of the baseband pulse sequence by amplitude-adjusting the second time-varying current signal according to a second control signal input to the second tunable coupling circuit.

31. The system of claim 30, wherein the first qubit controller further comprises a combiner configured to produce the baseband pulse sequence by combining a plurality of components of the baseband pulse sequence including the first component of the baseband pulse sequence and the second component of the baseband pulse sequence.

32. The system of claim 29, wherein the first qubit controller further comprises a combiner configured to produce the baseband pulse sequence by combining a plurality of components of the baseband pulse sequence including the first component of the baseband pulse sequence.

33. The system of claim 29, wherein the first plurality of digital values are a plurality of binary values.

34. The system of claim 29, wherein the first control signal is a current signal that generates a DC flux around a superconducting loop of the first tunable coupling circuit.

35. A method comprising:

generating, by a first digital-to-analog converter (DAC) of a first qubit controller, a first time-varying DC current signal based on a first plurality of digital values received by the first DAC;

receiving, by a first tunable coupling circuit of the first qubit controller, the first time-varying DC current signal;

generating, by the first tunable coupling circuit, a first baseband pulse sequence component by amplitude-adjusting the first time-varying DC current signal according to a first control signal received by the first tunable coupling circuit;

generating, by the first qubit controller, a baseband pulse sequence by combining a plurality of baseband pulse sequence components including the first baseband pulse sequence component;

applying the baseband pulse sequence to a first qubit; and subsequent to applying the baseband pulse sequence to the first qubit, applying, by the first qubit controller, a second baseband pulse sequence, different from the baseband pulse sequence, to the first qubit.

36. The method of claim 35, wherein the first plurality of digital values are a plurality of binary values.

37. The method of claim 35, wherein the first qubit controller comprises a first digital memory register, and wherein the first DAC receives the first plurality of digital values from the first digital memory register.

38. The method of claim 35, wherein the first DAC generates the first time-varying DC current signal at, for each of the first plurality of digital values, a first current level when the digital value is 0 and a second current level when the digital value is 1.

* * * * *